United States Patent
Rivas et al.

(10) Patent No.: US 11,992,839 B2
(45) Date of Patent: May 28, 2024

(54) ACOUSTIC RESONATOR DEVICE

(71) Applicant: Qorvo US, Inc., Greensboro, NC (US)

(72) Inventors: Rio Rivas, Bend, OR (US); Kevin McCarron, Bend, OR (US); Matthew Wasilik, Plano, TX (US); David Doerr, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/749,002

(22) Filed: May 19, 2022

(65) Prior Publication Data
US 2022/0274104 A1   Sep. 1, 2022

Related U.S. Application Data

(63) Continuation of application No. 16/868,092, filed on May 6, 2020, now Pat. No. 11,369,960.
(Continued)

(51) Int. Cl.
*B01L 3/00* (2006.01)
*G01N 29/02* (2006.01)
*G01N 29/24* (2006.01)

(52) U.S. Cl.
CPC ........ *B01L 3/50273* (2013.01); *G01N 29/022* (2013.01); *G01N 29/2462* (2013.01);
(Continued)

(58) Field of Classification Search
CPC ......... B01L 3/50273; B01L 2400/0436; G01N 29/022; G01N 29/2462; G01N 2291/0426
See application file for complete search history.

(56) References Cited

U.S. PATENT DOCUMENTS 7,456,544 B2   11/2008   Kando
7,466,213 B2   12/2008   Loebl et al.
(Continued)

FOREIGN PATENT DOCUMENTS

JP   2005-533265 A   11/2005
JP   2006-180304 A   7/2006
(Continued)

OTHER PUBLICATIONS

Wingqvist, "The Film Electroacoustic Devices for Biosensor Applications," 2009 Digital Comprehensive Summaries of Uppsala Dissertations from the Faculty of Science and Technology, Acta Universitatis Upsaliensis Uppsala, 98 pages, ISBN 978-91-554-7432-4.
(Continued)

*Primary Examiner* — Brian J. Sines
(74) *Attorney, Agent, or Firm* — Haynes and Boone, LLP

(57) ABSTRACT

Methods of fabricating a bulk acoustic wave resonator structure for a fluidic device. The methods can include a first step of disposing a first conductive material over a portion of a first surface of a substrate to form at least a portion of a first electrode, the substrate having a second surface opposite the first surface. Then, a piezoelectric material may be disposed over the first electrode. Next, a second conductive material can be disposed over the piezoelectric material to form at least a portion of a second electrode. The second conductive material extends substantially parallel to the first surface of the substrate and the second conductive material at least partially extends over the first conductive material. The overlapping region of the first conductive material, the piezoelectric material, and the second conductive material form a bulk acoustic wave resonator, the bulk acoustic wave resonator having a first side and an opposing second side. An acoustic energy management structure is then disposed over a first side of the bulk acoustic wave resonator. Next a third
(Continued)

conductive material is disposed over a portion of the second conductive material that extends beyond the bulk acoustic wave resonator, wherein the third conductive material forms an interconnect extending above the acoustic energy management structure in a direction substantially perpendicular to the first surface of the substrate. Finally a portion of the second surface of the substrate is removed to expose a chemical mechanical connection at the first electrode at a second side of the bulk wave acoustic resonator. Devices formed thereby are also included.

20 Claims, 32 Drawing Sheets

Related U.S. Application Data

(60) Provisional application No. 62/844,000, filed on May 6, 2019.

(52) U.S. Cl.
CPC .............. *B01L 2400/0436* (2013.01); *G01N 2291/0426* (2013.01)

(56) References Cited

U.S. PATENT DOCUMENTS

| | | | |
|---|---|---|---|
| 7,468,608 B2 | 12/2008 | Feucht et al. | |
| 8,710,717 B2 | 4/2014 | Dausch | |
| 8,791,776 B2 | 7/2014 | Pang et al. | |
| 8,816,567 B2 | 8/2014 | Zuo et al. | |
| 10,164,605 B2 | 12/2018 | Burak et al. | |
| 10,302,595 B2 | 5/2019 | Belsick et al. | |
| 10,352,904 B2 | 7/2019 | Rivas | |
| 11,369,960 B2 * | 6/2022 | Rivas | B01L 3/50273 |
| 2006/0125489 A1 | 6/2006 | Feucht et al. | |
| 2017/0120242 A1 | 5/2017 | Rivas | |
| 2017/0122912 A1 | 5/2017 | Fattinger et al. | |

FOREIGN PATENT DOCUMENTS

| | | |
|---|---|---|
| JP | 2018-533310 A | 11/2018 |
| WO | WO 2018/022620 | 2/2018 |

OTHER PUBLICATIONS

Nagaraju et al., "A fully integrated wafer-scale sub-mm3 FBAR-based wireless mass sensor," University of Washington Electrical Engineering, Avago Technologies and Marvel Semiconductor, 5 pages.
International Search Report and Written Opinion for PCT Application No. PCT/US2020/031655 dated Jul. 29, 2020, 16 pages.
International Preliminary Report on Patentability for PCT Appl. No. PCT/US2020/031655 dated Nov. 2, 2021, 8 pages.
Extended European Search Report dated Apr. 14, 2023 from Application No. 20802306.9, 9 pages.
Office Action mailed Apr. 2, 2024 in related Japanese Application No. 2021-566260, 5 pages.

* cited by examiner

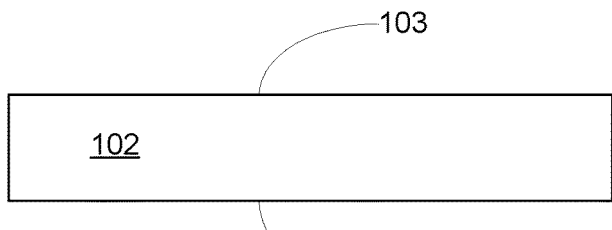
FIG. 1A
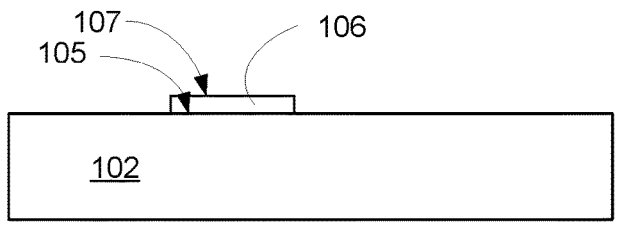
FIG. 1B
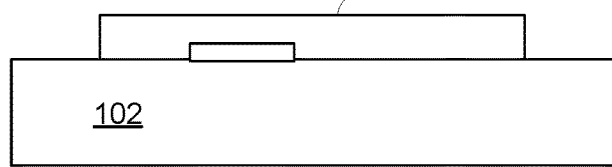
FIG. 1C
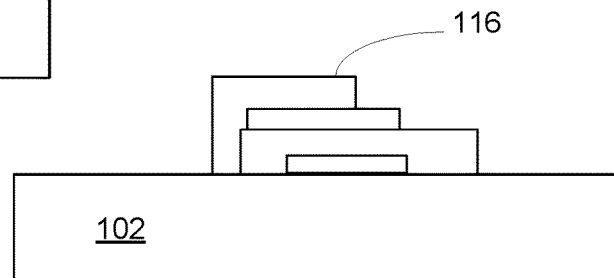
FIG. 1E
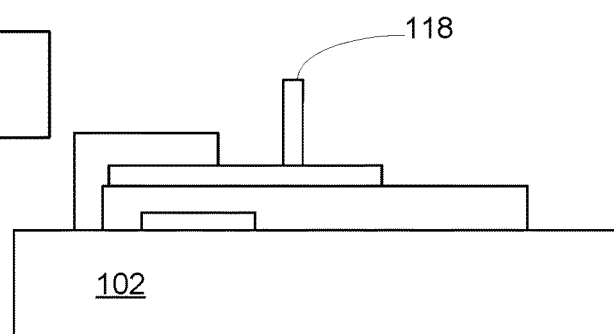
FIG. 1F
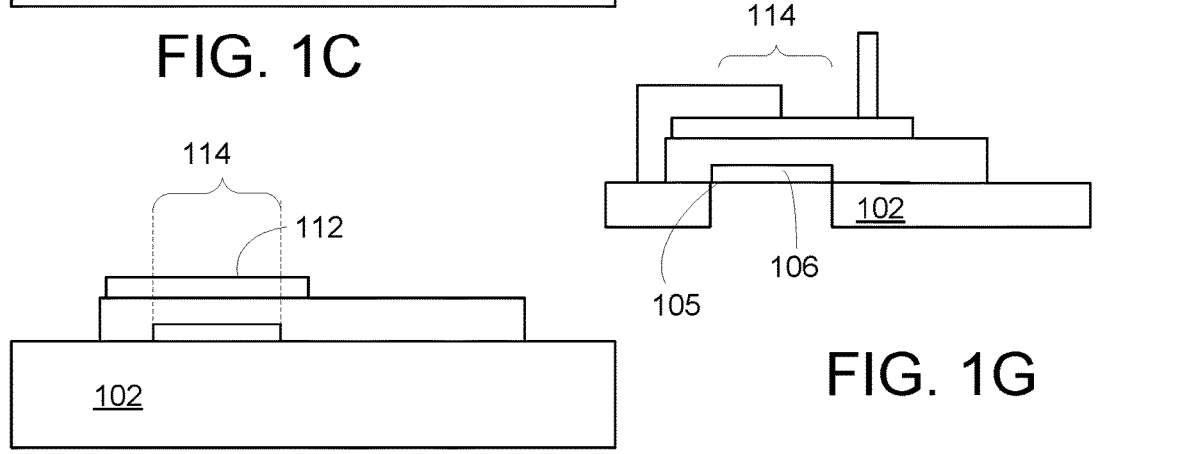
FIG. 1D
FIG. 1G

256  FIG. 17A

BOARD WITH BOND PADS

ADHESIVE

FLUDIC CHAMBER WALL
(FOR EXAMPLE: INJECTED MOLDED PLASTIC PART)

ACOUSTIC RESONATOR DEVICE

CROSS-REFERENCE TO RELATED APPLICATIONS

This application is a continuation of U.S. application Ser. No. 16/868,092 filed May 6, 2020, which claims the benefit of U.S. provisional patent application No. 62/844,000, filed May 6, 2019, the disclosures of which are hereby incorporated herein by reference in their entirety.

TECHNICAL FIELD

This disclosure generally relates to acoustic wave resonator devices, including acoustic wave sensors and fluidic devices incorporating acoustic wave resonators and related systems suitable for biosensing or biochemical sensing applications.

BACKGROUND

A biosensor (or biological sensor) is an analytical device including a biological element and a transducer that converts a biological response into an electrical signal. Certain biosensors involve a selective biochemical reaction between a specific binding material (e.g., an antibody, a receptor, a ligand, etc.) and a target species (e.g., molecule, protein, DNA, vims, bacteria, etc.), and the product of this highly specific reaction is converted into a measurable quantity by a transducer. Other sensors may utilize a nonspecific binding material capable of binding multiple types or classes of molecules or other moieties that may be present in a sample. The term "functionalization material" may be used herein to generally relate to both specific and nonspecific binding materials. Transduction methods used with biosensors may be based on various principles, such as electrochemical, optical, electrical, acoustic, etc. Among these, acoustic transduction offers a number of potential advantages, such as being real time, label-free, and low cost, as well as exhibiting high sensitivity.

An acoustic wave device employs an acoustic wave that propagates through or on the surface of a specific binding material, whereby any changes to the characteristics of the propagation path affect the velocity and/or amplitude of the wave. Acoustic wave devices are commonly fabricated by micro-electro-mechanical systems (MEMS) fabrication techniques, owing to the need to provide microscale features suitable for facilitating high-frequency operation. Presence of functionalization material on or over an active region of an acoustic wave device pemlits an analyte to be bound to the functionalization material, thereby altering the mass being vibrated by the acoustic wave and altering the wave propagation characteristics (e.g., velocity, thereby altering resonance frequency). Changes in velocity can be monitored by measuring the frequency, amplitude-magnitude, and/or phase characteristics of the acoustic wave device and can be correlated to a physical quantity being measured.

Typically, BAW devices are fabricated by micro-electromechanical systems (MEMS) fabrication techniques owing to the need to provide microscale features suitable for facilitating high frequency operation. In the context of biosensors, functionalization materials (e.g., specific binding materials; also known as bioactive probes or agents) may be deposited on sensor surfaces by various techniques, such as microarray spotting (also known as microarray printing). Functionalization materials providing non-specific binding utility (e.g., permitting binding of multiple types or species of molecules) may also be used in certain contexts, such as chemical sensing.

Existing processes for manufacturing an array of resonators includes many challenges. For example, the electrical lead lengths will increase in length as multiple rows of resonators are placed in the fluidic pathway. For example, if there are four resonators in the width of the fluidic path then the lead length to the resonators in the center of the fluidic path will be long. This in turn makes it difficult to address high density resonator sensor arrays. As an example, sensor arrays could range from 2 by 2 (4 total) to 50 by 50 (2500 total). In addition, the fluidic height of the flow channel of the sensor is directly tied to the height of the laminate board.

It may be desirable to provide a high-density BAW sensor array that provides the benefits of short electrical leads, low fluidic channel height, and high reliability by isolating the electrical connections and the fluidic interfaces on opposite sides of the BAW die. Those skilled in the art will appreciate the scope of the present disclosure and realize additional aspects thereof after reading the following detailed description in association with the accompanying drawings

SUMMARY

The techniques of this disclosure generally relate to methods of fabricating devices that include bulk acoustic wave resonator sensors that may be more effectively and easily electrically connected to a printed circuit board. The methods may include forming the bulk acoustic wave resonators on a first surface of a substrate and removing a portion of the substrate from the opposing surface of the substrate. The methods may also optionally include flip chip mounting.

Some aspects, in accordance with principles of the present disclosure, relate to methods of fabricating a bulk acoustic wave resonator structure for a fluidic device. The methods can include a first step of disposing a first conductive material over a portion of a first surface of a substrate to form at least a portion of a first electrode, the substrate having a second surface opposite the first surface. Then, a piezoelectric material may be disposed over the first electrode. Next, a second conductive material can be disposed over the piezoelectric material to form at least a portion of a second electrode. The second conductive material extends substantially parallel to the first surface of the substrate and the second conductive material at least partially extends over the first conductive material. The overlapping region of the first conductive material, the piezoelectric material, and the second conductive material form a bulk acoustic wave resonator, the bulk acoustic wave resonator having a first side and an opposing second side. An acoustic energy management structure is then disposed over a first side of the bulk acoustic wave resonator. Next a third conductive material is disposed over a portion of the second conductive material that extends beyond the bulk acoustic wave resonator, wherein the third conductive material forms an interconnect extending above the acoustic energy management structure in a direction substantially perpendicular to the first surface of the substrate. Finally a portion of the second surface of the substrate is removed to expose a chemical mechanical connection at the first electrode at a second side of the bulk wave acoustic resonator.

Other aspects, in accordance with principles of the present disclosure, relate to methods of fabricating a bulk acoustic wave resonator structure for a fluidic device. The methods can include a first step of disposing a first conductive material over a portion of a first surface of a substrate to form at least a portion of a first electrode, the substrate having a second surface opposite the first surface. Then, a piezoelectric material may be disposed over the first electrode. Next, a second conductive material can be disposed over the piezoelectric material to form at least a portion of a second electrode. The second conductive material extends substantially parallel to the first surface of the substrate and the second conductive material at least partially extends over the first conductive material. The overlapping region of the first conductive material, the piezoelectric material, and the second conductive material form a bulk acoustic wave resonator, the bulk acoustic wave resonator having a first side and an opposing second side. A reflector structure that functions as an acoustic energy management structure is then disposed over a first side of the bulk acoustic wave resonator. Next a third conductive material is disposed over a portion of the second conductive material that extends beyond the bulk acoustic wave resonator, wherein the third conductive material forms an interconnect extending above the reflector structure in a direction substantially perpendicular to the first surface of the substrate. Finally a portion of the second surface of the substrate is removed to expose a chemical mechanical connection at the first electrode at a second side of the bulk wave acoustic resonator.

Other aspects, in accordance with principles of the present disclosure, relate to methods of fabricating a bulk acoustic wave resonator structure for a fluidic device. The methods can include a first step of disposing a first conductive material over a portion of a first surface of a substrate to form at least a portion of a first electrode, the substrate having a second surface opposite the first surface. Then, a piezoelectric material may be disposed over the first electrode. Next, a second conductive material can be disposed over the piezoelectric material to form at least a portion of a second electrode. The second conductive material extends substantially parallel to the first surface of the substrate and the second conductive material at least partially extends over the first conductive material. The overlapping region of the first conductive material, the piezoelectric material, and the second conductive material form a bulk acoustic wave resonator, the bulk acoustic wave resonator having a first side and an opposing second side. An air cavity that functions as an acoustic energy management structure is then disposed over a first side of the bulk acoustic wave resonator. Next a third conductive material is disposed over a portion of the second conductive material that extends beyond the bulk acoustic wave resonator, wherein the third conductive material forms an interconnect extending above the air cavity in a direction substantially perpendicular to the first surface of the substrate. Finally a portion of the second surface of the substrate is removed to expose a chemical mechanical connection at the first electrode at a second side of the bulk wave acoustic resonator.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF DRAWINGS

The accompanying drawing figures incorporated in and forming part of this specification illustrate several aspects of this disclosure and together with the description serve to explain various principles of this disclosure.

FIGS. 1A through 1J are schematic illustrations of a device at various stages in an illustrative method of making bulk acoustic wave containing structures in accordance with aspects of the present disclosure.

FIGS. 17A, 17B and 17C are schematic sectional views illustrating underfill wicked under the flip chip mounted die relative to the apparatus of FIG. 16 during a method of forming an example bulk acoustic wave structure in accordance with aspects of the present disclosure.

The figures are not necessarily to scale. Like numbers used in the figures refer to like components. However, it will be understood that the use of a number to refer to a component in a figure is not intended to limit the component in another figure labeled with the same number.

DETAILED DESCRIPTION

Figure 1H:
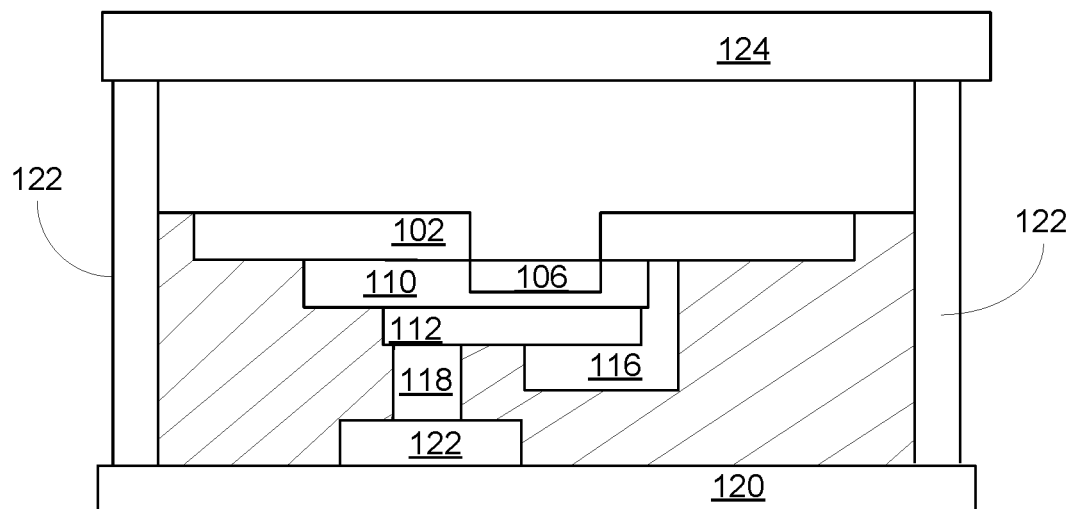

In the following detailed description several specific embodiments of compounds, compositions, apparatuses, systems and methods are disclosed. It is to be understood that other embodiments are contemplated and may be made without departing from the scope or spirit of the present disclosure. The following detailed description, therefore, is not to be taken in a limiting sense.

It will be understood that, although the terms first, second, etc. may be used herein to describe various elements these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

Relative terms such as "below" or "above" or "upper" or "lower" or "top" or "bottom" or "horizontal" or "vertical" may be used hereinto describe a relationship of one element, layer, or region to another element, layer, or region as illustrated in the Figures. It will be understood that these terms and those discussed above are intended to encompass different orientations of the device in addition to the orientation of the Figures.

The terminology used here is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "include," and/or "including" when used herein specify the presence of stated features, integers, steps, operations, elements, and/or components, but do not preclude the presence or addition of one or more other features, integers, steps, operations, elements, components, and/or groups thereof. As used herein, the terms "proximate" and "adjacent' as applied to a specified layer or element refer to a state of being close or near to another layer or element, and encompass the possible presence of one or more intervening layers or elements to be directly on or directly in contact with the other layer or element unless specified to the contrary herein.

In the case of a piezoelectric crystal resonator, an acoustic wave may embody either a bulk acoustic wave (BAW) propagating through the interior of a substrate, or a surface acoustic wave (SAW) propagating on the surface of the substrate, SAW devices involve transduction of acoustic waves (commonly including two-dimensional Rayleigh waves) utilizing interdigital transducers along the surface of a piezoelectric material, with the waves being confined to a penetration depth of about one wavelength. In a BAW device, three wave modes can propagate, namely, one longitudinal mode (embodying shear waves, also called compressional/extensional waves), and two shear modes (embodying shear waves, also called transverse waves) with longitudinal and shear modes respectively identifying vibrations where particle motion is parallel to or perpendicular to the direction of wave propagation. The longitudinal mode is characterized by compression and elongation in the direction of wave propagation, whereas the shear modes consist of motion perpendicular to the direction of the propagation. Longitudinal and shear modes consist of motion perpendicular to the direction of the action on the longitudinal direction.

The present disclosure relates to methods of forming acoustic resonator device(s) and the devices formed thereby that include a bulk acoustic wave (BAW) resonator arranged on a substrate. The BAW resonator includes a first conductive material forming a first electrode, a piezoelectric material, and a second conductive material forming a second electrode with the piezoelectric material located between the two electrodes. An acoustic energy management structure that functions to reduce or avoid dissipation of the acoustic waves into the substrate is formed over at least a portion of the active region of one surface of the BAW resonator and an interface layer(s) is formed on the opposite surface of at least a portion of the active region of the BAW resonator to permit later functionalization of the active region.

In accordance with aspects of the present disclosure, the acoustic wave structure device can be fabricated using micro-electro-mechanical systems (MEMS) techniques suitable to produce microscale features suitable for biosensors, functionalization materials (e.g., specific binding materials). Deposition techniques such as atomic layer deposition (ALD), chemical vapor deposition (CVD), or physical vapor deposition (PVD) may be used in conjunction with one or more masks (e.g., photolithographic masks) to pattern various portions of the device being formed.

Previous methods of fabricating BAW devices include the following steps:
1. Fabricate resonator with reflective base, bottom electrode, tilted shear axis AlN and top electrode
2. Fabricate flip chip interconnect bumps such as copper pillars with tin.
3. Deposit water vapor barrier layer that protects the electrode. Example of suitable material is CVD $Si_3N_4$ or ALD $Al_2O_3$.
4. Deposit adhesion layer for self-assemble monolayer (SAM) on the vapor barrier layer. Examples of suitable materials include $SiO_2$, $TiO_2$ or $HfO_2$. These materials can be deposited with atomic layer deposition (ALD) or chemical vapor deposition (CVD).
5. Mount the die on a laminate board over a slot in the board. The slot in the board defines the fluidic channel. Mount additional components on the board such as a switch, capacitors and resistors to make a RF sensor module.
6. Deposit self-assemble monolayer (SAM). Example of suitable material is 3-Glycidoxypropyltrimethoxysilane. This SAM coating is applied to improve bonding or adhesion between $SiO_2$ layer and organic polymers.
7. The functionalization, also termed bio receptors, are printed with microarray spotting needle.
8. Chemical block unlabeled regions of the SAM. This prevent undesirable attachment of analyte to the SAM when the sample is tested. Unbound excess chemical blocking chemical is washed off the device.
9. The fluidic packaging is fabricated. An example of fluidic packaging is multiple layers of punched or laser cut laminates with adhesives. The layers are precut and machined and then applied and held with pressure sensitive adhesive.
10. Analyte is flown through the sensor cavity and analyte binds to the functionalization and the resonator is driven with shear RF frequency to detect the frequency shift of the bound analyte.

Methods such as this produce devices that include long electrical leads in order to separate the electrical bumps from the fluidic channel. Furthermore, it is difficult to create a high density of arrays of resonators with fluidic and electrical connections on the same side of the die. Flip chip mounting a BAW sensor formed as above to a printed circuit board is one method of connecting the sensor to the board. The BAW containing die is mounted over a slot in the board that ultimately forms the fluidic channel. The thickness of the PCB then dictates the height of the fluidic channel. Decreasing the height of the fluidic channel then requires decreasing the thickness of the PCB.

These issues are magnified when considering an array of sensors. The electrical lead lengths will increase in length as multiple rows of resonators are placed in the fluidic pathway. For example, if there are four resonators in the width of the fluidic path then the lead length to the resonators in the center of the fluidic path will be long. This in turn makes it difficult to address high density resonator sensor arrays. As an example, sensor arrays could range from 2 by 2 (4 total) to 50 by 50 (2500 total). Even an array of 3×3 (9 total) which could be an advantageous tradeoff for cost and performance would be difficult to fabricate with previously utilized methods. Current thicknesses of typically utilized PCBs are on the order of 200 micrometers, which therefore dictate a thickness of the fluid channel.

In accordance with aspects of the present disclosure, the examples employ a flip chip connection with an interconnecting pillar to electrically and/or mechanically connect with a circuit board. An acoustic energy management structure for example, an air cavity or an acoustic mirror, can be employed on a first side of the resonator. The opposite, second, side of the resonator can be exposed for use as the active portion of the sensor. Disclosed methods also include a step of removing a portion of the substrate material. Timing of the step of removing a portion of the substrate is important because if it is removed too early in the process the substrate would be fragile and therefore be difficult to process through some operations.

Devices at various stages of fabrication according to some methods are disclosed, for example in FIGS. 1A to 1G. FIG. 1A shows a substrate 102 that has a first surface 103 and an opposing second surface 104. The substrate 102 can include silicon, for example. The substrate can have various structures or layers formed thereon on either surface and still be utilized in disclosed methods.

FIG. 1B shows the substrate 102 is shown after a first conductive material 106 has been disposed on at least a portion of the first surface 103 of the substrate 102. The first conductive material 106 or a first electrode formed therefrom can be described as having a first surface 105 that is adjacent or closest to the substrate 102 and a second opposing surface 107 that is opposite the first surface 103. The step of disposing the first conductive material can include deposition steps, patterning steps, or any combination thereof. In some embodiments, a conductive material can be deposited on at least some portion of a first surface of the substrate, or on any structures or devices formed on a first surface of the substrate and then the conductive material can be patterned post deposition step or steps. Deposition techniques such as atomic layer deposition (ALD), chemical vapor deposition (CVD), or physical vapor deposition (PVD) may be used in conjunction with one or more masks (e.g., photolithographic masks) to pattern some portion of the first conductive material, as well as any other layer, material or structure discussed herein if desired. In some embodiments, the first conductive material can include more than one material, more than one layer, or combinations thereof. In some embodiments, the first conductive material can include aluminum (Al), copper (Cu), gold (Au), platinum (Pt), combinations thereof, alloys thereof, or combinations thereof. In some embodiments, the first conductive material includes Al, an alloy thereof, or a multiple layer structure including at least one Al layer. In some embodiments, the first conductive material can include Al or a bilayer structure including at least one AlCu layer and a tungsten (W) layer, for example.

FIG. 1C shows the device after disposing a piezoelectric material 110 over at least some portion of the first electrode. In some embodiments, the piezoelectric material can be deposited on all portions of the first electrode(s). In some embodiments, the piezoelectric material can be deposited on all portions of the first electrodes that are not disposed on the first surface of the substrate or any devices or structures formed thereon. In some embodiments, inclined c-axis hexagonal crystal structure piezoelectric material (e.g., AlN or ZnO) can be utilized as the piezoelectric material.

In certain embodiments, the piezoelectric material may include aluminum nitride or zinc oxide material that includes a c-axis having an orientation distribution that is predominantly non-parallel (and may also be non-perpendicular) to normal of a face of the substrate. Such a c-axis orientation distribution enables creation of shear displacements, which beneficially enable operation of the MEMS resonator device with liquids, such as in a sensor and/or microfluidic device. In certain embodiments, piezoelectric material includes a c-axis with a longitudinal orientation.

Methods for forming hexagonal crystal structure piezoelectric materials including a c-axis having an orientation distribution that is predominantly non-parallel to normal of a face of a substrate are disclosed in U.S. patent application Ser. No. 15/293,063 filed on Oct. 13, 2016, with the foregoing application hereby being incorporated by reference herein. Additional methods for forming piezoelectric materials having an inclined c-axis orientation are disclosed in U.S. Pat. No. 4,640,756 issued on Feb. 3, 1987, with the foregoing patent hereby being incorporated by reference herein.

FIG. 1D shows the device after disposing a second conductive material on at least some portion of the piezoelectric material. The step of disposing the second conductive material can include deposition steps, patterning steps, or any combination thereof. In some embodiments, a conductive material can be deposited on at least some portion of the piezoelectric material and then the conductive material can be patterned post deposition step or steps to form the second electrode 112, as illustrated in FIG. 1D. The second conductive material extends substantially parallel to the first surface of the substrate. The second electrode 112 has at least some portion thereof that overlaps the first electrode 106. The stack of the first electrode 106, the piezoelectric material 110 and the second electrode 112 in the region where the three overlap forms a bulk acoustic wave resonator 114. The bulk acoustic wave resonator 114 has a first side 112 that is parallel to and the farthest away the first surface 103 of the substrate 102.

FIG. 1E shows the device after forming an acoustic management structure 116 on some portion of the first side of the bulk acoustic wave resonator 114. An acoustic energy management structure can include an air cavity or a reflector stack, for example. The purpose of the acoustic management structure is to contain the acoustic energy in the device. A reflector stack works as an acoustic mirror and can have the advantage of better mechanical strength. An air cavity can work better for retaining energy, but may also in a mechanically weaker device overall, or can invite the addition of other structures to address the lack in mechanical strength.

In certain embodiments, the energy management structure is an air gap or void cavity. The cavity can be formed by forming two side walls and a "roof" layer, thereby forming a cavity beneath and between the roof and walls respectively. The walls and roof can be formed using photolithography materials such as photo imageable materials such as photo imageable epoxy materials. Specific examples of such materials can include TMMF (Tokyo Ohka Kogya Co.) or SU-8 (MicroChem Inc, Newton MA). Wall and roof features may have thicknesses of 3 to 80 micrometers, or thicknesses of 10 to 30 micrometers for example. Wall width dimensions (e.g., distance from one wall to the other) may be 3 to 30 micrometers, or may be 5 to 15 micrometers for example. The area of the roof may be 100 micrometers$^2$ to 500,000 micrometers$^2$, or may be 2500 micrometers$^2$ to 200,000 micrometers$^2$ for example.

In certain embodiments, the acoustic energy management structure is an acoustic reflector. An acoustic reflector serves to reflect acoustic waves and therefore reduce or avoid their dissipation in the substrate. In certain embodiments, an acoustic reflector can include alternating layers of different materials (e.g., silicon oxicarbide [SiOC], silicon nitride [$Si_3N_4$], silicon dioxide [$SiO_2$], aluminum nitride [AlN], tungsten [W], and molybdenum [Mo]), optionally embodied in a quarter-wave Bragg mirror. In certain embodiments, other types of acoustic reflectors may also be used.

Further details about possible embodiments of acoustic energy management structures are discussed below with respect to particular embodiments of disclosed methods.

FIG. 1F shows the device after depositing a third conductive material 118 over a portion of the second conductive material 112. It should be noted that the first, second and third conductive materials can be the same or different. The third conductive material is deposited on a portion of the second conductive material that extends beyond the bulk acoustic wave resonator 112. Stated another way, the third conductive material is not overlying any portion of the bulk acoustic wave resonator but is overlying a portion of the second conductive material. The third conductive material forms an interconnect that extends above (in a direction perpendicular the first surface 103 of the substrate 102) the acoustic energy management structure. The third conductive material can be described or formed into a pillar structure 118 that can be electrically connected to another device or structure that contacts it.

FIG. 1G shows the device after a next step, which includes removing a portion of the substrate 102 to expose the first surface 105 of the first electrode 106. The step of removing a portion of the substrate can include one or more than one process. In some embodiments removing a portion of the substrate can include both mechanical and chemical processing steps. In some embodiments, a first step of removing a portion of the substrate can remove a substantially constant thickness over the entirety of the substrate. In some embodiments, this first step can be followed up by removing additional substrate material only at some portions of the substrate. In some embodiments, a mechanical removal step can be followed up by a chemical removal step, for example. In some such embodiments, the first step can leave the substrate at a thickness from 100 micrometers to 600 micrometers, from 100 micrometers to 550 micrometers, from 200 micrometers to 400 micrometers, or from 250 micrometers to 350 micrometers, or about 300 micrometers. Illustrative starting thicknesses of a substrate can be about 725 micrometers.

The step of exposing the first surface 105 of the first electrode 106 exposes the second side of the bulk acoustic wave sensor 114 for use or for further processing. It should be noted that at this point, the second surface of the bulk acoustic wave resonator 114 can expose the electrode material 106 or some other layer that had been disposed on the substrate before the first electrode material was deposited thereon.

Additional layers that may be exposed (or even applied) at this point can include an interface layer. An interface layer can function to allow or more easily allow the active surface of the bulk acoustic wave resonator 114 to be functionalized. In certain embodiments, an interface layer may be patterned or otherwise available to receive a self-assembled monolayer (SAM) over an entirety of an active region of a bulk acoustic wave resonator, to permit a SAM and functionalization (e.g., specific binding) material applied over the interface layer to overlap the entire active region. In other embodiments, a blocking layer may be patterned over an interface layer, or only a portion of the interface layer may be otherwise available to receive a SAM, over only a portion of an active region, to permit the SAM and functionalization material applied over the interface layer to overlap only a portion of the active region.

In certain embodiments, photolithography may be used to promote patterning of interface material or blocking material over portions of a MEMS resonator device. Photolithography involves use of light to transfer a geometric pattern from a photomask to a light-sensitive chemical photoresist on a substrate, and is a process well known to those of ordinary skill in the semiconductor fabrication art. Typical steps employed in photolithography include wafer cleaning, photoresist application (involving either positive or negative photoresist), mask alignment, and exposure and development. After features are defined in photoresist on a desired surface, an interface layer may be patterned by etching in one or more gaps in a photoresist layer, and the photoresist layer may be subsequently removed (e.g., using a liquid photoresist stripper, by ashing via application of an oxygen-containing plasma, or another removal process).

In certain embodiments, an interface layer may include a hydroxylated oxide surface suitable for formation of an organosilane SAM layer. A preferred interface layer material including a hydroxylated oxide surface is silicon dioxide [$SiO_2$]. Alternative materials incorporating hydroxylated oxide surfaces for forming interface layers include titanium dioxide [$TiO_2$] and tantalum pentoxide [$Ta_2O_5$]. Other alternative materials incorporating hydroxylated oxide surfaces will be known to those skilled in the art, and these alternatives are considered to be within the scope of the present disclosure.

In other embodiments, an interface layer includes gold or another noble metal (e.g., ruthenium, rhodium, palladium, osmium, iridium, platinum, or silver) suitable for receiving a thiol-based SAM.

In certain embodiments incorporating electrode materials subject to corrosion, a hermeticity layer may also be applied between a top side electrode and the interface layer. A hermeticity layer may be unnecessary when noble metals (e.g., gold, platinum, etc.) are used for top side electrodes. If provided, a hermeticity layer preferably includes a dielectric material with a low water vapor transmission rate (e.g., no greater than 0.1 (g/m$^2$/day)). Following deposition of these layers, a SAM may be formed over the interface layer, with the SAM preferably including an organosilane material. The hermeticity layer protects a reactive electrode material (e.g., aluminum or aluminum alloy) from attack in corrosive liquid environments, and the locally patterned interface layer facilitates proper chemical binding of the SAM.

In certain embodiments, a hermeticity layer and/or an interface layer may be applied via one or more deposition processes such as atomic layer deposition (ALD), chemical vapor deposition (CVD), or physical vapor deposition (PVD). Of the foregoing processes, ALD is preferred for deposition of at least the hermeticity layer (and may also be preferable for deposition of the interface layer), due to its ability to provide excellent conformal coating with good step coverage over device features, so as to provide layer structures that are free of pinholes. Moreover, ALD is capable of forming uniformly thin layers that provide relatively little damping of acoustic vibrations that would otherwise result in degraded device performance. Adequacy of coverage is important for a hermeticity layer (if present) to avoid corrosion of the underlying electrode. If ALD is used for deposition of a hermeticity layer, then in certain embodiments a hermeticity layer may include a thickness in a range of from about 10 nm to about 25 nm. In certain embodiments, hermeticity layer thickness is about 15 nm, or from about 12 nm to about 18 nm. Conversely, if another process such as CVD is used, then a hermeticity layer may include a thickness in a range of from about 80 nm to about 150 nm or more, or in a range of from about 80 nm to about 120 nm. Considering both of the foregoing processes, hermeticity layer thicknesses may range from about 5 nm to about 150 nm. If ALD is used for deposition of an interface layer, then an interface layer may include a thickness in a range of from about 5 nm to about 15 nm. In certain embodiments, an interface layer may include a thickness of about 10 nm, or in a range of from about 8 nm to about 12 nm. Other interface layer thickness ranges and/or deposition techniques other than ALD may be used in certain embodiments. In certain embodiments, a hermeticity layer and an interface layer may be sequentially applied in a vacuum environment, thereby promoting a high-quality interface between the two layers.

If provided, a hermeticity layer may include an oxide, a nitride, or an oxynitride material serving as a dielectric material and having a low water vapor transmission rate (e.g., no greater than 0.1 (g/m$^2$/day)) according to certain embodiments. In certain embodiments, the hermeticity layer includes at least one of $Al_2O_3$ or SiN. In certain embodiments, the interface layer includes at least one of $SiO_2$, $TiO_2$, or $Ta_2O_5$. In certain embodiments, multiple materials may be combined in a single hermeticity layer, and/or a hermeticity layer may include multiple sublayers of different materials. Preferably, a hermeticity layer is further selected to promote compatibility with an underlying reactive metal (e.g., aluminum or aluminum alloy) electrode structure of an acoustic resonator structure. Although aluminum or aluminum alloys are frequently used as electrode materials in bulk acoustic wave resonators, various transition and post-transition metals can be used for such electrodes.

Following deposition of an interface layer (optionally arranged over an underlying hermeticity layer), a SAM is preferably formed over the interface layer. SAMs are typically formed by exposure of a solid surface to amphiphilic molecules with chemical groups that exhibit strong affinities for the solid surface. When an interface layer comprising a hydroxylated oxide surface is used, then organosilane SAM layers are particularly preferred for attachment to the hydroxylated oxide surface. Organosilane SAMs promote surface bonding through silicon-oxygen (Si—O) bonds. More specifically, organosilane molecules include a hydrolytically sensitive group and an organic group, and are therefore useful for coupling inorganic materials to organic polymers. An organosilane SAM may be formed by exposing a hydroxylated surface to an organosilane material in the presence of trace amounts of water to form intermediate silanol groups. These groups then react with free hydroxyl groups on the hydroxylated surface to covalently immobilize the organosilane. Examples of possible organosilane-based SAMs that are compatible with interface layers incorporating hydroxylated oxide surfaces include 3-glycidoxypropyltrimethoxysilane (GPTMS), 3-mercaptopropyltrimethoxysilane (MPTMS), 3-aminopropyltrimethoxysilane (APTMS), and octadecyltrimethoxysilane (OTMS), including their ethoxy- and chloro-variants. Additional silanes that may be used for SAMs include poly(ethylene glycol) (PEG) conjugated variants. Those skilled in the art will recognize that other alternatives exist, and these alternatives are considered to be within the scope of the present disclosure. An exemplary SAM may include a thickness in a range of at least 0.5 nm or more. Preferably, a SAM readily binds to the locally patterned interface layer, but does not readily bind to other adjacent material layers (e.g., a hermeticity layer, a piezoelectric material, and/or a blocking material layer).

When an interface layer comprising gold or another noble metal is used, then thiol-based (e.g., alkanethiol-based) SAM layers may be used. Alkanethiols are molecules with an alkyl chain as the back bone, a tail group, and a S—H head group. Thiols may be used on noble metal interface layers due to the strong affinity of sulfur for these metals. Examples of thiol-based SAMs that may be used include, but are not limited to, 1-dodecanethiol (DDT), 11-mercaptoundecanoic acid (MUA), and hydroxyl-terminated (hexaethylene glycol) undecanethiol (1-UDT). These thiols contain the same backbone, but different end groups—namely, methyl ($CH_3$), carboxyl (COOH), and hydroxyl-terminated hexaethylene glycol (HO—$(CH_2CH_2O)_6$) for DDT, MUA, and 1-UDT, respectively. In certain embodiments, SAMs may be formed by incubating gold surfaces in thiol solutions using a suitable solvent, such as anhydrous ethanol.

Following formation of a SAM, the SAM may be biologically functionalized, such as by receiving at least one functionalization (e.g., specific binding) material. In certain embodiments, specific binding materials may be applied on or over a SAM using a microarray spotting needle or other suitable methods. Since a SAM and an underlying interface layer are patterned (e.g., using photolithography for defining the interface layer) with a high dimensional tolerance over only a portion of a resonator structure (which includes a substrate), and the subsequently applied specific binding material preferably attaches only to the SAM, a higher dimensional tolerance may be achieved for positioning of the specific binding material than could be attained by microarray spotting alone.

FIG. 1H shows a device after additional processing. The device of FIG. 1H has been flipped over and then placed on a second substrate 120 in order to make electrical connections to other devices, for example. The device is electrically connected to the second substrate 120, which may be a printed circuit board (PCB) for example. The second substrate 120 can be connected to the device via an electric contact pad 122 for example. The device of FIG. 1H also includes fluidic walls 122 formed on the second substrate 120. The fluidic walls may be formed of any suitable material, such as laser-cut "stencil" layers of thin polymeric materials and/or laminates, optionally including one or more self-adhesive surfaces (e.g., adhesive tape). Optionally such walls may be formed prior to deposition of a SAM layer, a functionalization layer, and/or blocking layers, with an SU-8 negative epoxy resist or other photoresist material. The device in FIG. 1H also includes a cover 124 or cap layer. The cover 124 may be formed by defining ports (e.g., via laser cutting or water jet cutting) in a layer of an appropriate material (e.g., preferably a substantially inert polymer, glass, silicon, ceramic, or the like), and adhering the cover or cap layer to top surfaces of the fluidic walls 122. The combination of the cover 124 and the fluidic walls 122 forms the fluidic channel 126.

Figure 1I:
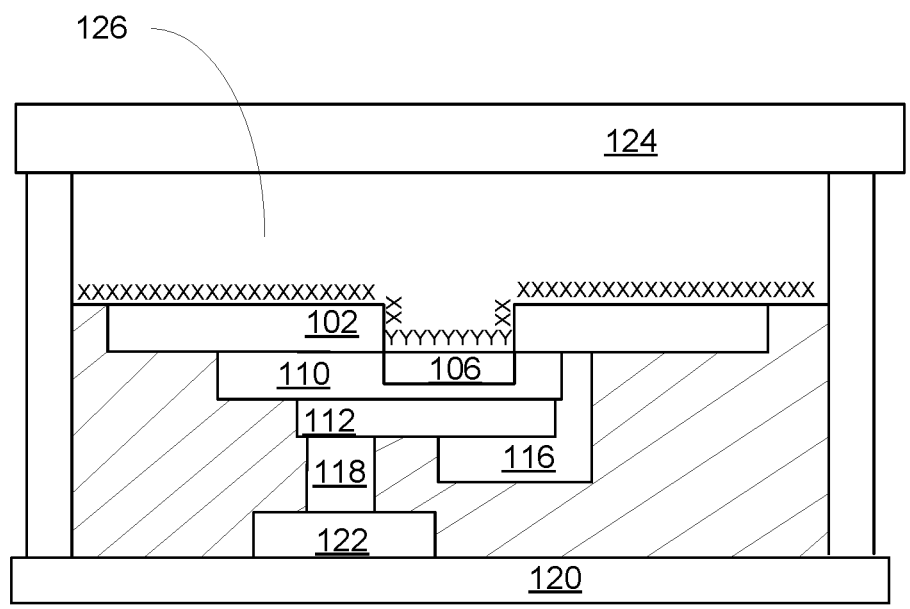

FIG. 1I shows the device after functionalization, which is depicted by YYYY and blocking, which is depicted by XXXXX. Examples of specific binding materials for functionalization include, but are not limited to, antibodies, receptors, ligands, and the like. A specific binding material is preferably configured to receive a predefined target species (e.g., molecule, protein, DNA, virus, bacteria, etc.). A functionalization layer including specific binding material may include a thickness in a range of from about 5 nm to about 1000 nm, or from about 5 nm to about 500 nm. In certain embodiments, an array of different specific binding materials may be provided over different active areas of a multi-resonator device (i.e., a resonator device including multiple active areas), optionally in combination with one or more active areas that are devoid of specific binding materials to serve as comparison (or "reference") regions. In certain embodiments, a functionalization material may provide non-specific binding utility.

Figure 1J:
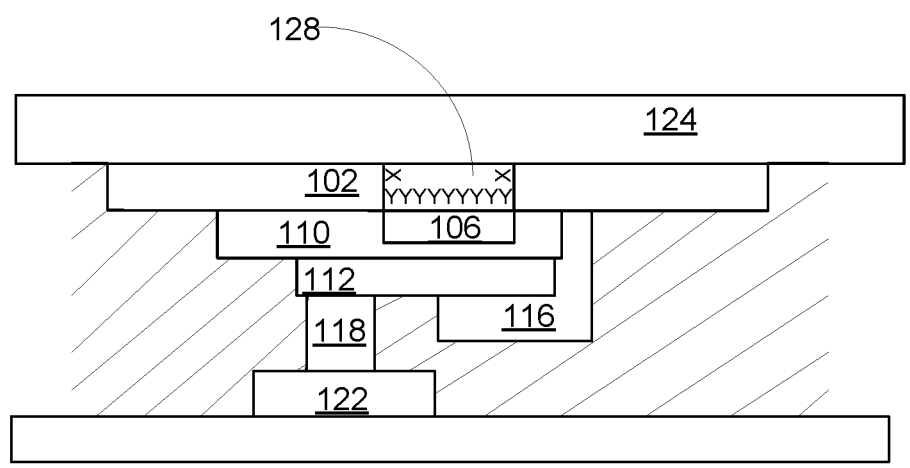

FIG. 1J provides an alternative to the step of forming the fluidic walls that the cover 124 is attached to. In this embodiment, the cover 124 is attached directly to the electrode material forming a channel 128.

FIGS. 2 to 20 illustrate a more particular method of forming a fluidic device including a bulk acoustic wave resonator in accordance with one example of the present disclosure. Generally, deposition techniques such as atomic layer deposition (ALD), chemical vapor deposition (CVD), or physical vapor deposition (PVD), or other techniques may be used to deposit materials. One or more masks (e.g., photolithographic masks), stop layers, etch layers, etc. may also be used to pattern some portion of any material deposited herein to form a demonstrated layer or structure. Although the structures and devices depicted in FIGS. 2 to 20 demonstrate a method that forms three resonator structures, related electrical connections and structures, generally only one of repeated structures will be provided with reference numerals for the sake of clarity.

Figure 2:
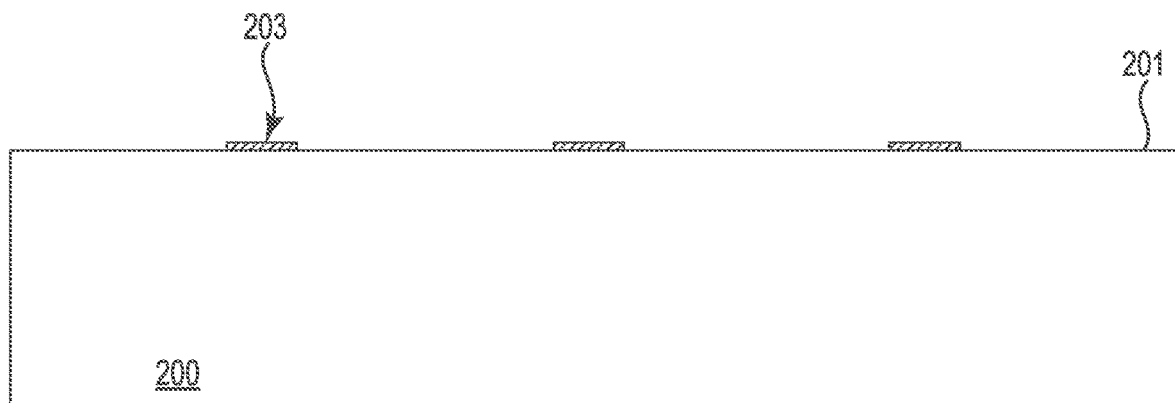
FIG. 2 is a schematic sectional view illustrating a sacrificial layer and silicon substrate during a method of forming an example bulk acoustic wave structure in accordance with aspects of the present disclosure.

FIG. 2 generally illustrates a substrate 200 that has a first surface 201 and a second surface 202. A sacrificial layer 203 has been formed on a portion of the first surface 201. The sacrificial layer may protect the resonator device that is formed via the described method when the second side 202 of the substrate 200 is partially removed. The substrate can be a silicon substrate for example and the sacrificial material can be aluminum for example. The sacrificial layer is generally deposited and patterned in the area where a resonator will be formed.

Figure 3:
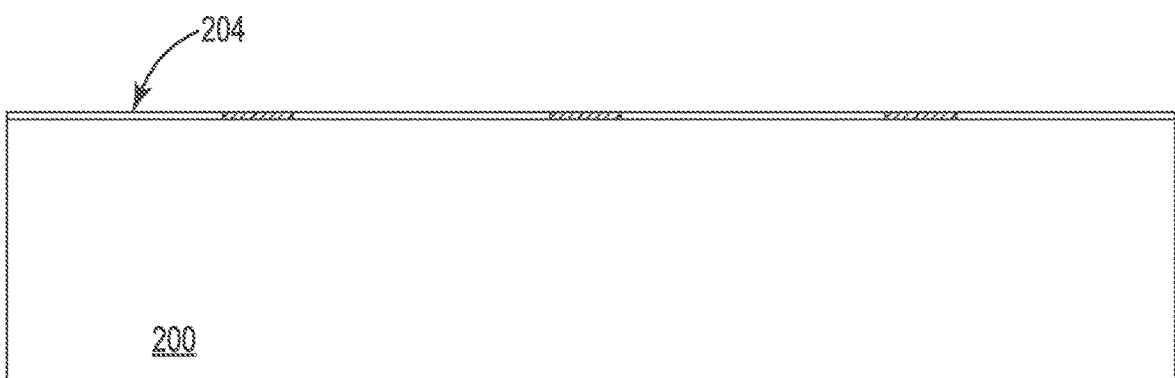
FIG. 3 is a schematic sectional view illustrating a silicon oxide layer on the layers of FIG. 2 during a method of forming an example bulk acoustic wave structure in accordance with aspects of the present disclosure.

FIG. 3 illustrates the structure after a step meant to form a planar surface for additional process steps to be carried out on. Specifically, additional silicon oxide material can be deposited onto the sacrificial material 202 and the exposed portions of the first surface 201 of the substrate 200. The deposition of the silicon oxide material can be followed by a chemical mechanical polish (CMP) process, for example to form a planar silicon oxide layer 204 with a top surface level with the sacrificial layer 203. In other words, the top surface of the silicon oxide layer 204 is planar with the top surface of the patterned sacrificial layer 202 deposited in the step illustrated in FIG. 2. The silicon oxide layer 204, the sacrificial layer, or both may not only act as a planarized layer upon which to form additional structures but may also function as a silicon etch stop layer, a functionalization binding surface, or both during later steps of the disclosed process. Optionally, the silicon oxide material, if it is of greater thickness may also provide some temperature compensation properties. For example, silicon oxide material with a thickness of at least 300 nanometers may aid in temperature compensation for the device. Specific thicknesses of the silicon oxide material may depend, at least in part on the operating frequency of the device, materials in the device, thicknesses of various materials in the device, or combinations thereof, for example.

Figure 4:
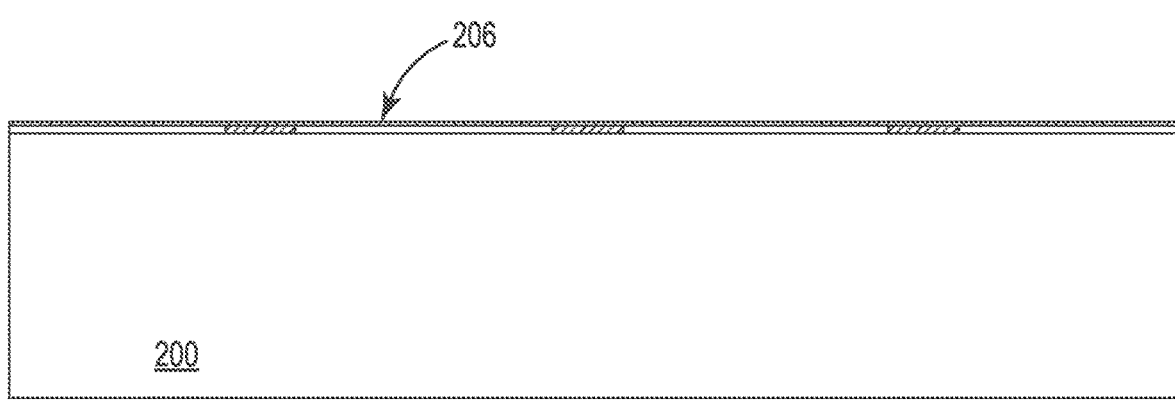
FIG. 4 is a schematic sectional view illustrating a silicon nitride layer on the layers of FIG. 3 during a method of forming an example bulk acoustic wave structure in accordance with aspects of the present disclosure.

FIG. 4 illustrates the structure after a passivation layer 206 is formed on the sacrificial layer 202 and the silicon oxide layer 204. The passivation layer 206 may function as a moisture barrier layer for example. Illustrative passivation layers can include silicon nitride, and aluminum oxide (e.g., ALD deposited AlO) for example. Passivation layers may provide moisture barrier properties that could serve to protect the device.

Figure 5:
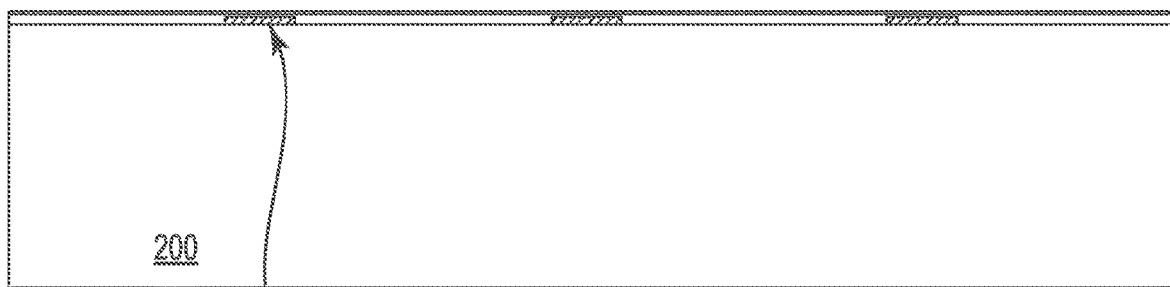
FIG. 5 is a schematic sectional view illustrating optional removal of the sacrificial layers on the layers of FIG. 4 during a method of forming an example bulk acoustic wave structure in accordance with aspects of the present disclosure.

FIG. 5 illustrates the structure after the sacrificial layer 202 has been removed. The sacrificial layer 202 can be removed for example, by etching it from the non-substrate side of the structure to form a resonator gap 208. In some particular embodiments, a photo resist pattern can be applied and holes (not shown) may be etched through the passivation layer 206 overlying the sacrificial layer 202. Illustrative etchants that may be utilized for this particular set of materials can include "16-1-1-2", which refers to a composition that includes 16 parts $H_3PO_4$:1 part $HNO_3$: 1 part $CH_3COOH$: 2 parts $H_2O$, parts by volume, that will not etch silicon nitride or silicon but will etch aluminum oxide. If other materials were used for the passivation layer 206 and the sacrificial layer 202, one of skill in the art would be aware of possible etchant compositions. The formation of the resonator gap 208 allows the resonator that is ultimately formed to be probed and trimmed for final use.

Figure 6:
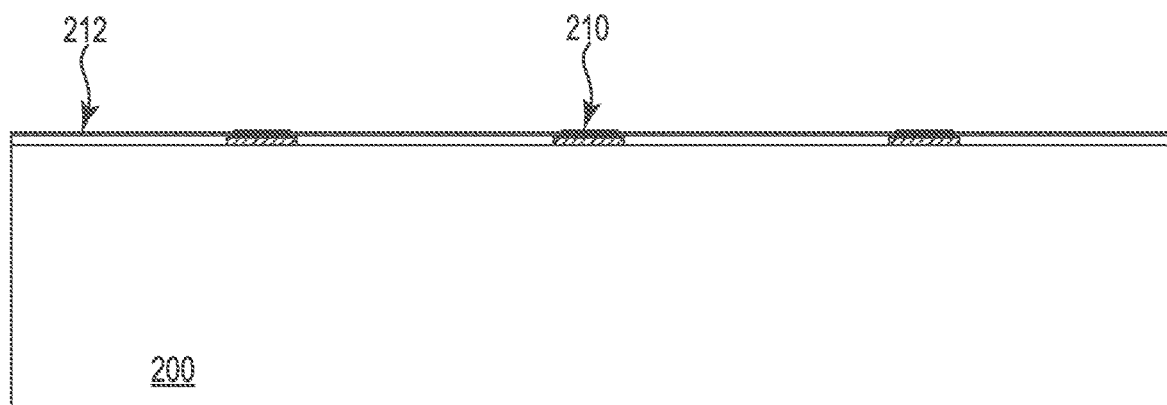
FIG. 6 is a schematic sectional view illustrating electrodes and silicon oxide on the layers of FIG. 5 during a method of forming an example bulk acoustic wave structure in accordance with aspects of the present disclosure.

FIG. 6 illustrates the structure after formation of a first electrode 210 thereon. Formation or deposition of a first electrode 210 can include deposition of a material, patterning of the material, or any combination thereof. Silicon oxide material 212 was then deposited on the structure and was planarized (e.g., using CMP) to form a planar surface for subsequent process steps. Suitable conductive materials for the first electrode can include aluminum, aluminum copper alloys, tungsten or a combination of these materials, for example.

Figure 7:
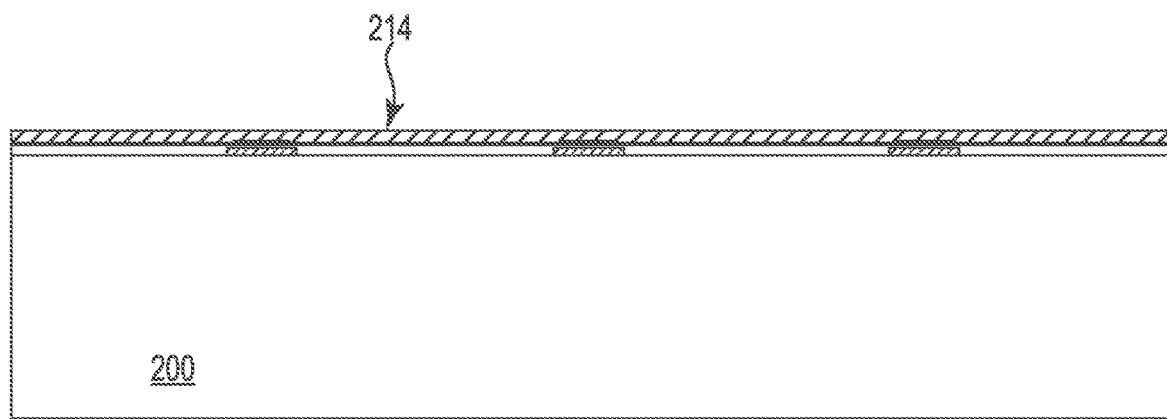
FIG. 7 is a schematic sectional view illustrating a tilted shear axis piezoelectric film on the layers of FIG. 6 during a method of forming an example bulk acoustic wave structure in accordance with aspects of the present disclosure.

FIG. 7 illustrates the structure after deposition of a piezoelectric material 214 on the exposed surface of the silicon oxide material 212. One example of a suitable material useful as a tilted shear axis piezoelectric film is aluminum nitride which may be deposited at an angle different than normal to the substrate. Use of an optional tilted piezoelectric seed layer before deposition of the bulk piezoelectric material may also be utilized. The tilted shear axis piezoelectric film may be composed of a seed layer of aluminum nitride deposited at an angle and a bulk piezoelectric film of aluminum nitride deposited normal to the substrate. The tilted seed layer may promote tilting of the microstructure of the bulk shear film thus providing shear piezoelectric properties.

Figure 8:
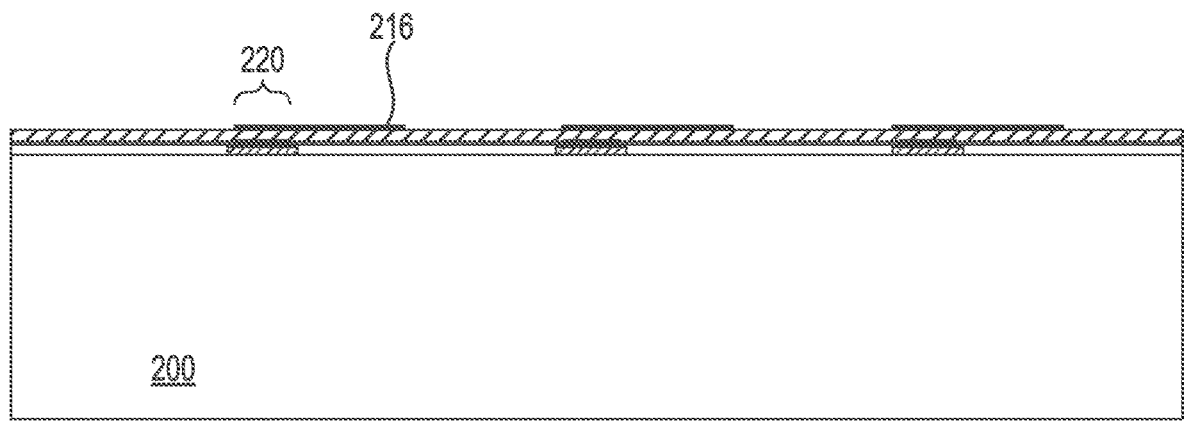
FIG. 8 is a schematic sectional view illustrating a second electrode layer on the piezoelectric layer of FIG. 7 during a method of forming an example bulk acoustic wave structure in accordance with aspects of the present disclosure.

FIG. 8 illustrates the device after formation or deposition of a second electrode 216 over the piezoelectric layer 214. Formation of the second electrode 216 can include deposition of a material, patterning of the material, or any combination thereof. Suitable conductive materials for the first electrode can include aluminum, aluminum copper alloys, tungsten or a combination of these materials, for example. The material of the second electrode 216 may or may not be the same as the material of the first electrode 210. The region (or regions) where the first electrode 210, the piezoelectric layer 214 and the second electrode 216 overlap forms a bulk acoustic wave resonator 220.

Figure 9:
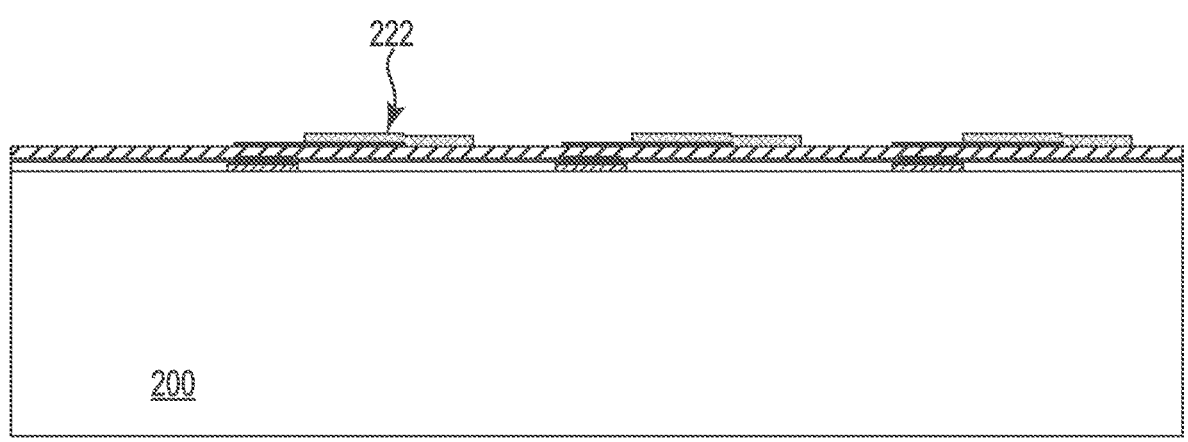
FIG. 9 is a schematic sectional view illustrating a buildup layer on the layers of FIG. 8 during a method of forming an example bulk acoustic wave structure in accordance with aspects of the present disclosure.

FIG. 9 illustrates the device after formation of a buildup layer 222. The buildup layer is an optional structure that may result in decreased parasitic loss along the length of the lead that extends from the second electrode. Some examples of suitable buildup materials include aluminum, aluminum copper alloy, tungsten or a combination of these metals.

Figure 10:
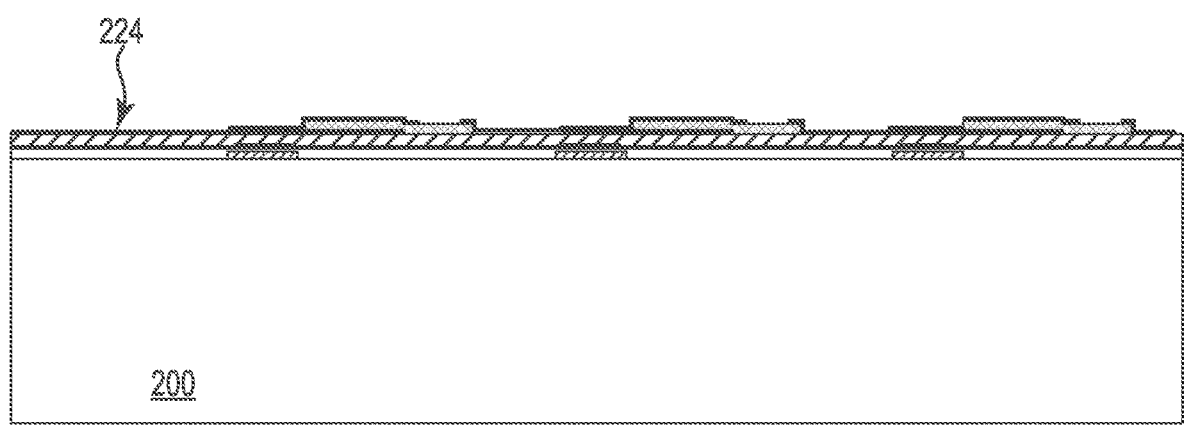
FIG. 10 is a schematic sectional view illustrating a protective layer on the layers of FIG. 9 during a method of forming an example bulk acoustic wave structure in accordance with aspects of the present disclosure.

FIG. 10 illustrates the device after formation of a second passivation layer 224. The second passivation layer 224 can include materials as described with respect to the first passivation layer and may provide the same or a similar functionality as the first passivation layer. The materials, properties, and characteristics (e.g., thickness, etc.) may be the same or different from the first passivation layer. The second passivation layer is not deposited in, or is otherwise absent from, the active region (e.g., over the bulk acoustic wave resonator 220) or on the second electrodes where the interconnects will be formed, as described further below.

Figure 11:
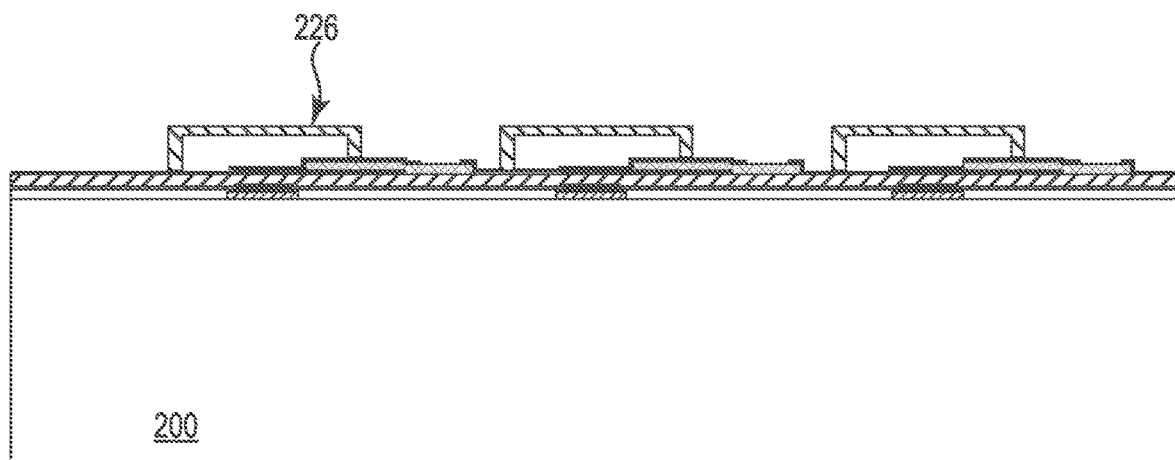
FIG. 11 is a schematic sectional view illustrating an acoustic energy management structure extending over a portion of the layers of FIG. 10 during a method of forming an example bulk acoustic wave structure in accordance with aspects of the present disclosure.

FIG. 11 illustrates the device after formation of an acoustic energy management structure 226. The acoustic energy management structure 226 in this example is an air cavity. Because the acoustic energy management structure covers the resonator it may also provide protection from materials, chemicals, or both from contacting and damping the resonator. Materials that may be used to fabricate the acoustic energy management structure can include photoresist, or photo imageable epoxy, such as TMMF (Tokyo Ohka Kogya Co.) or SU-8 (MicroChem Inc, Newton MA), for example. An acoustic energy management structure that includes an air cavity 226, such as can be fabricated in two structures, for example, a wall layer(s) and a roof layer.

Figure 12:
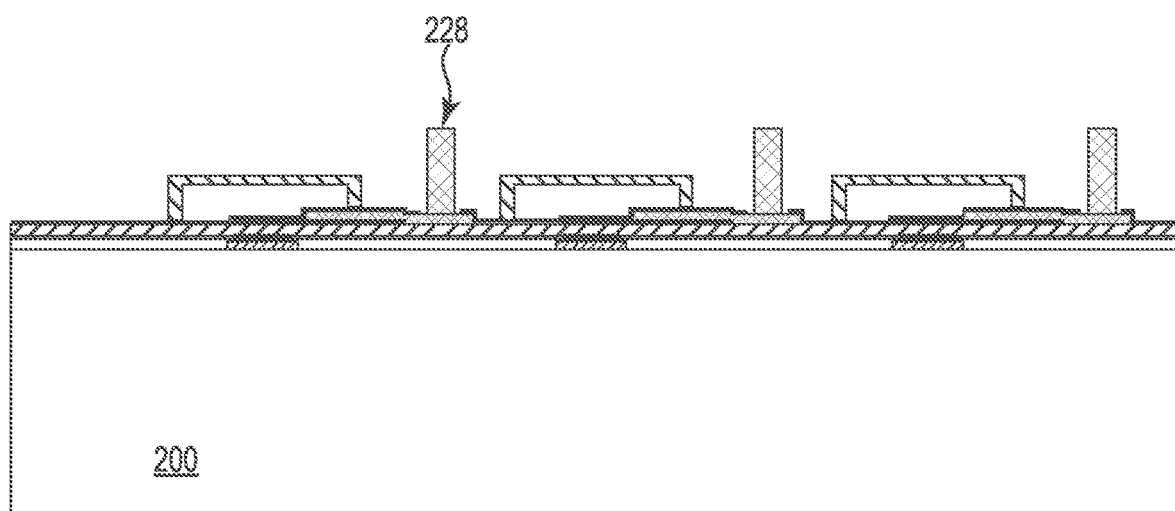
FIG. 12 is a schematic sectional view illustrating interconnects for electrical connection to a board disposed relative to the layers of FIG. 10 during a method of forming an example bulk acoustic wave structure in accordance with aspects of the present disclosure.

FIG. 12 illustrates the device after the next step, formation of interconnects 228 disposed on at least a portion of the second electrode material in an area not overlapping the bulk acoustic wave resonator 220. The interconnect 228 functions to afford electrical, mechanical, or a combination thereof connection between the acoustic wave resonator 220 and another structure or device. The interconnects can be formed as electrical interconnect bumps. The interconnects can be formed of copper pillars with tin, for example. Fabrication of plated copper pins with tin can include the use of photoresist to pattern regions, depositing an optional plating seed layer such as titanium and copper, plating the interconnects and then removal of the optional plating seed layer and the photoresist.

Figure 13:
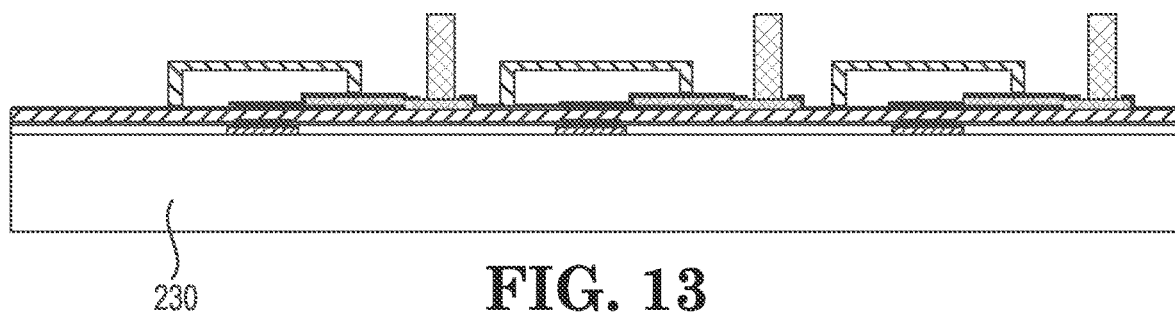
FIG. 13 is a schematic sectional view illustrating removal of a portion of the substrate to reduce the substrate thickness relative to the layers of FIG. 12 during a method of forming an example bulk acoustic wave structure in accordance with aspects of the present disclosure.

FIG. 13 illustrates the device after a portion of the second surface 202 of the substrate has been removed exposing a modified second surface 230. This step can be accomplished through a thinning, or non-selective location removal step, e.g., a process such as back grinding for example. The back grinding provides a desired substrate thickness. In some examples, such as where the final microfluidic channel height will be defined by the distance from this back surface 230 to a top of an independently formed wall (see later process steps) the thickness of the substrate at this point is important. The fluidic channels are further described below. In some optional embodiments, the substrate can be thinned earlier and then a temporary carrier can be utilized to provide mechanical stability for some of the processing steps.

Figure 14A:
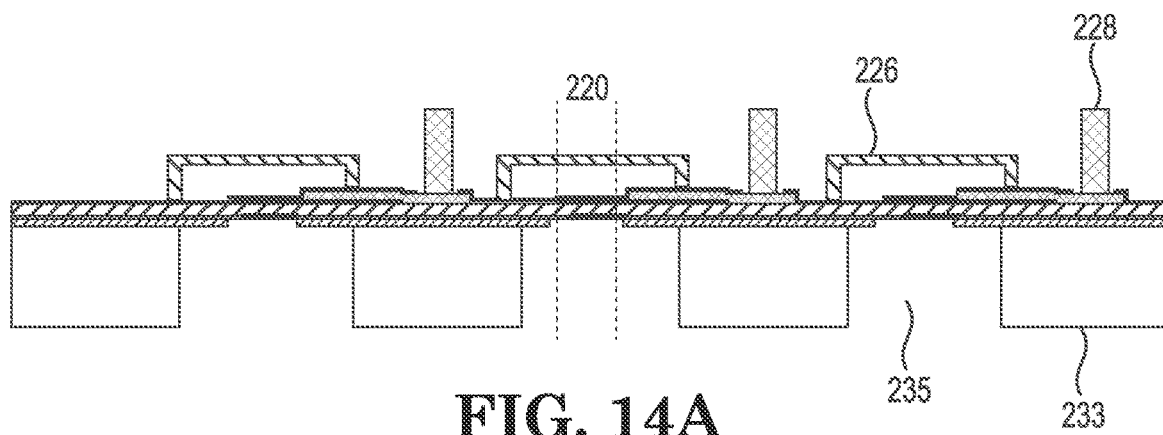
FIGS. 14A, 14B and 14C are schematic sectional and perspective views illustrating dry etching of additional portions of the substrate to form a fluidic path relative to the layers of FIG. 13 during a method of forming an example bulk acoustic wave structure in accordance with aspects of the present disclosure.

FIG. 14A illustrates the structure after selective portions of the substrate have been removed from the modified second surface 230 to form the top substrate surface 233. Particularly, the region of the substrate removed is that located underneath the acoustic wave resonator 220. Material beyond the perimeter of the acoustic wave resonator 220 may also optionally be removed. Once the material of the substrate is removed, the hermeticity layer, e.g., silicon nitride, and the interface layer, e.g., silicon oxide, are exposed.

In embodiments where the sacrificial layer had not been removed prior, it can be removed at this point. This is illustrated by the device in FIG. 14A. If the sacrificial layer was still intact for removal of the substrate, it may serve to protect the electrode during the backside dry etch. A particular process for accomplishing this selective removal of a portion(s) of the substrate includes dry silicon etching over the area of the resonator 220. One specific illustrative method to complete this process is to coat the backside of the wafer with photoresist; typically for dry etching this may be a thick resist on the order of 5 to 10 micrometers thick. A backside alignment tool may register to front side alignment marks and exposes the photoresist. The photoresist may be developed, and silicon can be etched by alternating a deep reactive-ion etch of (DRIE) the silicon with sulfur hexafluoride ($SF_6$) and an octafluorocyclobutane ($C_4F_8$) passivation layer. An alternative masking process to the photoresist is to deposit aluminum on the backside and open a pattern with laser machining. Another useful silicon etching process can include a non-isotropic wet chemical etch employing potassium hydroxide (KOH) or tetramethylammonium hydroxide (TMAH) to selectively remove the substrate along the active region. In this case the wall profile will be 54.7 degrees, e.g., a wall following the <111> planes of the silicon in the substrate.

Figure 14B:
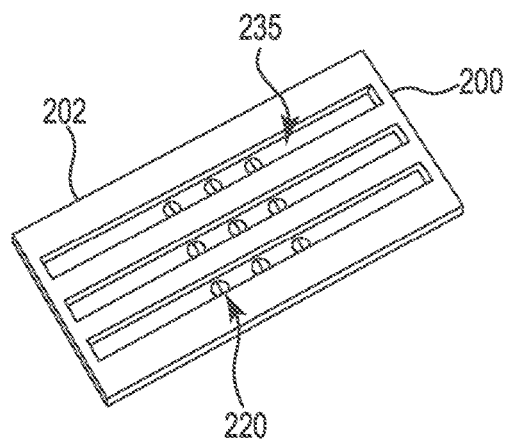
Figure 14C:
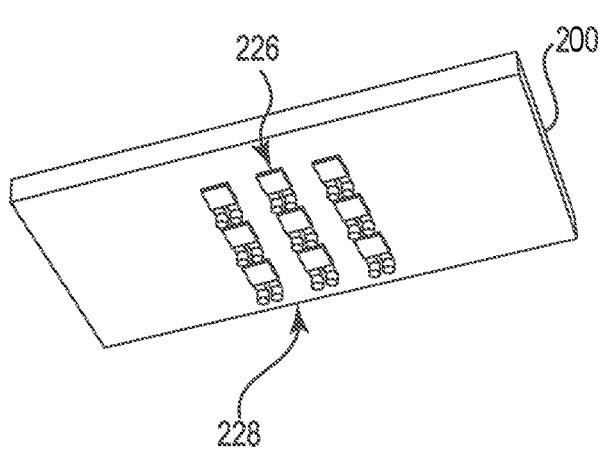

FIG. 14B shows the device looking at it from the second surface 202 of the substrate 200. Seen in FIG. 14B are the acoustic wave resonators 220 and the trenches 235 formed to expose the acoustic wave resonators 220. FIG. 14C shows the device looking at it from the first surface 201 of the substrate 200. From this surface you can see the acoustic energy management structure, exemplified as air cavity 226 and pillars 228.

Figure 15A:
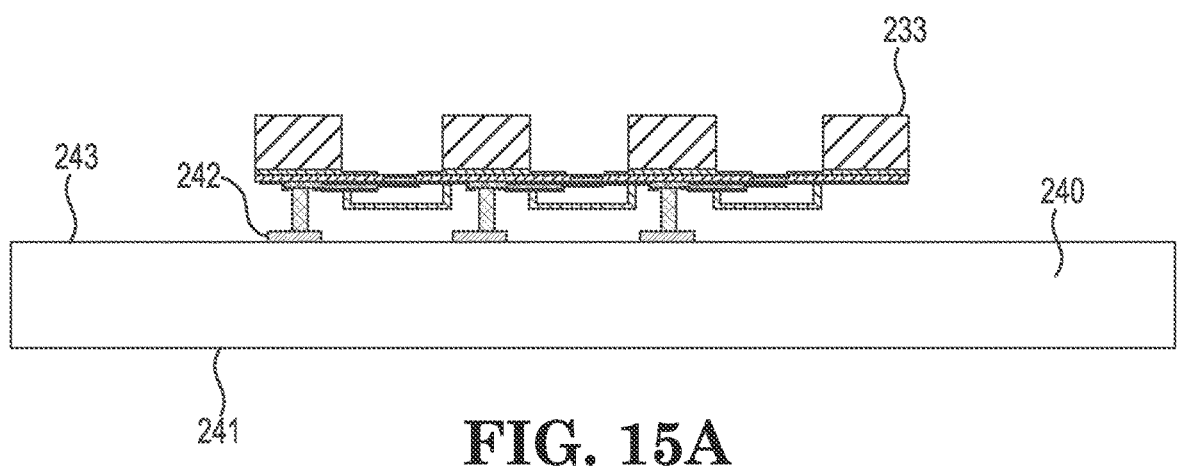
FIGS. 15A, 15B, 15C, 15D and 15E are schematic sectional, cross sectional and perspective views illustrating the BAW die flip chip mounted to a board relative to the bulk acoustic wave structure of FIG. 14 during a method of forming an example bulk acoustic wave structure in accordance with aspects of the present disclosure.

FIG. 15A illustrates the device after flip chip mounting to a sensor board 240. In one example, the interconnect, the pillars 228 are electrically connected by soldering them with tin onto copper pads 242 with organic solderability preservative (OSP), for example. Another alternative can include solder balls on the die soldered onto a bond pad. The bond pad can be formed of a suitable conductive material such as gold, for example. There are no fluidics on the side of the die with the interconnect bumps.

Figure 15B:
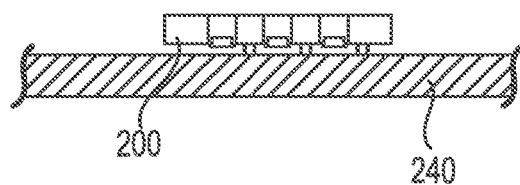
Figure 15C:
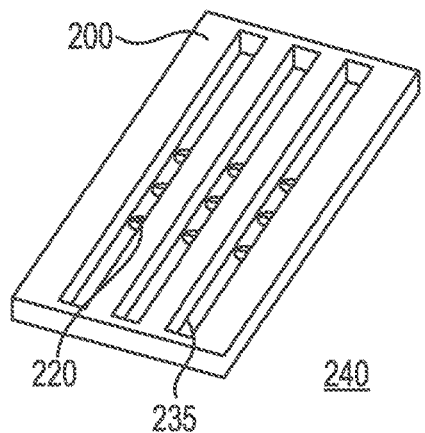

FIG. 15B shows a cross section of the device of FIG. 15A, and illustrates the sensor board 240 and the substrate 200. FIG. 15C shows the structure from the second surface 202 of the substrate 200 showing the trenches 235 that expose the acoustic wave resonators 220.

Figure 15D:
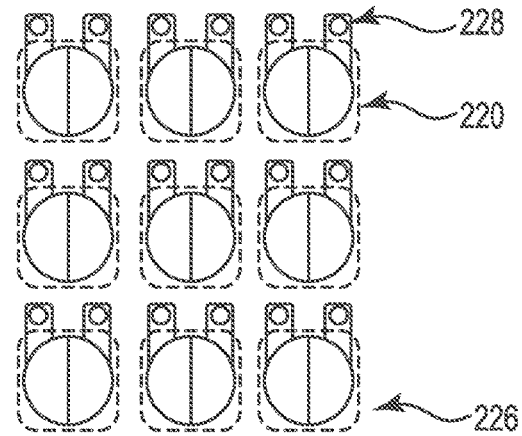
Figure 15E:
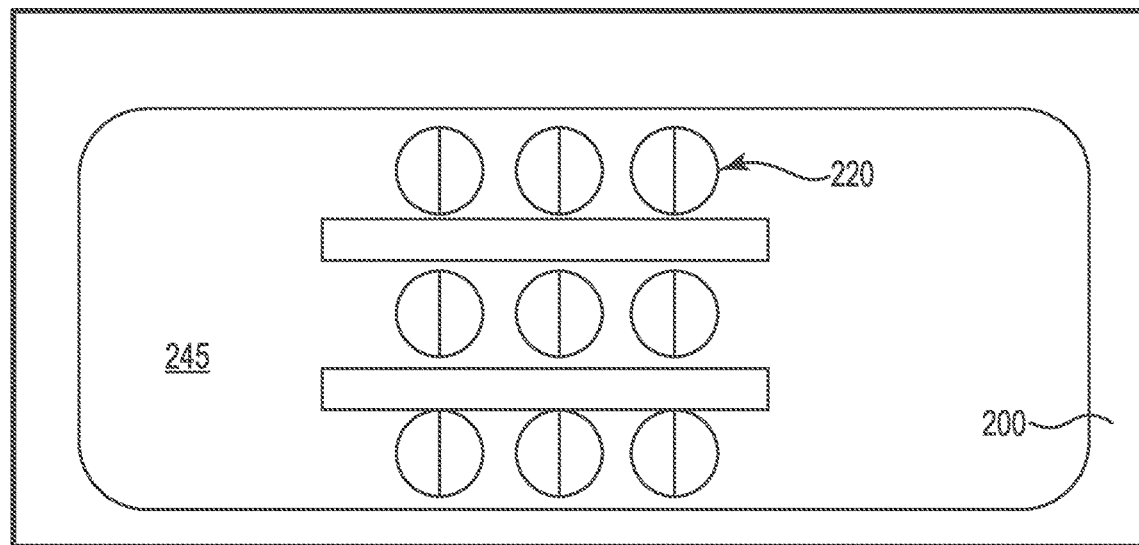

FIG. 15D shows an illustration from the bottom surface 241 of the sensor board. The respective positions of the pillars 228, the air cavities 226, and the acoustic wave resonators 220 are illustrated. FIG. 15E shows an illustration from the top surface 243 of the sensor board. The respective positions of the remaining substrate 200 and the acoustic wave resonators 220. Ultimately, the region 245 shows where the substrate is etched to the depth of exposing the first electrode layer 210 of the acoustic wave resonator 220, thereby forming the bottom of the fluidic channel.

Figure 16:
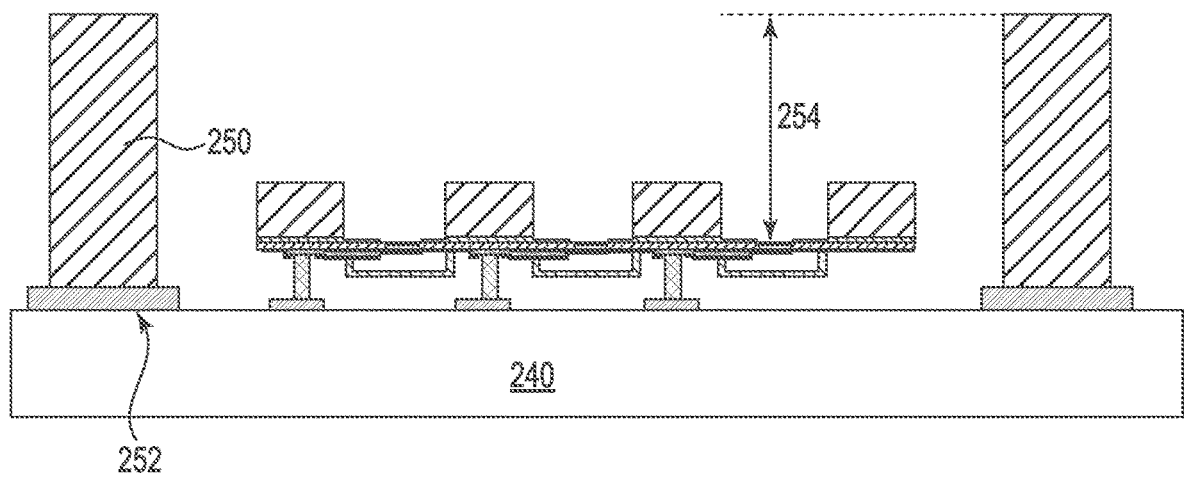
FIG. 16 is a schematic sectional view illustrating attachment of a fluidic wall structure relative to the bulk acoustic wave structure of FIG. 14 during a method of forming an example fluidic device in accordance with aspects of the present disclosure.

FIGS. 16 through 19 illustrate one method of forming the fluidic channel with independent walls. FIG. 16 shows the device after formation or attachment of a fluidic wall structure 250 to the sensor board 240. The fluidic In some illustrative embodiments, the fluidic wall structure 250 can be attached to the sensor board 240 with adhesive 252. The fluidic wall structure can be formed from injection molding of plastic, machining of metal or glass, or other suitable method. In high volume production, an adhesive can be dispensed with an automated robotic system in the location where the fluidic wall structure is located. The wall structures can be received onto the adhesive either in tape and reel format or in trays. The wall structure can be positioned onto the adhesive. The adhesive is cured in an oven. The fluidic wall structure is configured to accommodate the desired fluidic channel height from the resonator to the top of the wall. The channel height 254 of the final fluidic channel can be described as being from the first electrode 210 surface to the top of the fluidic wall structure 250.

Figure 17B:
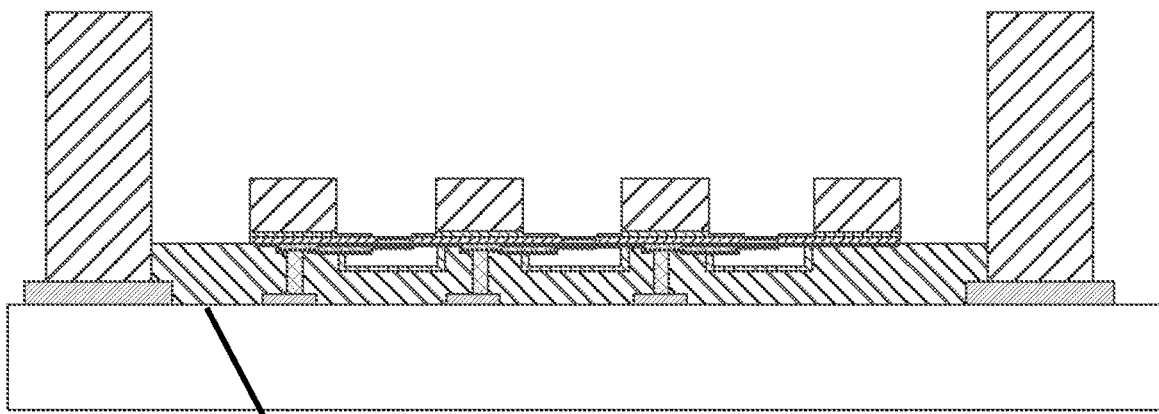
Figure 17B:
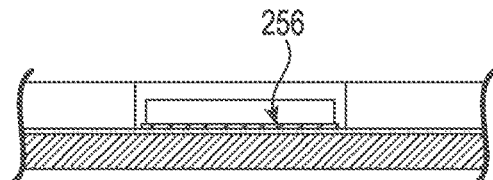
Figure 17C:
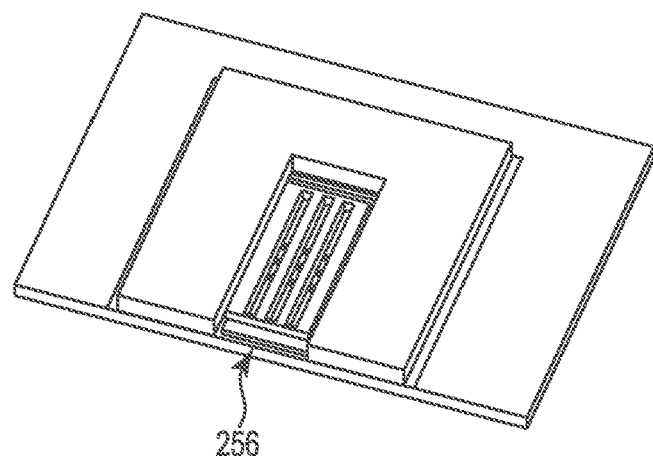

FIG. 17A shows the structure after adhesive underfill 256 has been deposited under the flip chip mounted die. FIG. 17B shows a first cross section of the structure and depicts the adhesive underfill 256. FIG. 17C shows an isometric view of the structure also showing the adhesive underfill 256. Adhesive from a dispenser tip may be placed near the side of the die. Capillary force can wick the adhesive under the mounted die. A bake step may then be performed to cure the adhesive. The bake step may be completed to cure both the underfill and fluidic wall structure adhesives. The purpose of the underfill adhesive is to protect the bumped region of the die from chemical attack from the fluid used when the sensor is used.

Figure 18:
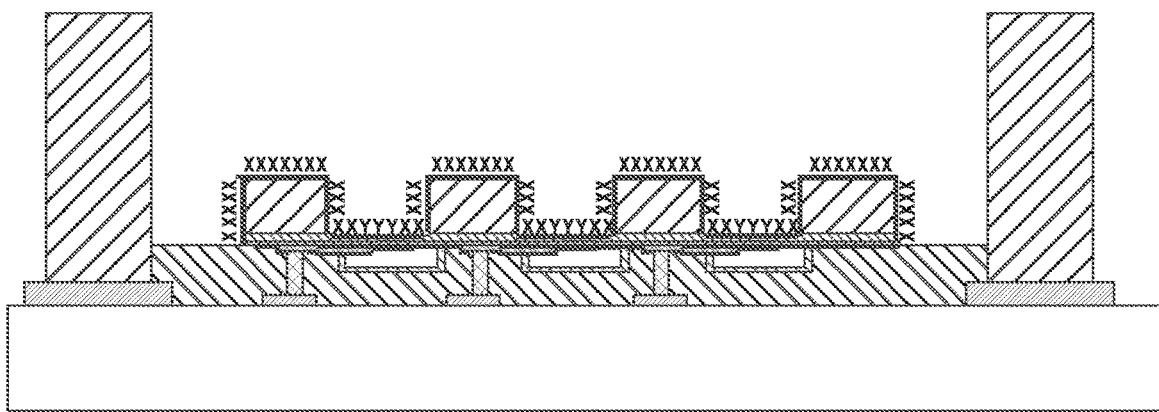
FIG. 18 is a schematic sectional view illustrating silanization, printing of functionalization and spotting relative to the apparatus of FIG. 17 during a method of forming an example bulk acoustic wave structure in accordance with aspects of the present disclosure.

FIG. 18 shows the structure after functionalization (depicted as YYY in FIG. 18) and blocking (depicted as in FIG. 18). FIG. 18 illustrates functionalization chemistry on the a sensor. First a silanization step may be completed to coat a monolayer of adhesion promoter on the surface, then functionalization can be printed onto the resonators and finally the surface that is not functionalized is blocked to prevent non-specific binding. The functionalization may be a bioreceptor that is designed to bind the analyte of interest. The functionalization may be a protein for example.

Figure 19A:
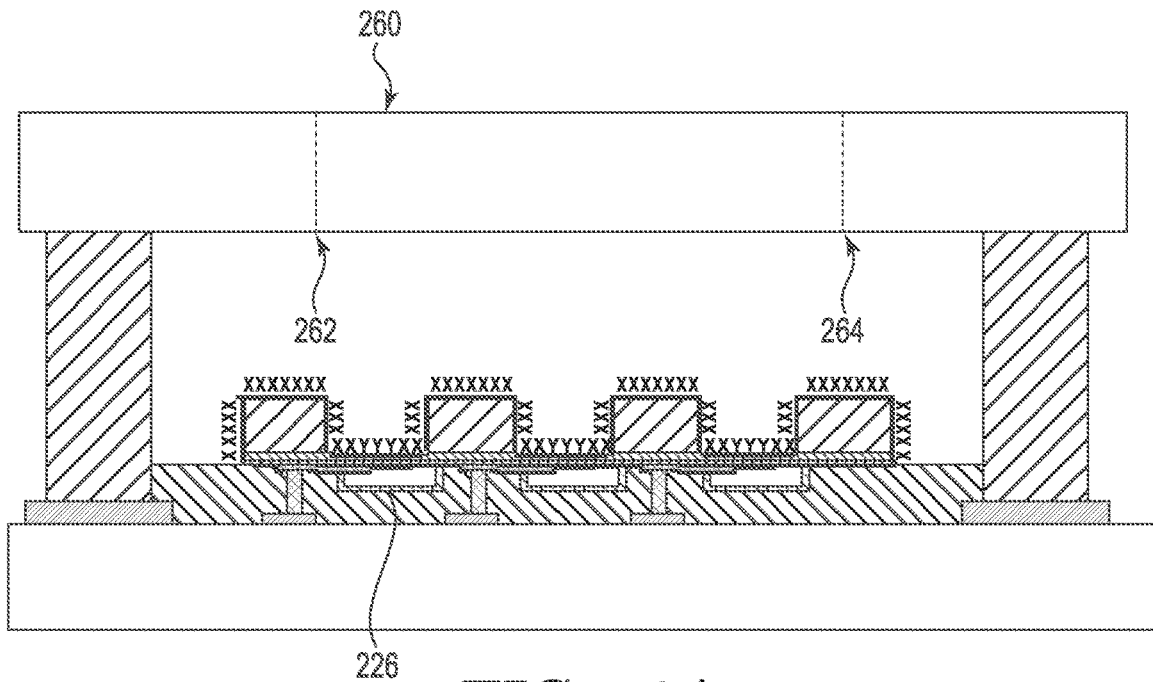
FIGS. 19A, 19B and 19C are schematic and cross sectional views illustrating a fluidic chamber cover attached onto the fluidic wall structure relative to the apparatus of FIG. 18 during a method of forming an example bulk acoustic wave structure in accordance with aspects of the present disclosure.
Figure 19B:
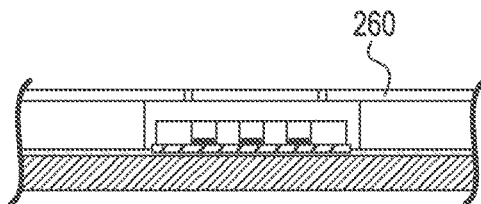
Figure 19C:
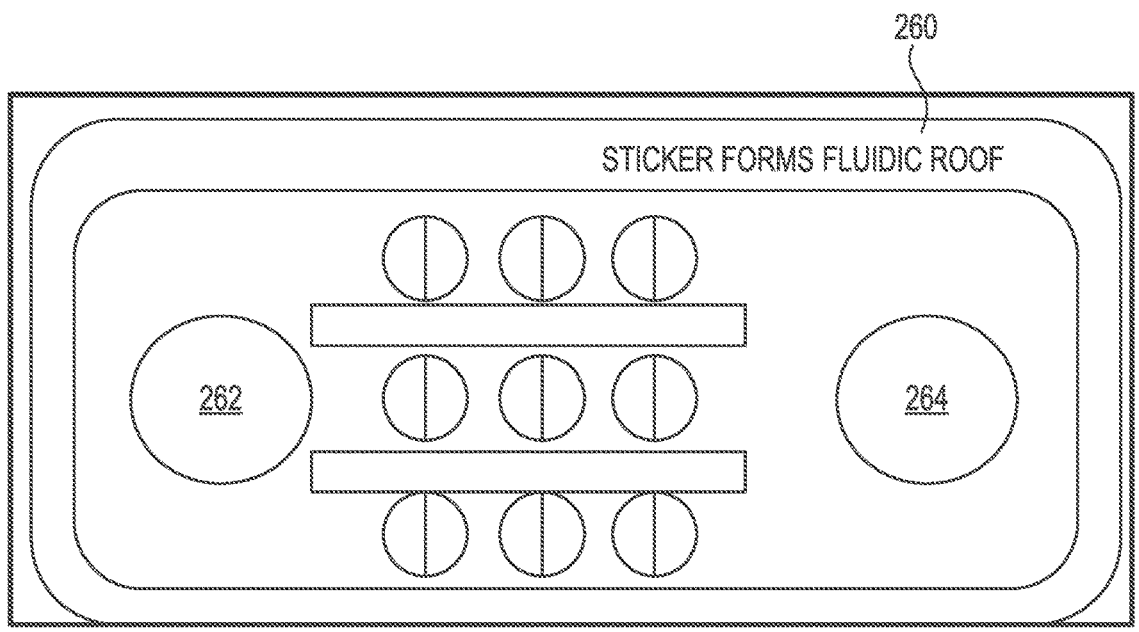

FIGS. 19A and 19B (cross section) show the structure after a fluidic channel cover 260 is attached to the fluidic wall structure 250. The structure in FIGS. 19A and 19C also shows the fluidic inlet 262 and the fluidic outlet 264. An example of a suitable fluidic chamber cover can be an adhesive tape or sticker. The cover may either be punched or laser machined for size and inlet and outlet ports. The cover may be attached in place with pressure, for example.

Figure 20:
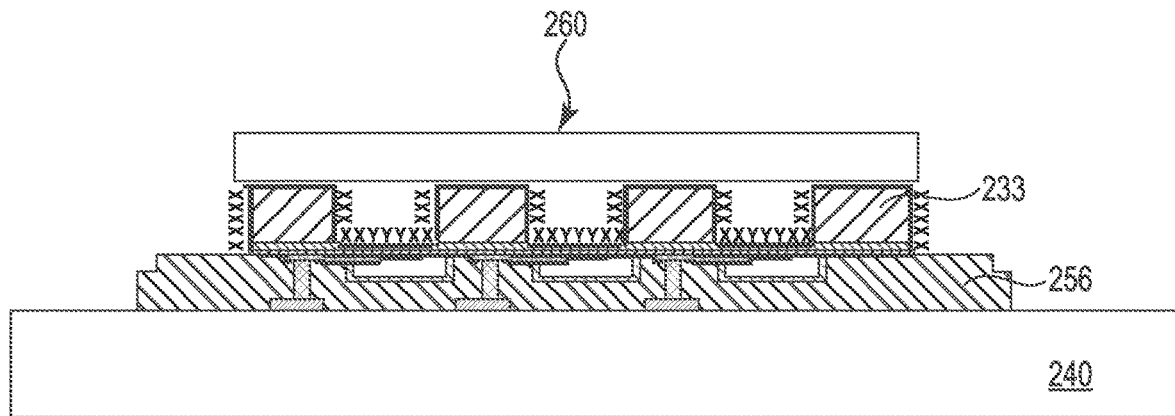
FIG. 20 is a schematic view illustrating an additional method of attaching a fluidic chamber cover onto the fluidic wall structure relative to the apparatus of FIG. 18 during a method of forming an example bulk acoustic wave structure in accordance with aspects of the present disclosure.

FIG. 20 illustrates an alternative method to FIGS. 16 through 19 of forming the fluidic channel. In FIG. 20, the fluidic chamber cover 260 has been attached to the flip chip mounted and underfilled adhesive 256 substrate (220)/sensor board (240) structure. In this embodiment, the fluidic chamber cover 260 can be attached directly to the top substrate surface 233. In this embodiment, the fluidic chamber cover 260 can be adhesive tape or a sticker. The fluidic chamber cover 260 can either be punched or laser machined for size and formation of inlet and outlet ports. The fluidic chamber cover 260 can be attached in place with pressure, for example.

In this figure, the resonators are observed in the etched trenches of the substrate, additionally the end regions of the die may be etched to make room for inlet and outlet fluidic ports. The etched silicon portions of the substrate provide channels for flowing fluidic adjacent to the resonators. To complete sensor testing, fluid can be flowed into the fluidic inlet in the cover, then the fluid flows across the resonators and out the fluidic outlet. The etched silicon portions of the substrate provide channels for flowing fluid adjacent to the resonators. Analytes of interest can bind to the functionalization chemistry and result in a change in amplitude-magnitude property of the bulk acoustic wafer device.

FIGS. 21 to 36 illustrate another illustrative method of fabricating a fluidic device including a bulk acoustic wave resonator and a reflective mirror as an acoustic wave management structure. One of skill in the art would understand that the fabrication processes described above (e.g., that demonstrated from FIGS. 2 through 10) can also be employed with this method to form a structure that includes an alternative reflective mirror including device.

Figure 21:
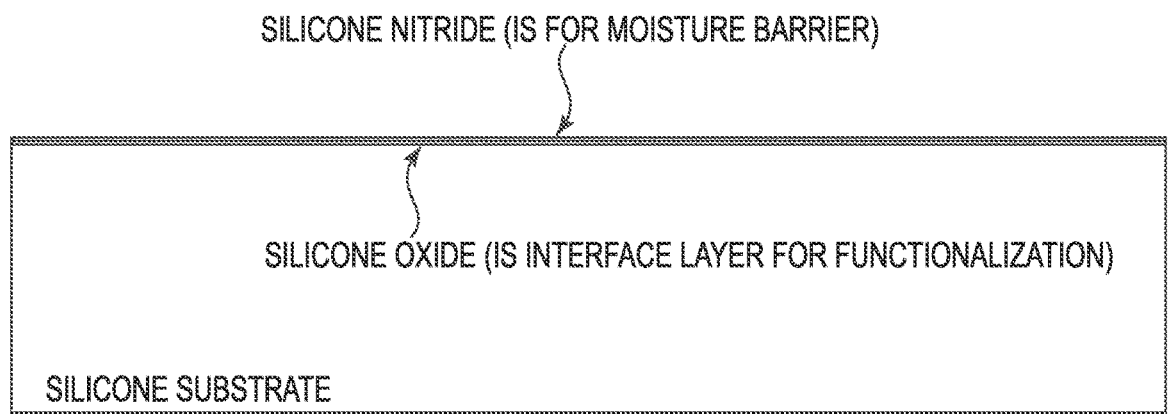
FIG. 21 is a schematic sectional view illustrating a silicon substrate with silicon oxide and silicon nitride films deposited during a method of forming an example bulk acoustic wave structure in accordance with aspects of the present disclosure.

FIG. 21 illustrates a substrate such as silicon with silicon oxide and silicon nitride being deposited on the surface. The silicon oxide will function both as a silicon etch stop and as the functionalization binding surface for the device. Additionally, a thicker silicon oxide layer can function as a temperature compensation layer for the device. The silicon nitride layer is a moisture barrier to protect the device.

Figure 22:
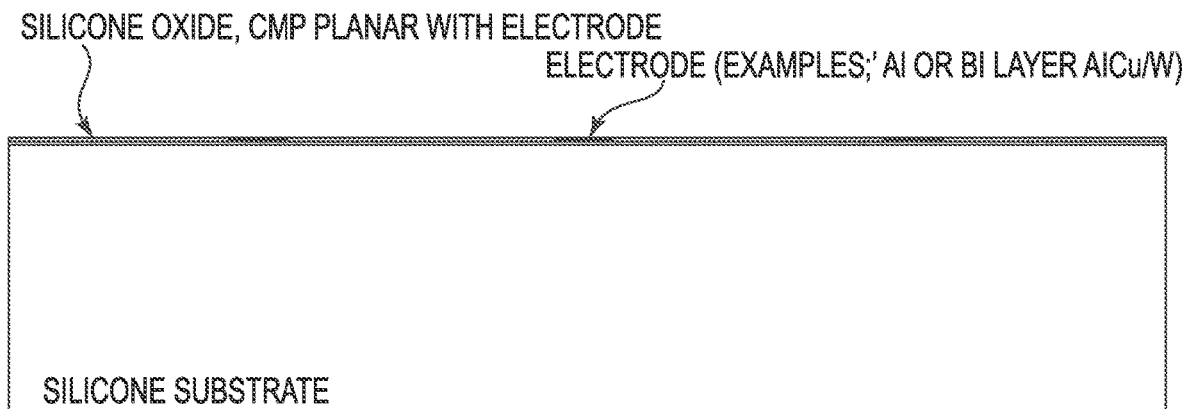
FIG. 22 is a schematic sectional view illustrating an electrode formed, silicon oxide deposited and surface planarized with CMP process relative to FIG. 21 during a method of forming an example bulk acoustic wave structure in accordance with aspects of the present disclosure.

FIG. 22 illustrates an addition of an electrode material and silicon oxide followed by a CMP process of the silicon oxide to make the surface planar. Suitable electrode materials can include; aluminum, Aluminum copper alloy, tungsten or a combination of these metals.

Figure 23:
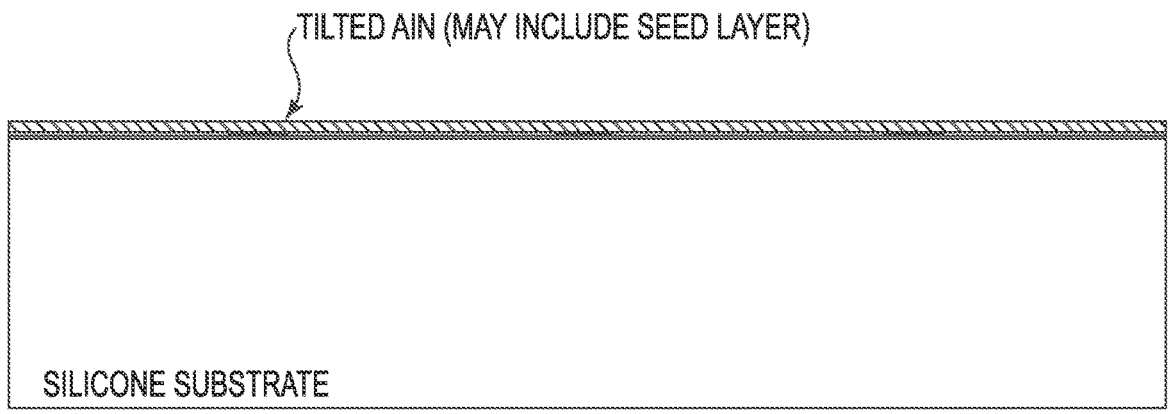
FIG. 23 is a schematic sectional view illustrating a tilted shear axis piezoelectric film deposited relative to FIG. 22 during a method of forming an example bulk acoustic wave structure in accordance with aspects of the present disclosure.

FIG. 23 illustrates deposition of a piezoelectric film, for example tilted shear axis piezoelectric film. A suitable material can include aluminum nitride. The shear axis film may include a seed layer to promote tilting of the bulk shear film.

Figure 24:
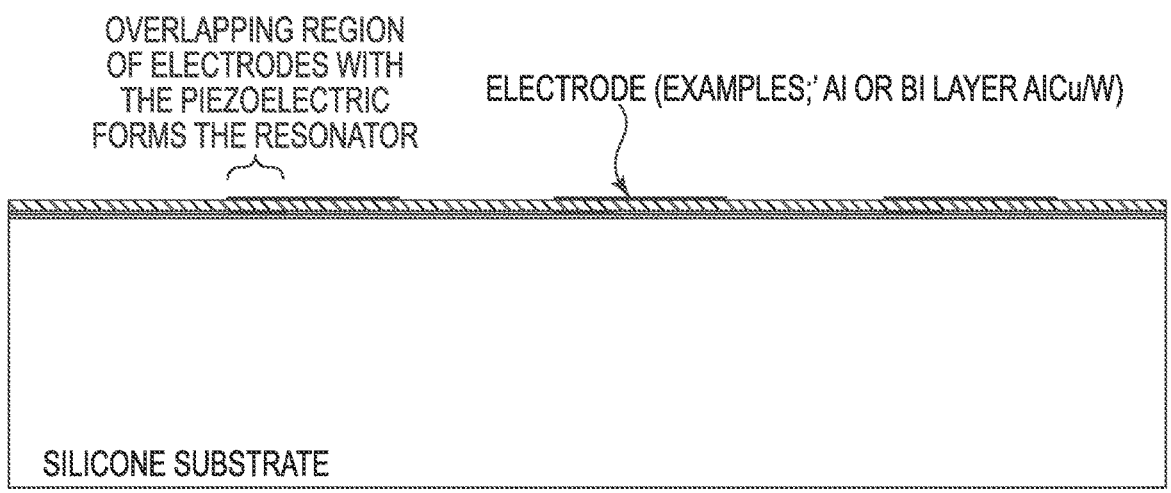
FIG. 24 is a schematic sectional view illustrating deposition and patterning of the second electrode over the piezoelectric layer relative to FIG. 23 during a method of forming an example bulk acoustic wave structure in accordance with aspects of the present disclosure.

FIG. 24 illustrates the deposition and patterning of the electrode over the piezoelectric. Suitable electrode materials include; aluminum, Aluminum copper alloy, tungsten or a combination of these metals. Where the two electrodes overlap with the piezoelectric material forms resonators.

Figure 25:
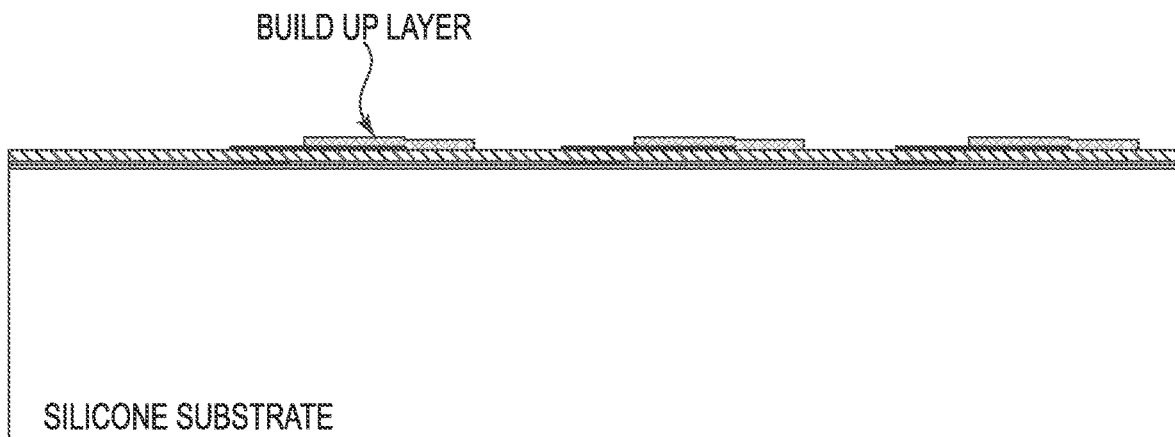
FIG. 25 is a schematic sectional view illustrating deposition and patterning of the buildup layers relative to FIG. 24 during a method of forming an example bulk acoustic wave structure in accordance with aspects of the present disclosure.

FIG. 25 illustrates the deposition and patterning of a buildup layer. The purpose of the buildup layer is to reduce parasitic loss on the length of the leads. Suitable buildup materials include; aluminum, Aluminum copper alloy, tungsten or a combination of these metals.

Figure 26:
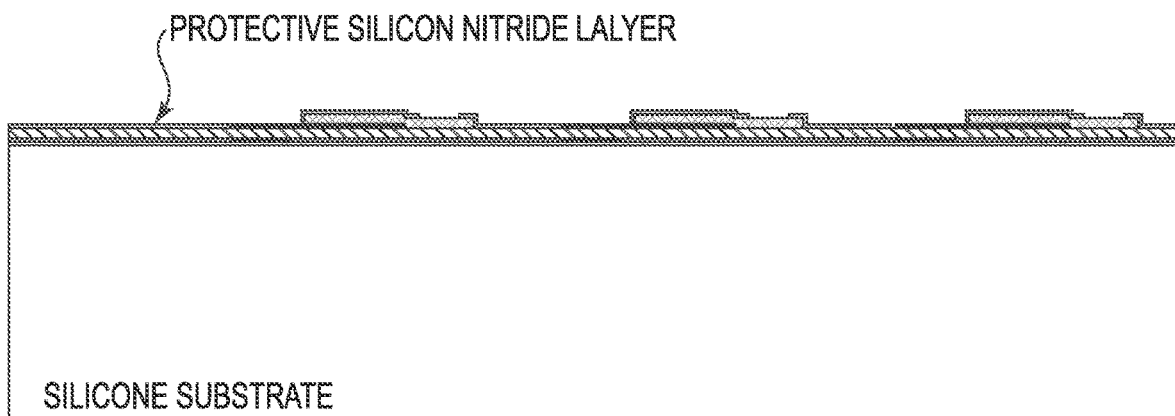
FIG. 26 is a schematic sectional view illustrating deposit and pattern protective layer relative to FIG. 25 during a method of forming an example bulk acoustic wave structure in accordance with aspects of the present disclosure.
Figure 27:
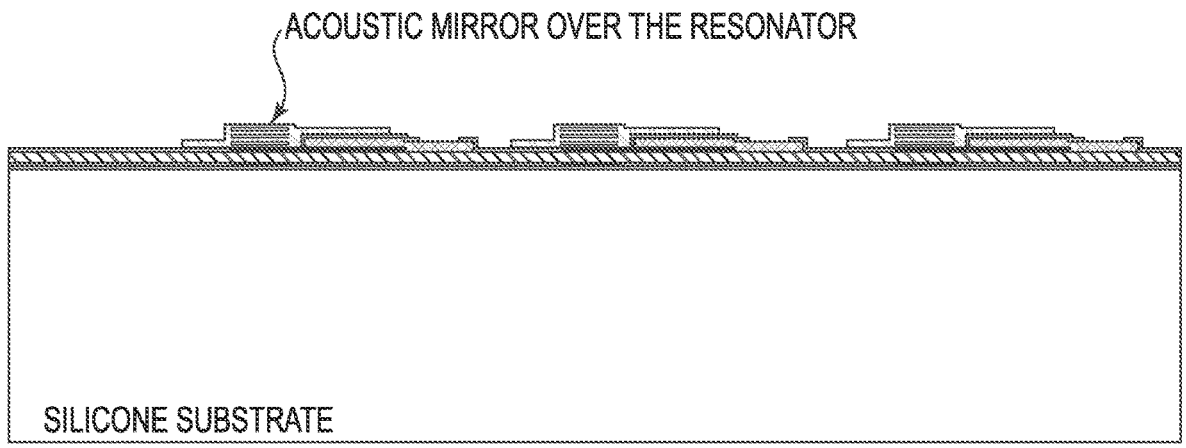
FIG. 27 is a schematic sectional view illustrating fabrication of an acoustic reflector over the resonator relative to FIG. 26 during a method of forming an example bulk acoustic wave structure in accordance with aspects of the present disclosure.

FIG. 26 illustrates the deposition and patterning of a protective layer. An example of a suitable protective layer is silicon nitride. The protective layer is not deposited in the active region or where the copper pillars will be formed FIG. 27 illustrates the deposition and patterning of an acoustic reflector in the zone of the resonator. The purpose of the acoustic reflector is to return the acoustic energy back to the resonator to increase the performance of the device. The acoustic reflector can be fabricated with alternating layers of silicon oxide and patterned tungsten or alternating layers of silicon oxide and aluminum nitride.

Figure 28:
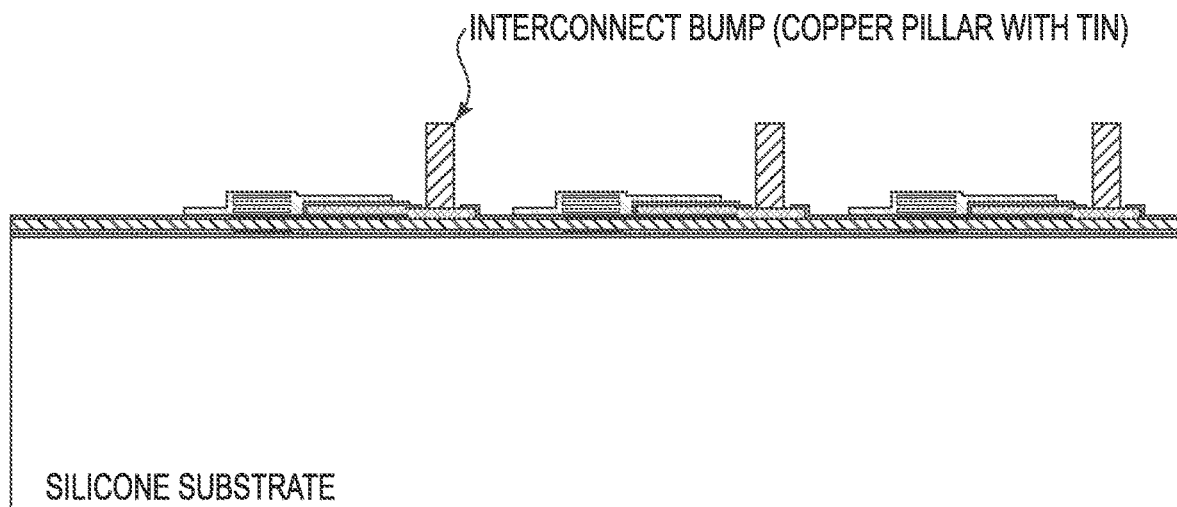
FIG. 28 is a schematic sectional view illustrating fabrication of bumps for electrical connection to the board relative to FIG. 27 during a method of forming an example bulk acoustic wave structure in accordance with aspects of the present disclosure.
Figure 29:
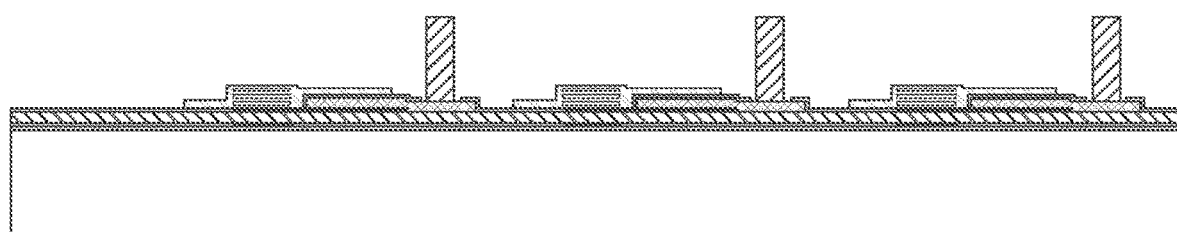
FIG. 29 is a schematic sectional view illustrating back grinding of a portion of the substrate to reduce the substrate thickness relative to FIG. 28 during a method of forming an example bulk acoustic wave structure in accordance with aspects of the present disclosure.

FIG. 28 illustrates the fabrication electrical interconnect bumps. A suitable material includes copper pillars with tin. Fabrication of plated copper pins with tin include using photoresist to pattern regions, depositing a plating seed layer such as titanium and copper, plating the interconnect bumps and then removal of the plating seed layer and the photoresist FIG. 29 illustrates the device after the substrate has been through back grind. The purpose of the back grind is to realize a desired substrate thickness. For the case of the independent wall fluidics, the substrate thickness will define the height of the fluidic channel adjacent to the resonator sensor. For the case of the etched die substrate fluidics, the substrate thickness will define the channel height of fluidic channel. Subsequent figures will make this evident.

Figure 30:
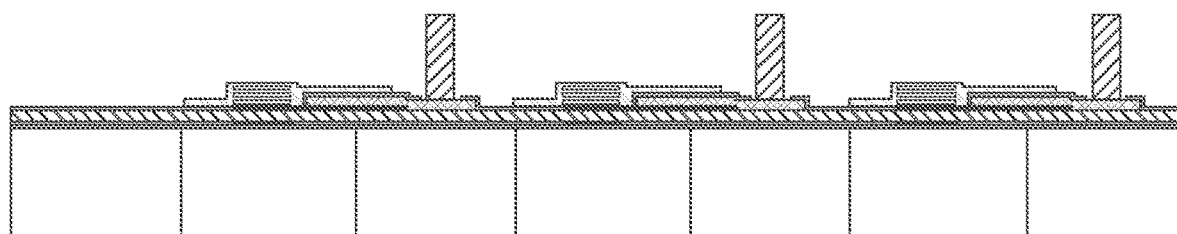
FIG. 30 is a schematic sectional view illustrating dry etching a portion of the substrate to form fluidic paths in the zone of the resonators relative to FIG. 29 during a method of forming an example bulk acoustic wave structure in accordance with aspects of the present disclosure.

FIG. 30 illustrates the device after the substrate has been dry silicon etched in the zone of the resonator. One method to complete this process is to coat the backside of the wafer with photo resist; typically for dry etch this is a thick resist on the order of 5 to 10 microns thick. Employ a backside alignment tool that aligns to front side alignment marks to expose the photo resist. Develop the photoresist. Etch a straight sidewall by alternating a deep reactive-ion etch (DRIE) the silicon with $SF_6$ and an $C_4F_8$ passivation layer. An alternative masking process to the photo resist is to deposit aluminum on the backside and open a pattern with laser machining.

Figure 31:
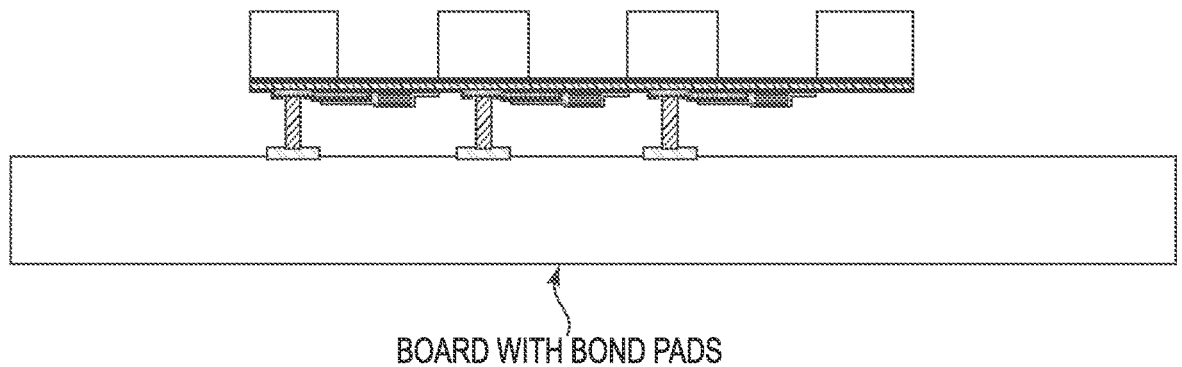
FIG. 31 is a schematic sectional view illustrating a BAW biosensor die flip chip mounted to a printed circuit board relative to FIG. 30 during a method of forming an example bulk acoustic wave structure in accordance with aspects of the present disclosure.

FIG. 31 illustrates the device after flip chip mounting to the board. One interconnect embodiment is copper pillars with tin on the die is soldered onto copper pads with organic solderability preservative (OSP). Another alternative is solder balls on the die soldered onto a gold bond pad.

FIGS. 32 to 36 illustrate an example with a fluidic channel defined with independent walls. FIG. 32A illustrates attachment of fluidic walls to the board. The fluidic wall structure can be formed from injection molding of plastic, machining of metal or glass. In high volume production, an adhesive is dispensed with a robot in the location where the fluidic wall structure is located. In high volume production, the wall structures are received either in tape and reel format or in trays. A robot places the wall structure onto the adhesive.

Figure 32A:
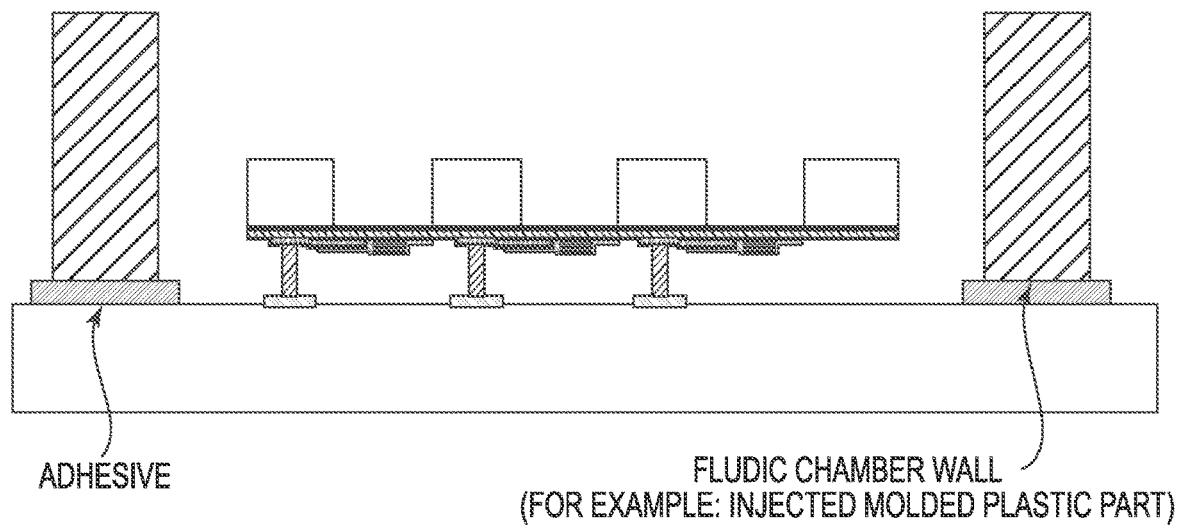
FIGS. 32A and 32B are schematic sectional and perspective views illustrating attachment of independent fluidic wall structures relative to FIG. 31 during a method of forming an example bulk acoustic wave structure in accordance with aspects of the present disclosure.
Figure 32B:
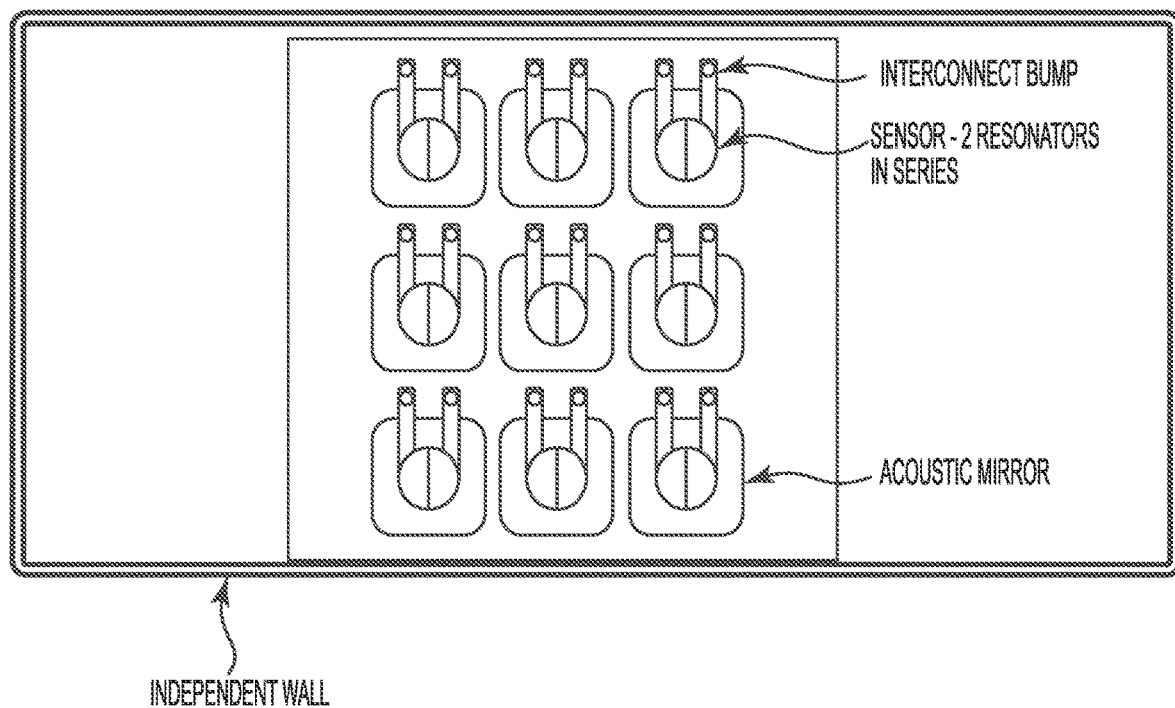

The adhesive is cured in an oven. The fluidic wall structure is designed to realize the desired fluidic channel height from the resonator to the top of the wall. There are no fluidics on the side of the die with the interconnect bumps. The fluidic wall structure is not show to size scale, in practice the width of the wall would be wide to allow for bonding of the fluidic cover. FIG. 32B illustrates a plan view of both the die side that is opposite of the interconnect bumps and the intendent wall structure. In this figure, the resonators are observed in the etched portions of the substrate. The cover tape is not shown, but a representation of the inlet and outlet openings in the cover are shown. To complete a sensor test, fluidic is flown into the fluidic inlet across the die with resonators and out of the fluidic outlet. The etched silicon portions of the substrate provide channels for flowing fluidic adjacent to the resonators.

Figure 33:
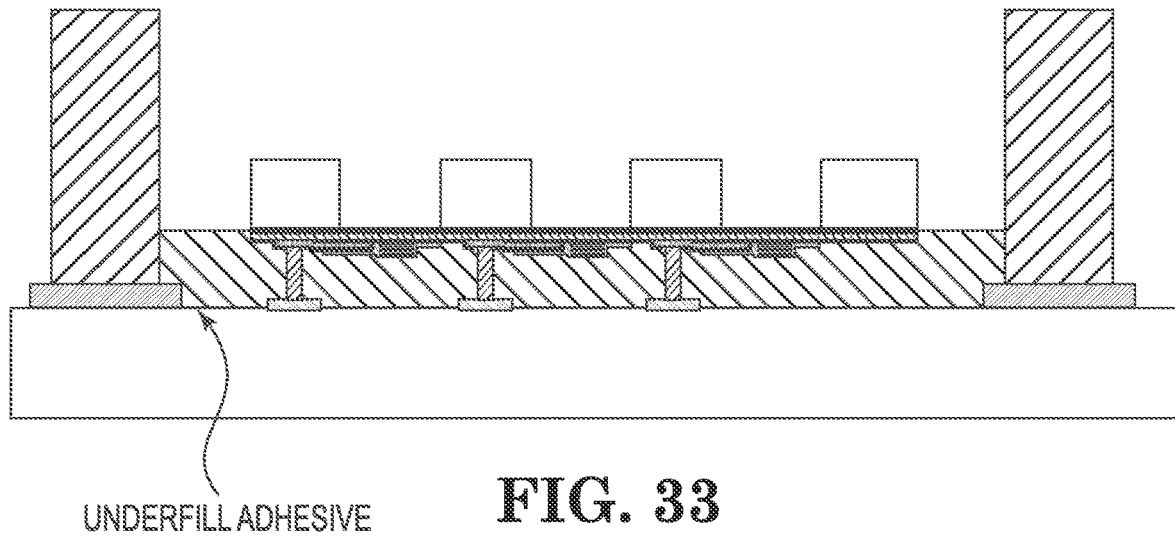
FIG. 33 is a schematic sectional view illustrating the device after underfill is wicked under the flip chip mounted die relative to FIGS. 32A and 32B during a method of forming an example bulk acoustic wave structure in accordance with aspects of the present disclosure.

FIG. 33 illustrates adhesive underfill under the flip chip mounted die. Adhesive from a dispense tip is placed near the side of the die. Capillary force wicks the adhesive under the mounted die. A back step is performed to cure the adhesive. The purpose of the underfill adhesive is to protect the bumped region of the die from chemical attack from the fluidic used when the sensor is used.

Figure 34:
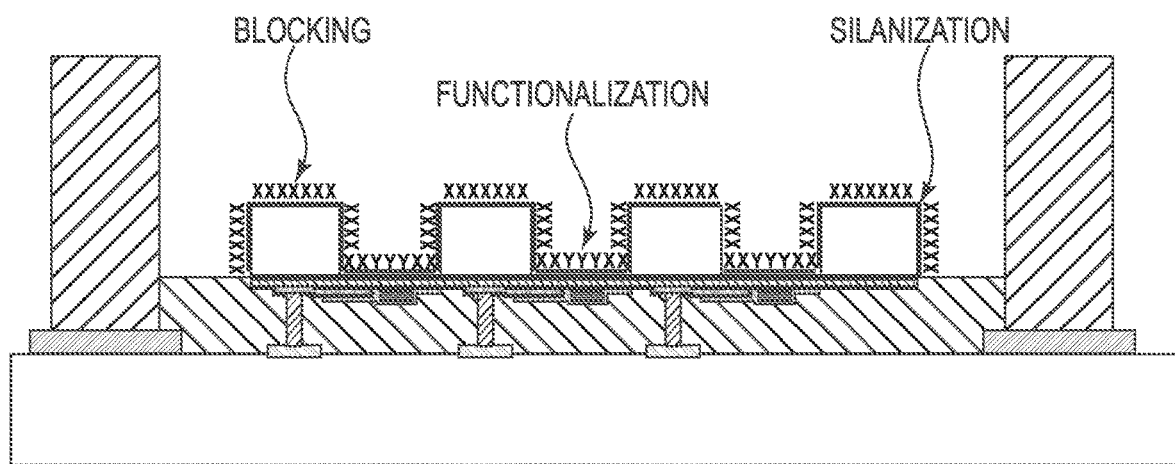
FIG. 34 is a schematic sectional view illustrating silanization, printing of functionalization and spotting completed relative to FIG. 33 during a method of forming an example bulk acoustic wave structure in accordance with aspects of the present disclosure.

FIG. 34 illustrates the functionalization chemistry on the BioSensor. First a silanization step is completed to coat a monolayer of adhesion promoter on the surface, then functionalization is printed onto the resonators and then the surface is blocked to prevent non-specific binding. The functionalization is a bioreceptor that is designed to bind the analyte of interest. The functionalization may be a protein for example.

Figure 35:
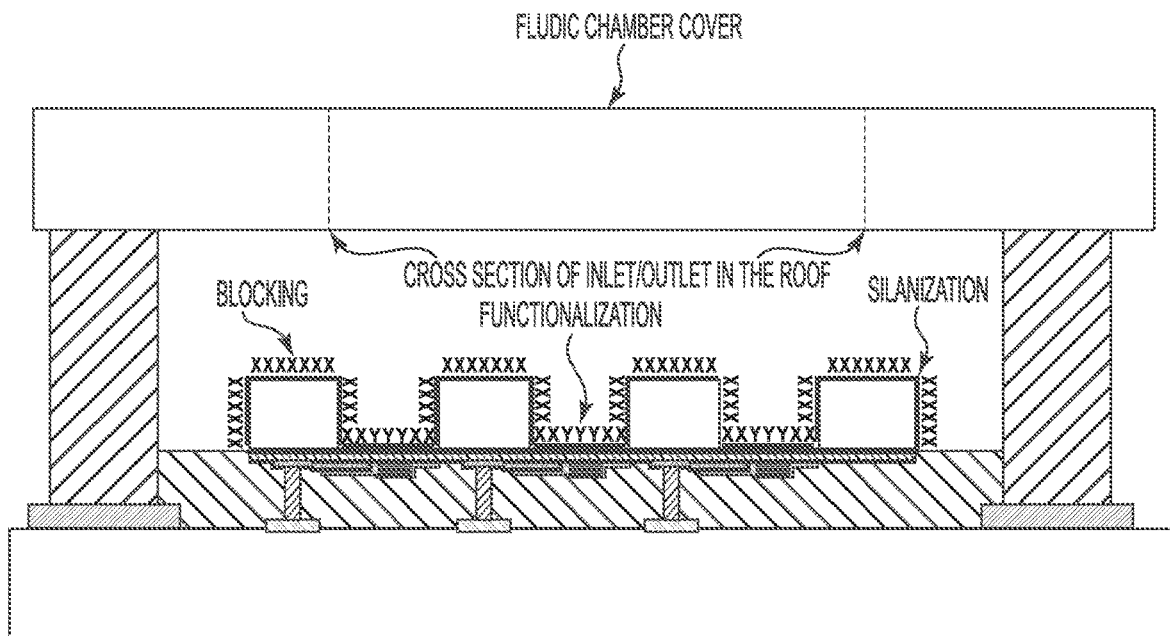
FIG. 35 is a schematic sectional view illustrating a fluidic chamber cover attached onto the fluidic wall structure relative to FIG. 34 during a method of forming an example bulk acoustic wave structure in accordance with aspects of the present disclosure.

FIG. 35 illustrates the device after the fluidic chamber cover has been attached. An example of a suitable fluidic chamber cover is an adhesive tape or sticker. The cover is either punched or laser machined for size and inlet and outlet ports. The cover is attached in place with pressure. FIG. 35 illustrates the device after the fluidic chamber cover has been attached of the BAW die. An example of a suitable fluidic chamber cover is an adhesive tape or sticker. The cover is either punched or laser machined for size and inlet and outlet ports. The cover is attached in place with pressure.

Figure 36:
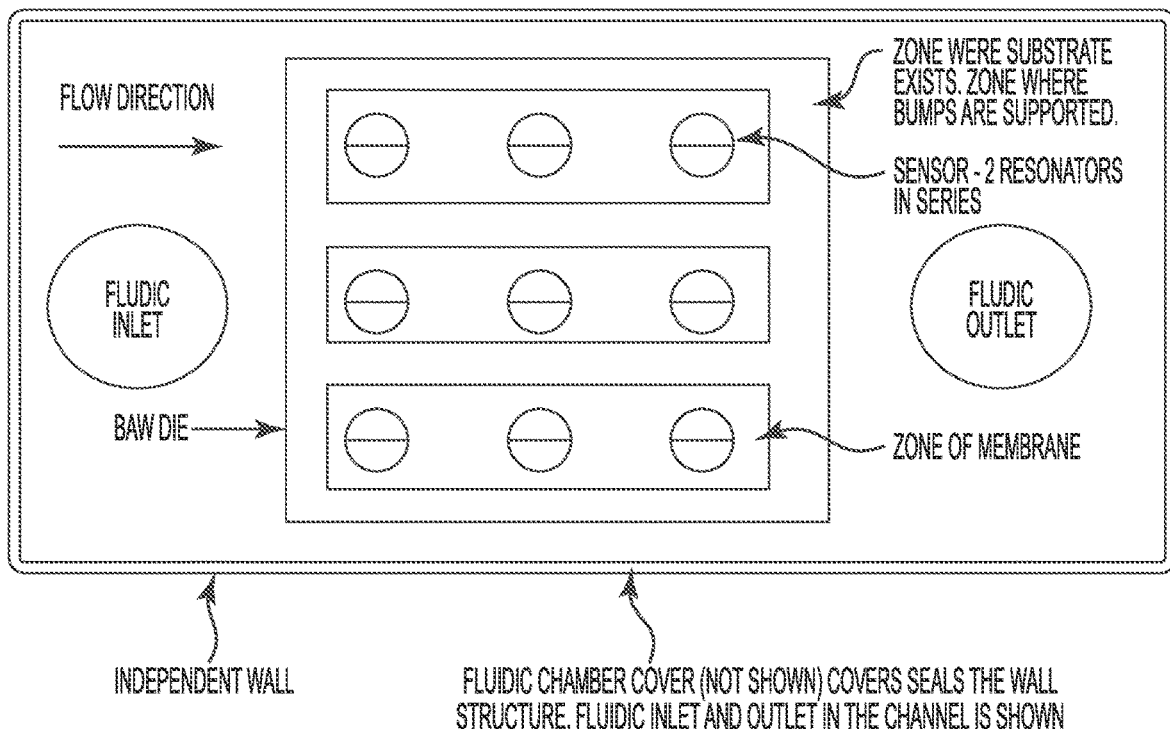
FIG. 36 is a schematic plan view of the exposed resonator side of the BAW sensor die and the independent wall during a method of forming an example bulk acoustic wave structure in accordance with aspects of the present disclosure.

FIG. 36 illustrates a plan view of both the die side that is opposite of the interconnect bumps. In this figure, the resonators are observed in the etched portions of the substrate, additionally the end regions of the die are etched to make room for inlet and outlet fluidic ports. The etched silicon portions of the substrate provide channels for flowing fluidic adjacent to the resonators. To complete sensor testing, fluid flows into the fluidic inlet in the cover, then the fluid flows across the resonators and out the fluidic outlet. The etched silicon portions of the substrate provide channels for flowing fluidic adjacent to the resonators. Analyte of interest binds to the functionalization chemistry and a result in a change in amplitude-magnitude property of the bulk acoustic wafer device.

Figure 37:
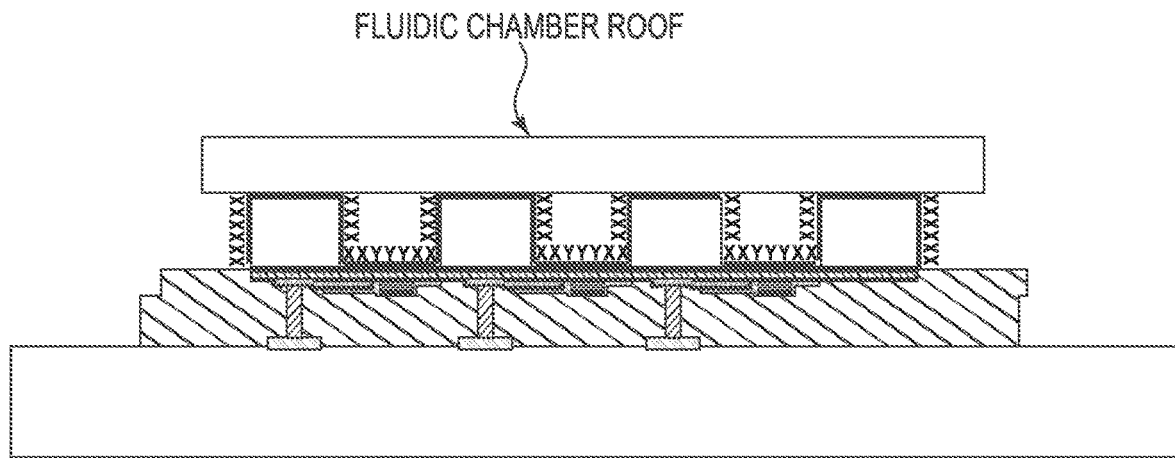
FIG. 37 is a schematic sectional view illustrating an alternative method of attaching a cover onto the BAW die of FIG. 31 during a method of forming an example bulk acoustic wave structure in accordance with aspects of the present disclosure.

FIGS. 32 to 36 illustrate an example with a fluidic channel defined with independent walls, FIG. 37 is an alternative to those process steps. In FIG. 37, the fluidic chamber cover 260 has been attached to the flip chip mounted and underfilled adhesive 256 substrate (220)/sensor board (240) structure. In this embodiment, the fluidic chamber cover 260 can be attached directly to the top substrate surface 233. In this embodiment, the fluidic chamber cover 260 can be adhesive tape or a sticker. The fluidic chamber cover 260 can either be punched or laser machined for size and formation of inlet and outlet ports. The fluidic chamber cover 260 can be attached in place with pressure, for example.

In this figure, the resonators are observed in the etched trenches of the substrate, additionally the end regions of the die may be etched to make room for inlet and outlet fluidic ports. The etched silicon portions of the substrate provide channels for flowing fluidic adjacent to the resonators. To complete sensor testing, fluid can be flowed into the fluidic inlet in the cover, then the fluid flows across the resonators and out the fluidic outlet. The etched silicon portions of the substrate provide channels for flowing fluid adjacent to the resonators. Analytes of interest can bind to the functionalization chemistry and result in a change in amplitude-magnitude property of the bulk acoustic wafer device.

Figure 38:
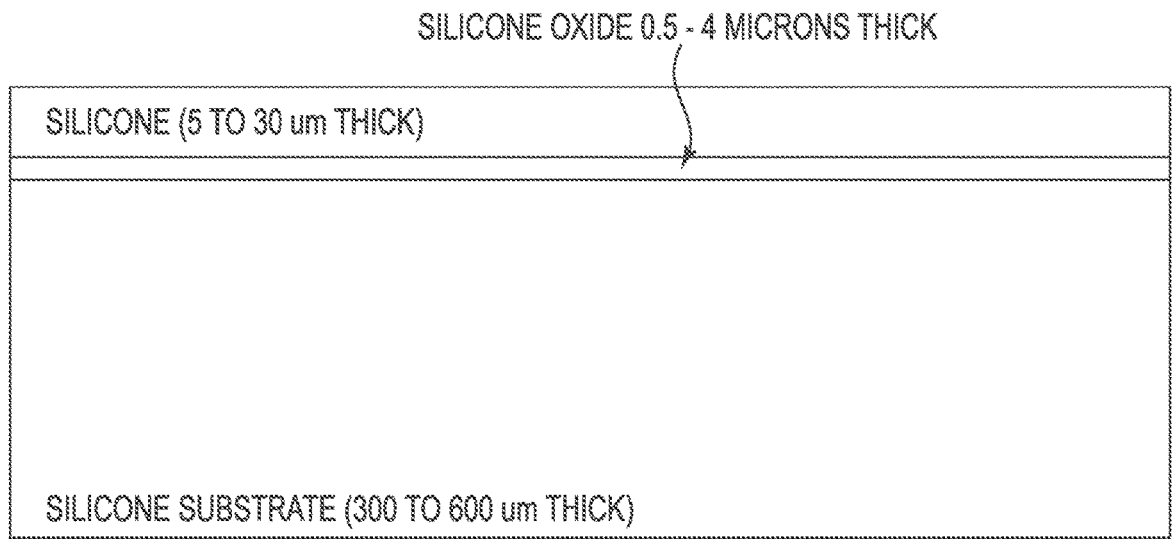
FIG. 38 is a schematic sectional view illustrating silicon on insulator (SOI) wafer that can be utilized in a method of forming an example bulk acoustic wave structure in accordance with aspects of the present disclosure.

FIGS. 38 to 54 illustrate another example method of fabricating a fluidic device including a bulk acoustic wave resonator. FIG. 38 illustrates a silicon on insulator (SOI) wafer substrate One of skill in the art would understand that any portion of the fabrication processes described above can also be employed with this method.

Figure 39:
FIG. 39 is a schematic sectional view illustrating a pattern hard mask and wet etch of the top silicon relative to FIG. 38 during a method of forming an example bulk acoustic wave structure in accordance with aspects of the present disclosure.
Figure 40:
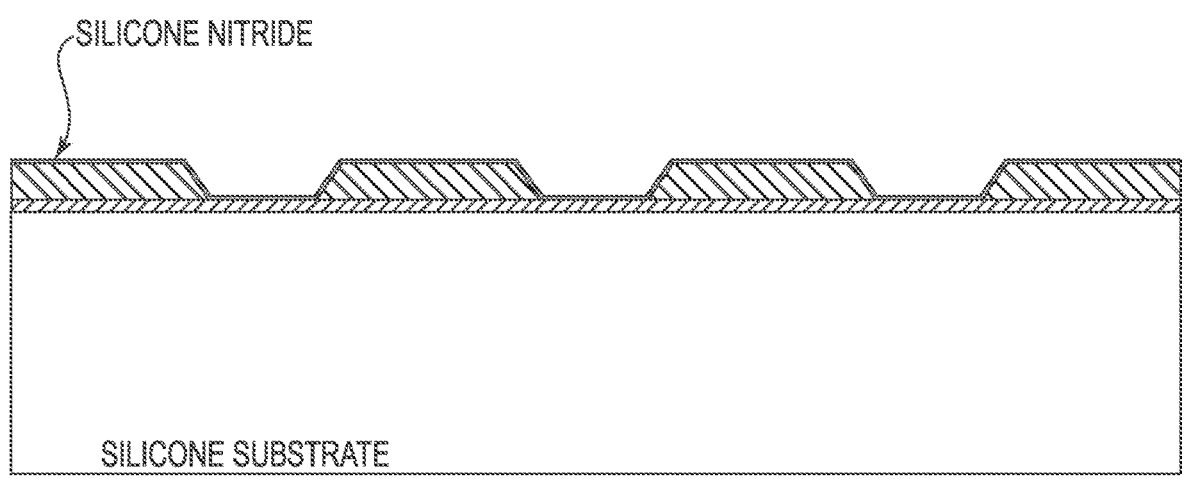
FIG. 40 is a schematic sectional view illustrating a deposited silicon nitride film relative to FIG. 39 during a method of forming an example bulk acoustic wave structure in accordance with aspects of the present disclosure.
Figure 41:
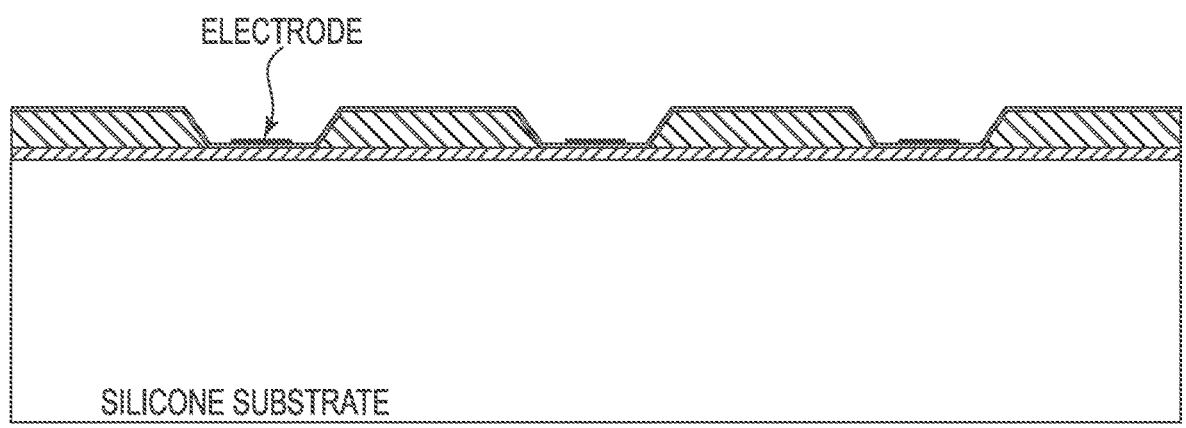
FIG. 41 is a schematic sectional view illustrating an electrode formed, silicon oxide deposited and surface planarized with CMP process relative to FIG. 40 during a method of forming an example bulk acoustic wave structure in accordance with aspects of the present disclosure.
Figure 42:
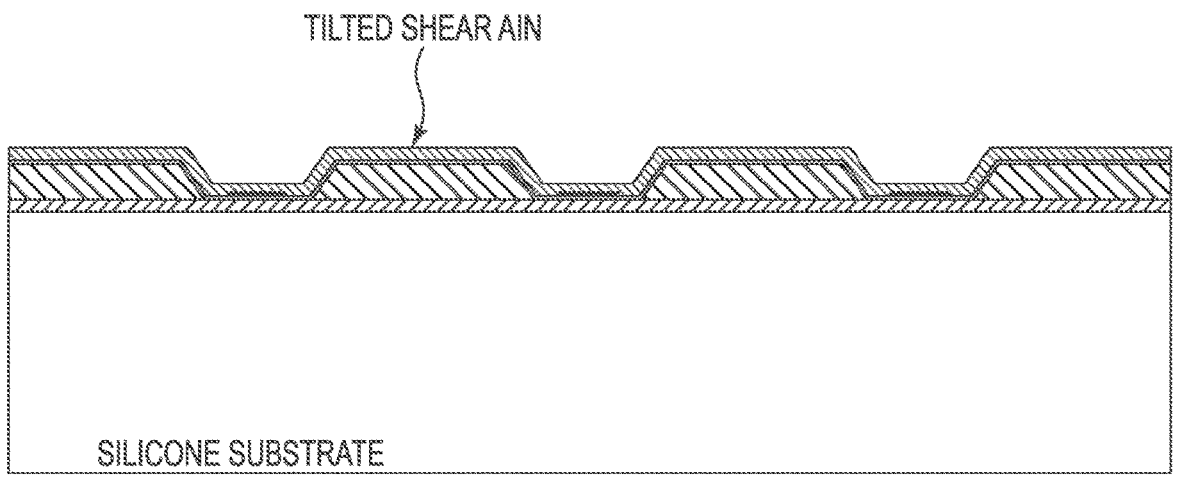
FIG. 42 is a schematic sectional view illustrating a tilted shear axis piezoelectric film deposited relative to FIG. 41 during a method of forming an example bulk acoustic wave structure in accordance with aspects of the present disclosure.
Figure 43:
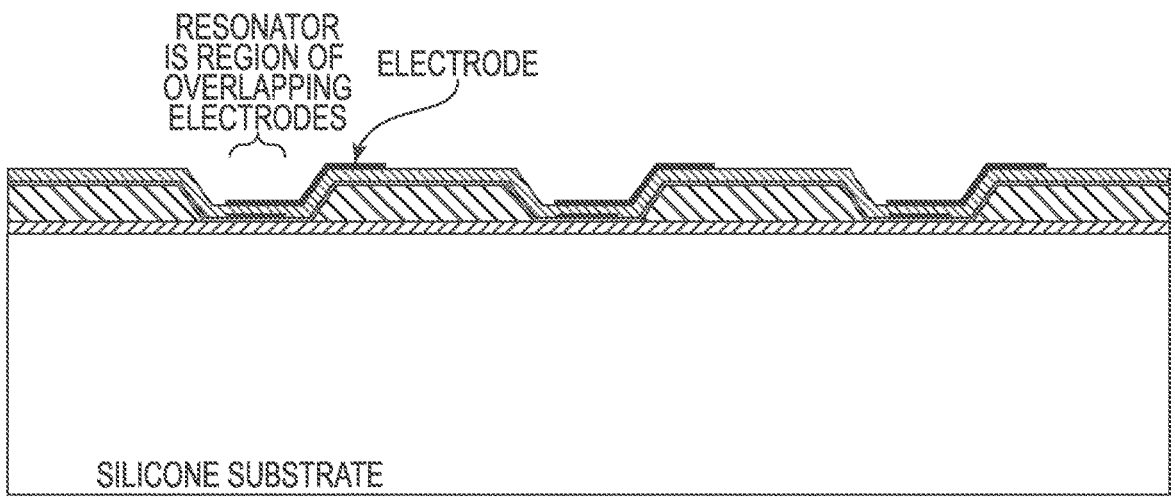
FIG. 43 is a schematic sectional view illustrating deposition and patterning of the electrode over the piezoelectric layer relative to FIG. 42 during a method of forming an example bulk acoustic wave structure in accordance with aspects of the present disclosure.
Figure 44:
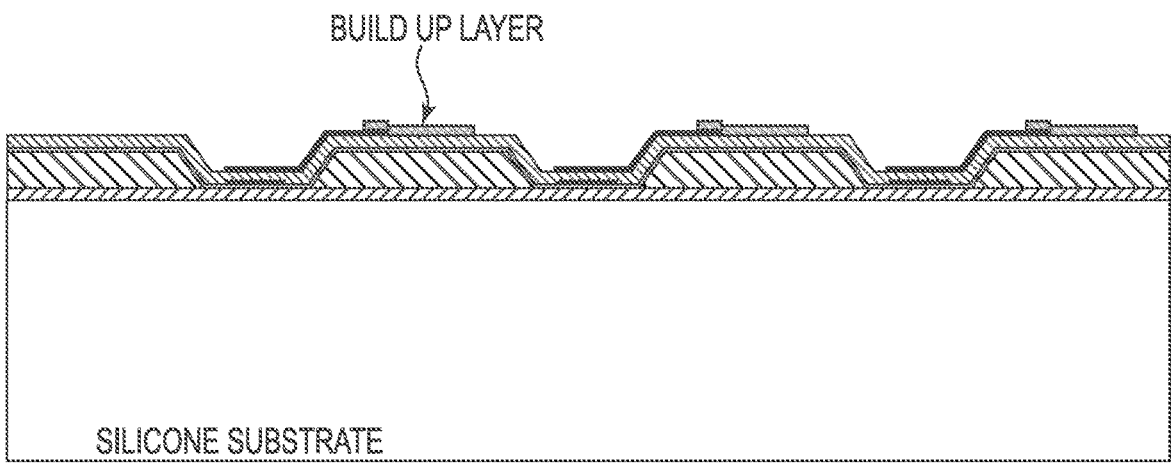
FIG. 44 is a schematic sectional view illustrating deposition and patterning of the buildup layers relative to FIG. 43 during a method of forming an example bulk acoustic wave structure in accordance with aspects of the present disclosure.
Figure 45:
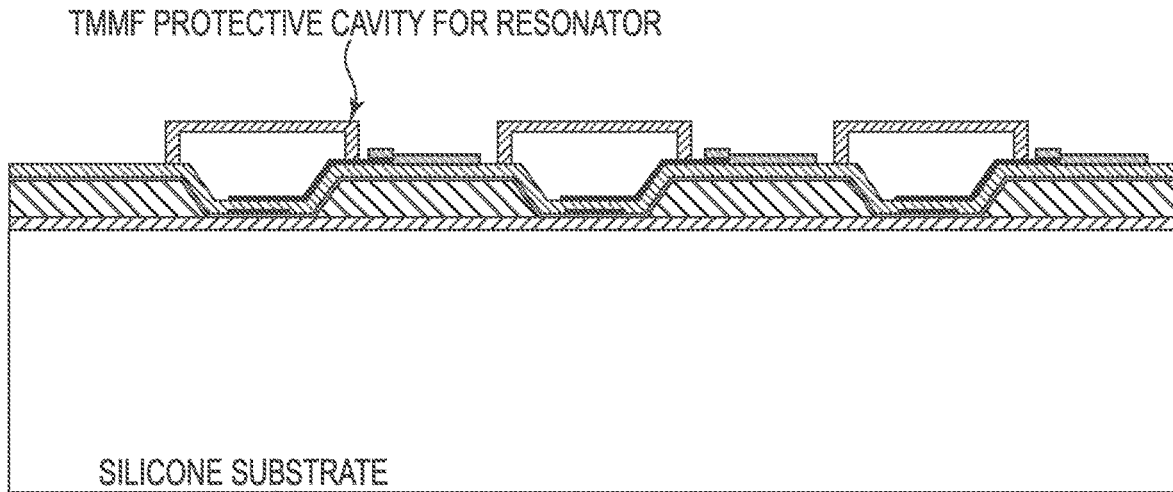
FIG. 45 is a schematic sectional view illustrating fabrication of an air cavity, an example of an acoustic energy management structure, over the resonator relative to FIG. 44 during a method of forming an example bulk acoustic wave structure in accordance with aspects of the present disclosure.
Figure 46:
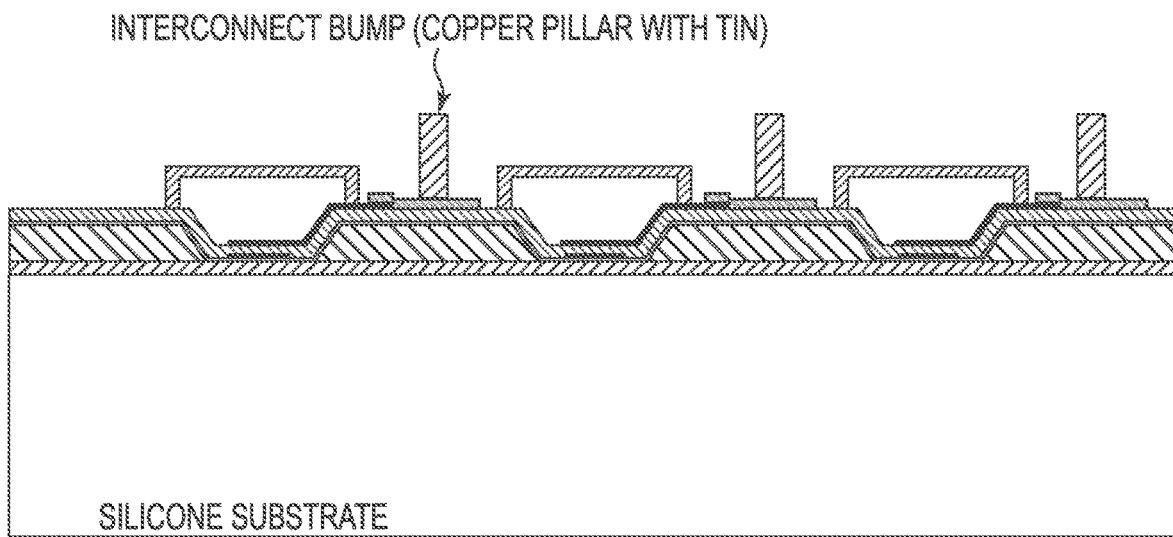
FIG. 46 is a schematic sectional view illustrating fabrication of bumps for electrical connection to the board relative to FIG. 45 during a method of forming an example bulk acoustic wave structure in accordance with aspects of the present disclosure.
Figure 47:
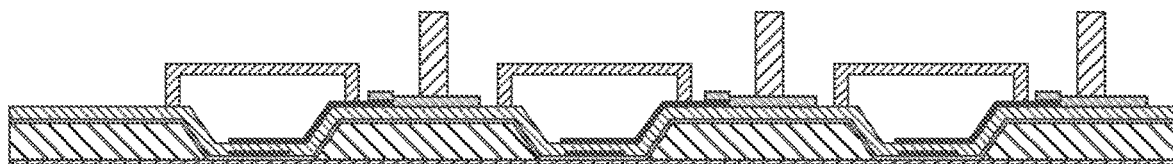
FIG. 47 is a schematic sectional view illustrating back grinding of the substrate to reduce the substrate thickness relative to FIG. 46 during a method of forming an example bulk acoustic wave structure in accordance with aspects of the present disclosure.

FIG. 39 illustrates patterning of a hardmask such as silicon dioxide or silicon nitride and anisotropically wet etching the top silicon. The wet etch can be done with TMAH or KOH. FIG. 40 illustrates removal of the wet etch silicon oxide hard mask and deposition of a silicon nitride layer. The silicon nitride layer is a moisture barrier to protect the device. FIG. 41 illustrates addition of an electrode. Suitable electrode materials include; aluminum, Aluminum copper alloy, tungsten or a combination of these metals. FIG. 42 illustrates deposition of a tilted shear axis piezoelectric film. A suitable material is aluminum nitride. The shear axis film may include a seed layer to promote tilting of the bulk shear film. FIG. 43 illustrates the deposition and patterning of the electrode over the piezoelectric. Suitable electrode materials include; aluminum, Aluminum copper alloy, tungsten or a combination of these metals. Where the two electrodes overlap with the piezoelectric material forms resonators. FIG. 44 illustrates the deposition and patterning of a buildup layer. The purpose of the buildup layer is to reduce parasitic loss on the length of the leads. Suitable buildup materials include; aluminum, Aluminum copper alloy, tungsten or a combination of these metals. FIG. 45 illustrates fabrication of a protective cavity for the resonator. The purpose of the protective cavity is to prevent material from touching and damping the resonator. A suitable material for fabrication of the cavity includes photo imageable TMMF. This can be done in two layers; a wall layer and roof layer. FIG. 46 illustrates fabrication electrical interconnect bumps. A suitable material includes copper pillars with tin. Fabrication of plated copper pins with tin include using photoresist to pattern regions, depositing a plating seed layer such as titanium and copper, plating the interconnect bumps and then removal of the plating seed layer and the photoresist. FIG. 47 illustrates the device after the substrate has been removed. The thinning or removal process can be completed by etching silicon with a dry etch ($SF_6$) or wet etch (TMAH). Another option is that the wafer can be background to remove the substrate.

Figure 48:
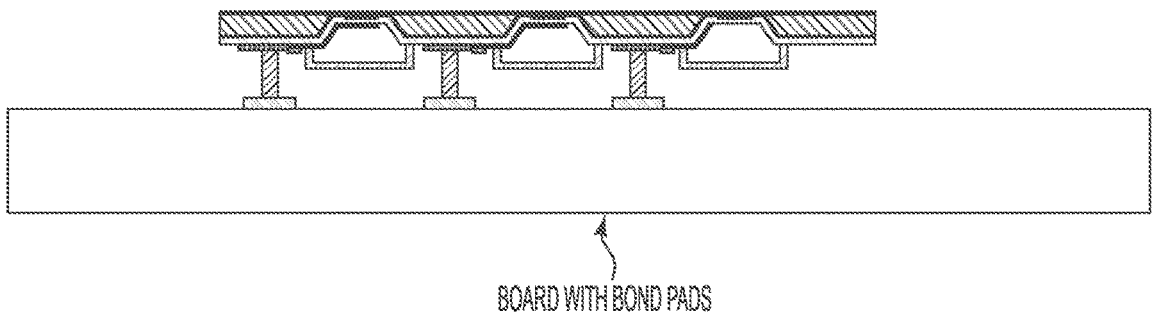
FIG. 48 is a schematic sectional view illustrating BAW biosensor die flip chip mounted to the board relative to FIG. 47 during a method of forming an example bulk acoustic wave structure in accordance with aspects of the present disclosure.

FIG. 48 illustrates the device after flip chip mounting to the board. One interconnect embodiment is copper pillars with tin on the die is soldered onto copper pads with organic solderability preservative (OSP). Another alternative is solder balls on the die soldered onto a gold bond pads.

Figure 49A:
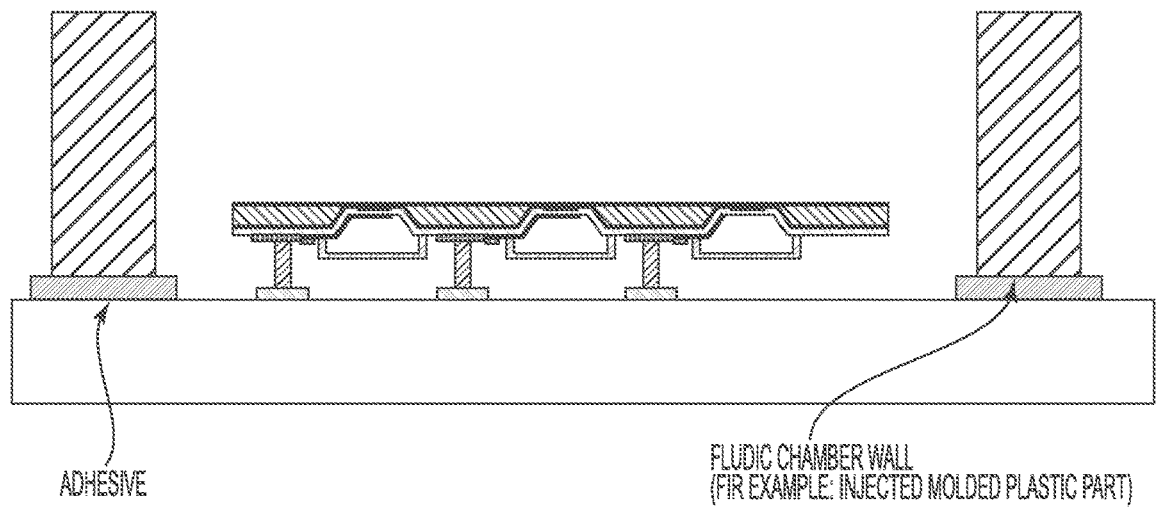
FIGS. 49A and 49B are schematic sectional and schematic plan views illustrating attachment of independent fluidic wall structure relative to FIG. 48.
Figure 49B:
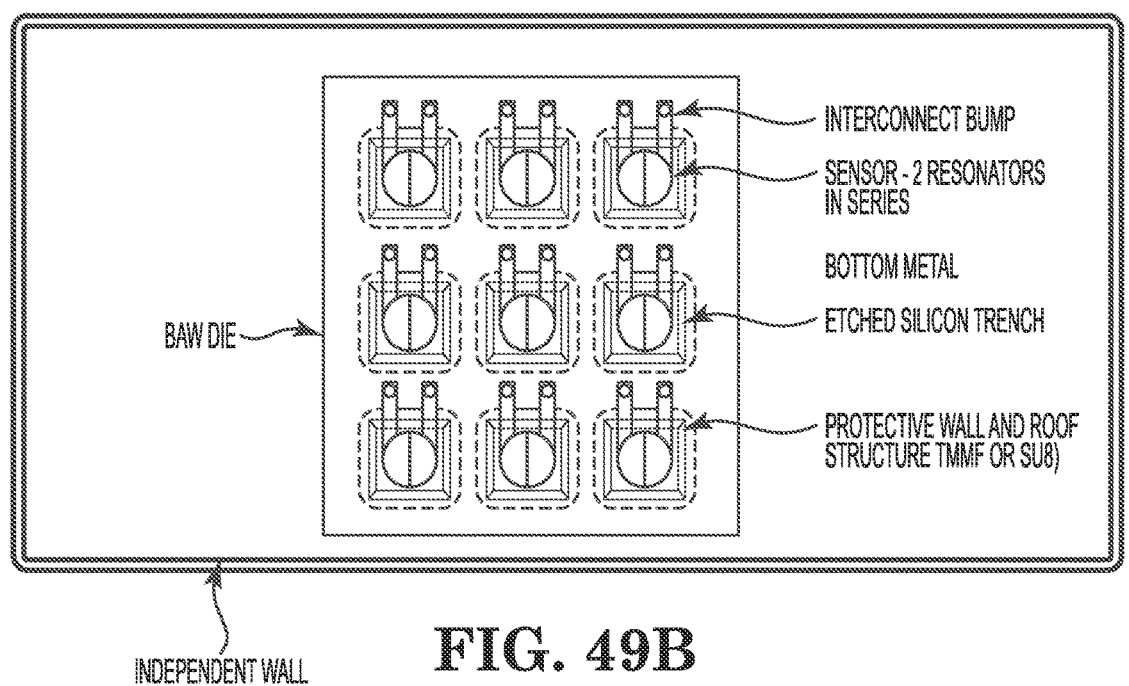

FIG. 49A illustrates attachment of fluidic walls to the board. The fluidic wall structure can be formed from injection molding of plastic, machining of metal or glass. In high volume production, an adhesive is dispensed with a robot in the location where the fluidic wall structure is located. In high volume production, the wall structures are received either in tape and reel format or in trays. A robot places the wall structure onto the adhesive. The adhesive is cured in an oven. The fluidic wall structure is designed to realize the desired fluidic channel height from the resonator to the top of the wall. FIG. 49B illustrates a plan view of the side of the BAW sensor die that is flip chip mounted to the board and a representation of the independent wall structure. There are no fluidics on the side of the die with the interconnect bumps. The fluidic wall structure is not show to size scale, in practice the width of the wall would be wide to allow for bonding of the fluidic cover.

Figure 50:
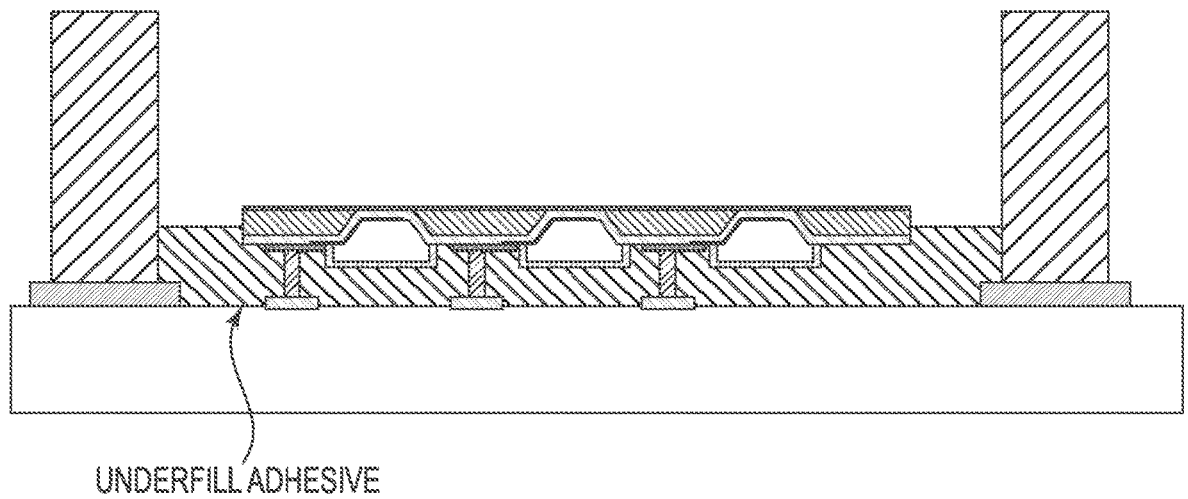
FIG. 50 is a schematic sectional view illustrating underfill wicked under the flip chip mounted die relative to FIG. 49 during a method of forming an example bulk acoustic wave structure in accordance with aspects of the present disclosure.

FIG. 50 illustrates adhesive underfill under the flip chip mounted die. Adhesive from a dispense tip is placed near the side of the die. Capillary force wicks the adhesive under the mounted die. A back step is performed to cure the adhesive. The purpose of the underfill adhesive is to protect the bumped region of the die from chemical attack from the fluidic used when the sensor is used.

Figure 51:
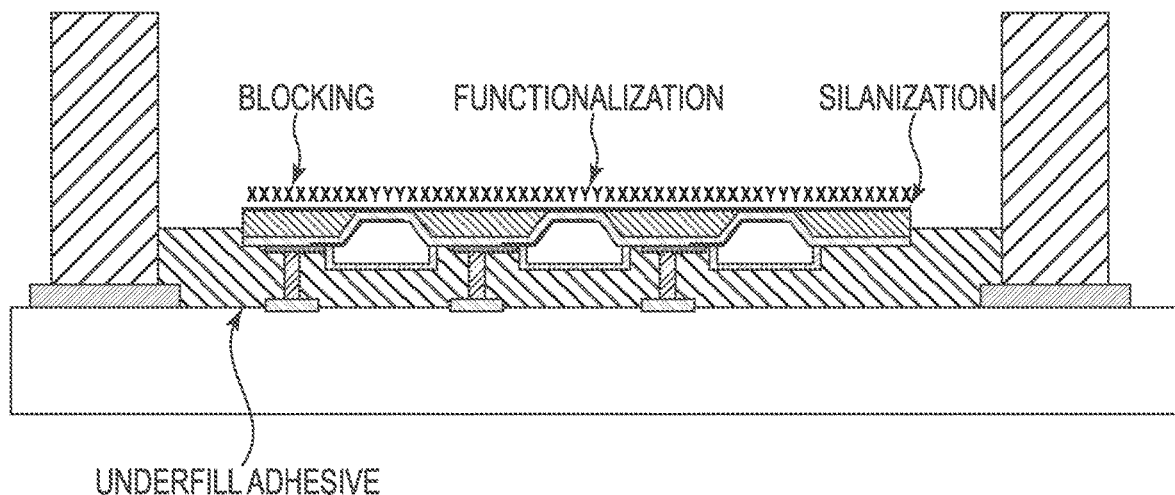
FIG. 51 is a schematic sectional view illustrating silanization, printing of functionalization and spotting relative to FIG. 50 during a method of forming an example bulk acoustic wave structure in accordance with aspects of the present disclosure.

FIG. 51 illustrates the functionalization chemistry on the BioSensor. First a silanization step is completed to coat a monolayer of adhesion promoter on the surface, then functionalization is printed onto the resonators and then the surface is blocked to prevent non-specific binding. The functionalization is a bioreceptor that is designed to bind the analyte of interest. The functionalization may be a protein for example.

Figure 52A:
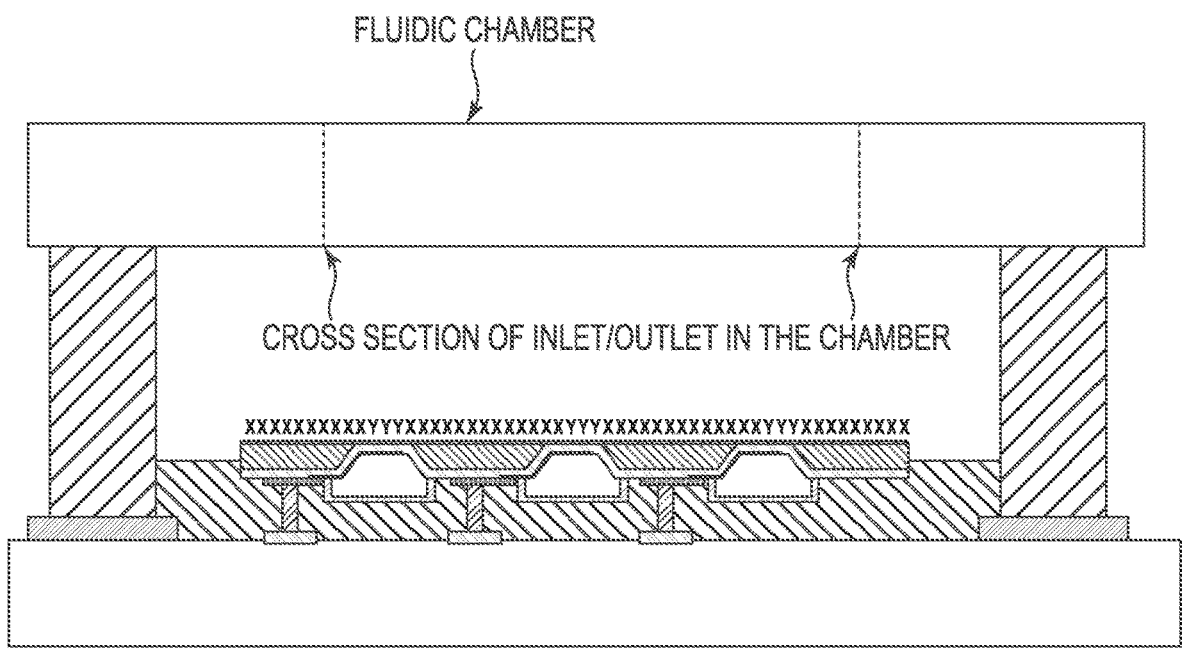
FIGS. 52A and 52B are schematic and plan sectional views illustrating a fluidic chamber cover attached onto the fluidic wall structure relative to FIG. 51 during a method of forming an example bulk acoustic wave structure in accordance with aspects of the present disclosure.
Figure 52B:
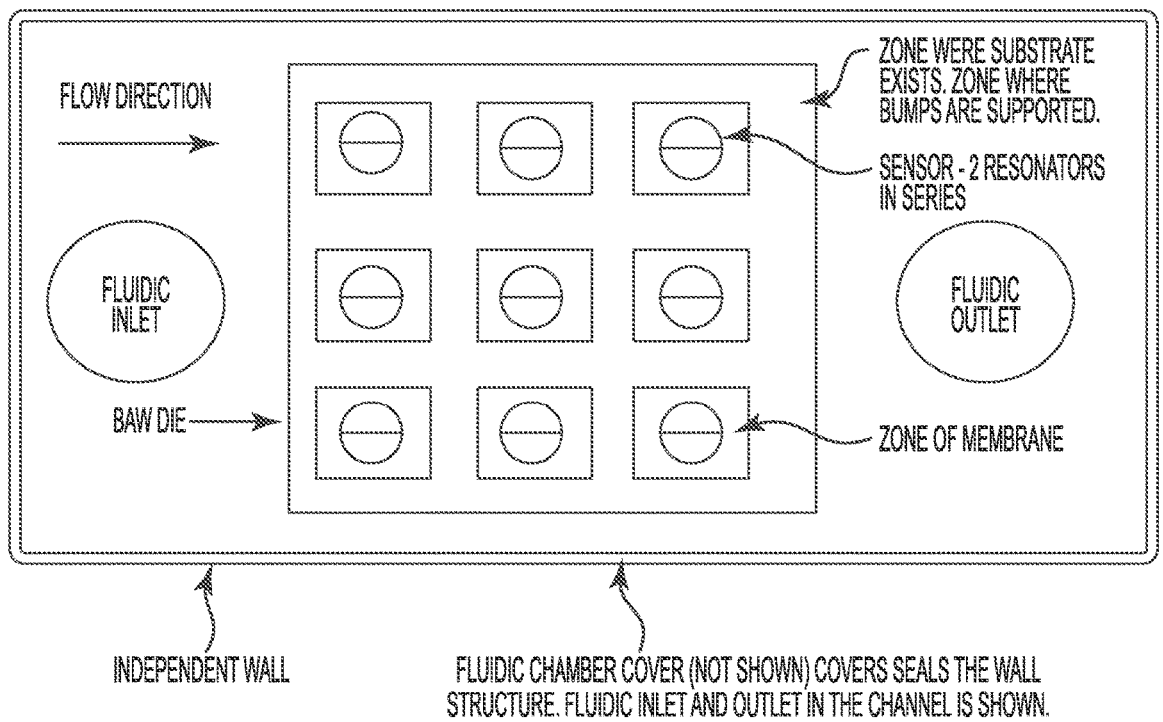

FIG. 52A illustrates the device after the fluidic chamber cover has been attached. An example of a suitable fluidic chamber cover is an adhesive tape or sticker. The cover is either punched or laser machined for size and inlet and outlet ports. The cover is attached in place with pressure. FIG. 52B illustrates a plan view of both the die side that is opposite of the interconnect bumps and the independent wall structure. In this figure, the resonators are observed in the etched portions of the substrate. The cover tape is not shown, but a representation of the inlet and outlet openings in the cover are shown. To complete a sensor test, fluidic is flown into the fluidic inlet across the die with resonators and out of the fluidic outlet. The etched silicon portions of the substrate provide channels for flowing fluidic adjacent to the resonators.

The process depicted by FIGS. 38 to 44 may be completed by using the process steps demonstrated by FIG. 53 to FIG. 62 to form a device that includes a resonator mirror in place of the air cavity formed by FIGS. 38 to 44. The process steps carried out by FIGS. 38 to 44 are completed and then the structure has acoustic mirrors formed thereon, as illustrated by FIGS. 53 to 62. As such, a process of FIGS. 38 to 4 and 53 to 62 illustrate another example method of fabricating a fluidic device including a bulk acoustic wave resonator. In accordance with this example, the fluidic device includes an etched silicon on insulator (SOI) wafer and an acoustic reflector. One of skill in the art would understand that fabrication processes described above can also be employed with this method.

Figure 53:
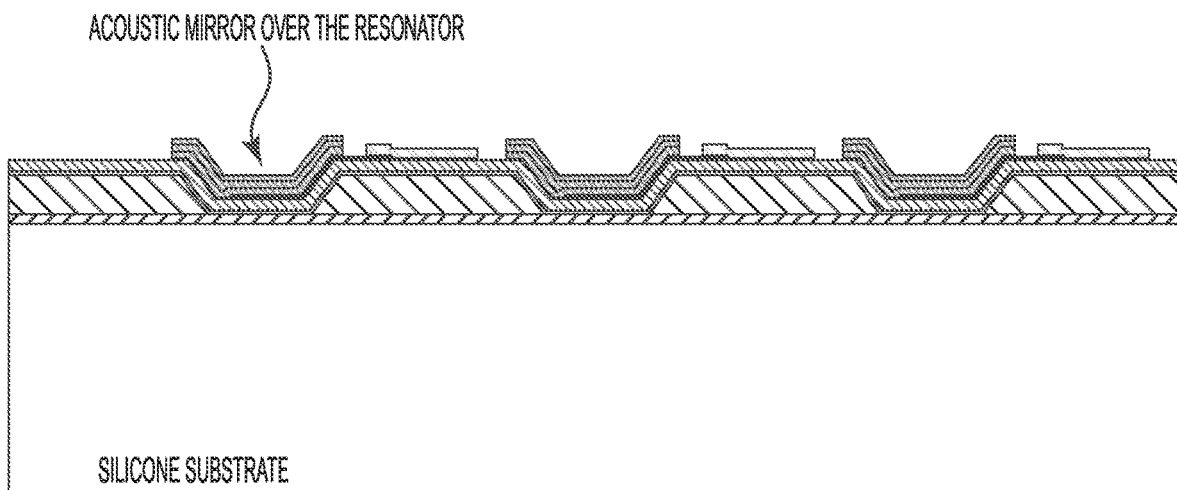
FIG. 53 is a schematic sectional view illustrating fabrication of an acoustic mirror, an example of an acoustic energy management structure, over the resonator relative to FIG. 44 during a method of forming an example bulk acoustic wave structure in accordance with aspects of the present disclosure.

FIG. 53 illustrates the device after fabrication of an acoustic mirror over the resonator. The purpose of the acoustic reflector is to return the acoustic energy back to the resonator to increase the performance of the device. The acoustic reflector can be fabricated with alternating layers of silicon oxide and patterned tungsten or alternating layers of silicon oxide and aluminum nitride.

Figure 54:
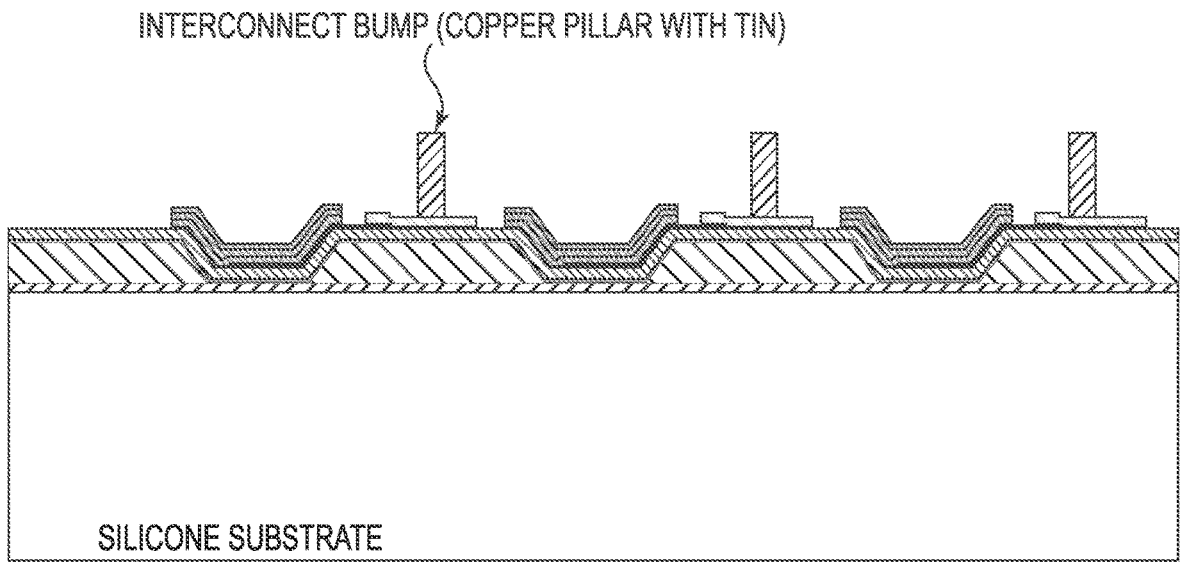
FIG. 54 is a schematic sectional view illustrating fabrication of bumps for electrical connection to the board relative to FIG. 53 during a method of forming an example bulk acoustic wave structure in accordance with aspects of the present disclosure.

FIG. 54 illustrates the fabrication electrical interconnect bumps. A suitable material includes copper pillars with tin. Fabrication of plated copper pins with tin include using photoresist to pattern regions, depositing a plating seed layer such as titanium and copper, plating the interconnect bumps and then removal of the plating seed layer and the photoresist.

Figure 55:
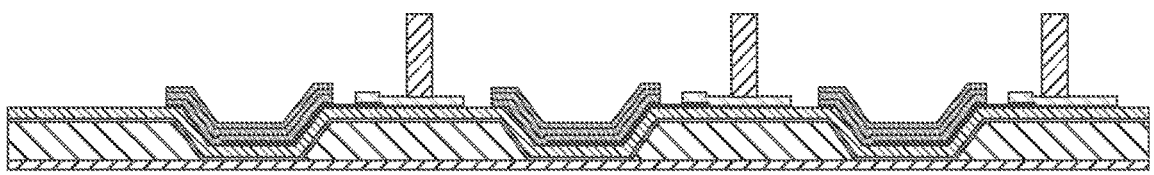
FIG. 55 is a schematic sectional view illustrating back grinding of the substrate to reduce the substrate thickness relative to FIG. 54 during a method of forming an example bulk acoustic wave structure in accordance with aspects of the present disclosure.

FIG. 55 illustrates the device after the substrate has been removed. The thinning or removal process can be completed by etching silicon with a dry etch ($SF_6$) or wet etch (TMAH). Another option is that the wafer can be background to remove the substrate.

Figure 56:
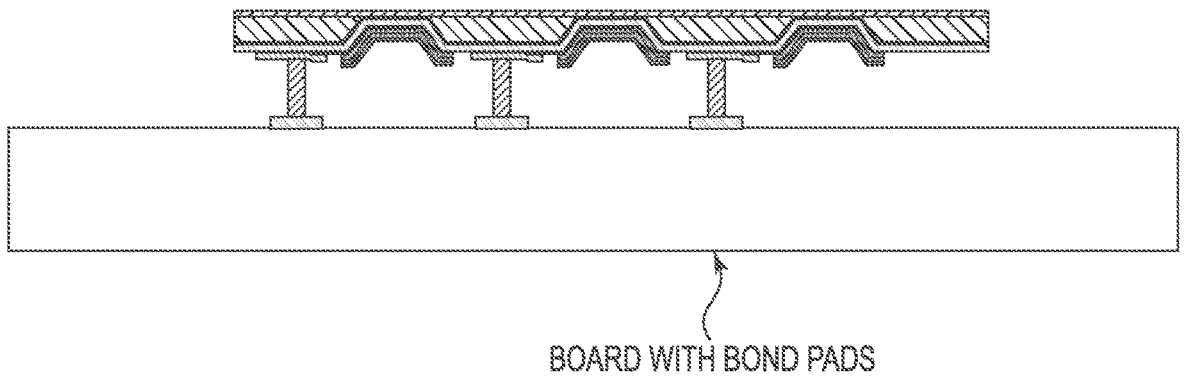
FIG. 56 is a schematic sectional view illustrating BAW biosensor die flip chip mounted to the board relative to FIG. 55 during a method of forming an example bulk acoustic wave structure in accordance with aspects of the present disclosure.

FIG. 56 illustrates the device after flip chip mounting to the board. One interconnect embodiment is copper pillars with tin on the die is soldered onto copper pads with organic solderability preservative (OSP). Another alternative is solder balls on the die soldered onto a gold bond pads.

Figure 57:
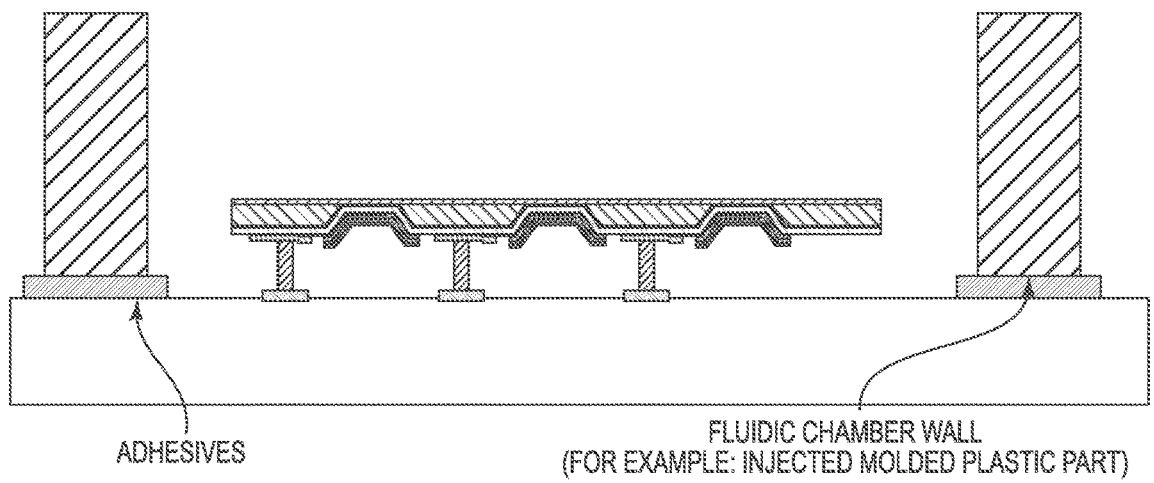
FIG. 57 is a schematic sectional view illustrating attachment of independent fluidic wall structure relative to FIG. 56 during a method of forming an example bulk acoustic wave structure in accordance with aspects of the present disclosure.

FIG. 57 illustrates attachment of fluidic walls to the board. The fluidic wall structure can be formed from injection molding of plastic, machining of metal or glass. In high volume production, an adhesive is dispensed with a robot in the location where the fluidic wall structure is located. In high volume production, the wall structures are received either in tape and reel format or in trays. A robot places the wall structure onto the adhesive. The adhesive is cured in an oven. The fluidic wall structure is designed to realize the desired fluidic channel height from the resonator to the top of the wall.

Figure 58:
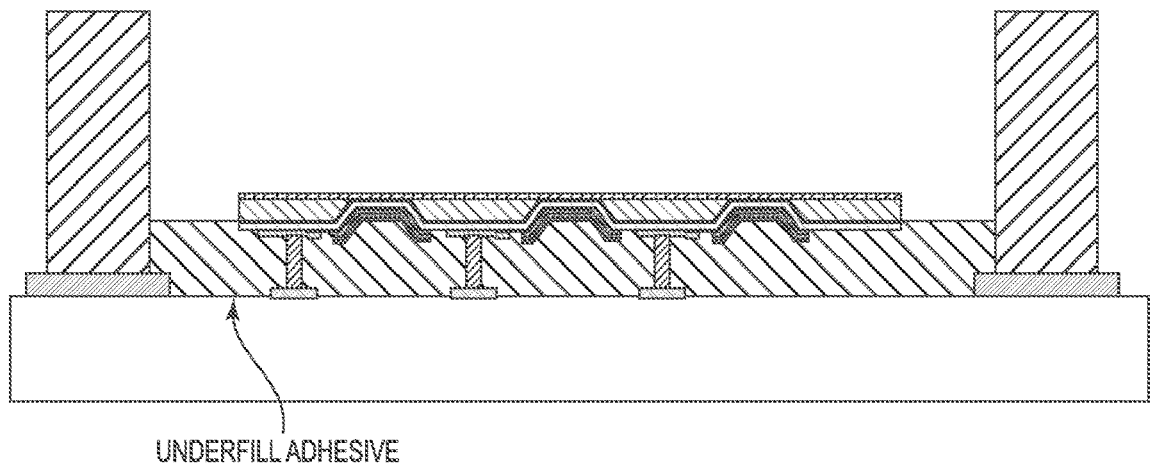
FIG. 58 is a schematic sectional view illustrating underfill wicked under the flip chip mounted die relative to FIG. 57 during a method of forming an example bulk acoustic wave structure in accordance with aspects of the present disclosure.

FIG. 58 illustrates adhesive underfill under the flip chip mounted die. Adhesive from a dispense tip is placed near the side of the die. Capillary force wicks the adhesive under the mounted die. A back step is performed to cure the adhesive. The purpose of the underfill adhesive is to protect the bumped region of the die from chemical attack from the fluidic used when the sensor is used.

Figure 59:
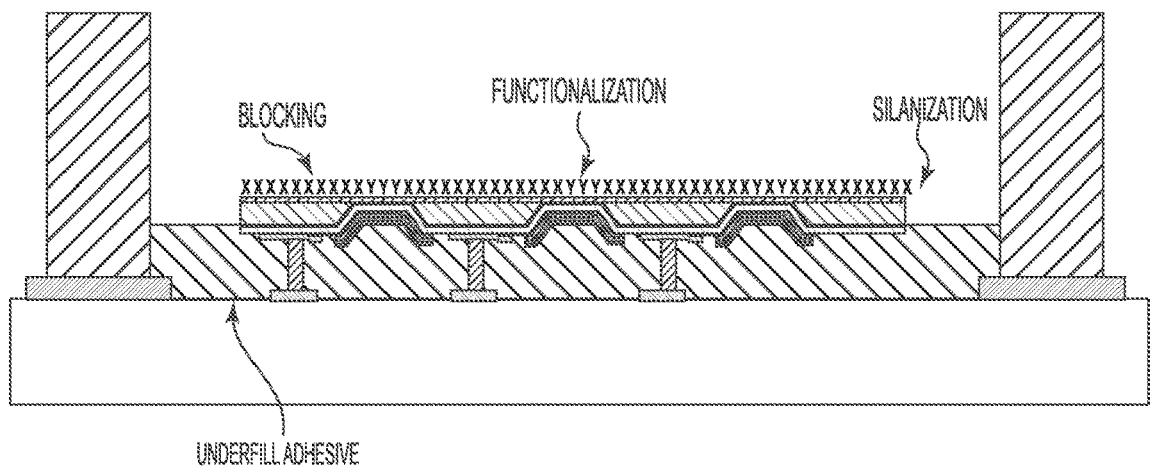
FIG. 59 is a schematic sectional view illustrating silanization, printing of functionalization and spotting relative to FIG. 58 during a method of forming an example bulk acoustic wave structure in accordance with aspects of the present disclosure.

FIG. 59 illustrates the functionalization chemistry on the BioSensor. First a silanization step is completed to coat a monolayer of adhesion promoter on the surface, then functionalization is printed onto the resonators and then the surface is blocked to prevent non-specific binding. The functionalization is a bioreceptor that is designed to bind the analyte of interest. The functionalization may be a protein for example.

Figure 60:
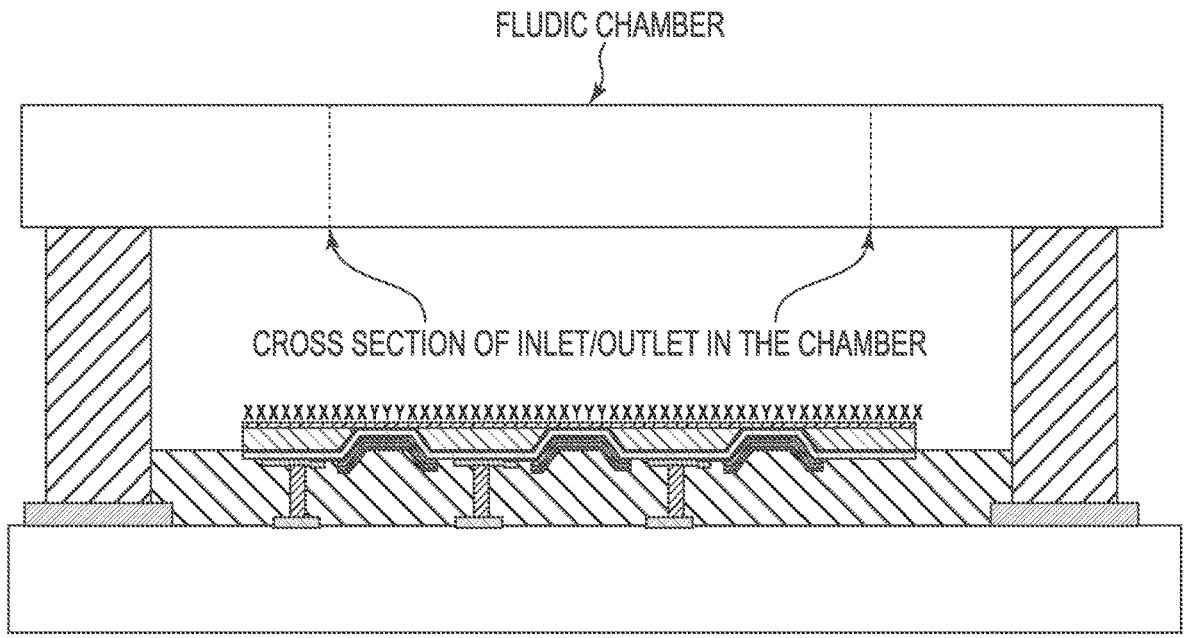
FIG. 60 is a schematic sectional view illustrating a fluidic chamber cover attached onto the fluidic wall structure relative to FIG. 59 during a method of forming an example bulk acoustic wave structure in accordance with aspects of the present disclosure.

FIG. 60 illustrates the device after the fluidic chamber cover has been attached. An example of a suitable fluidic chamber cover is an adhesive tape or sticker. The cover is either punched or laser machined for size and inlet and outlet ports. The cover is attached in place with pressure.

Figure 61:
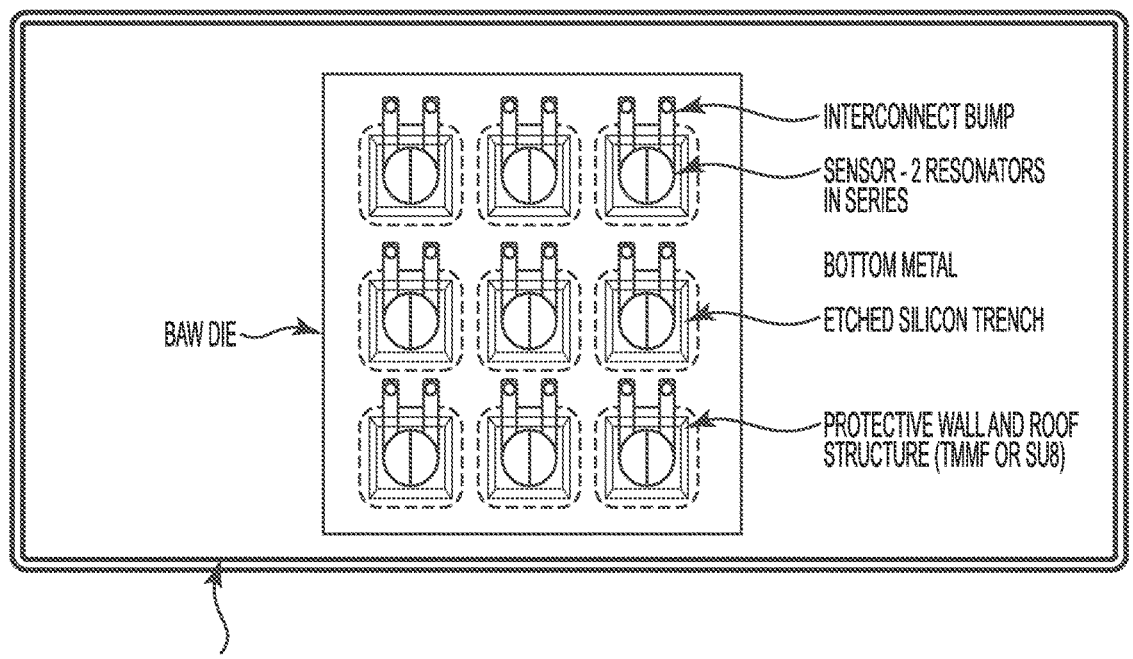
FIG. 61 is a schematic plan view of both the interconnect side of the BAW sensor die and the independent wall once a method of forming an example bulk acoustic wave structure in accordance with aspects of the present disclosure is completed.

FIG. 61 illustrates a plan view of the side of the BAW sensor die that is flip chip mounted to the board and a representation of the independent wall structure. There are no fluidics on the side of the die with the interconnect bumps. The fluidic wall structure is not show to size scale, in practice the width of the wall would be wide to allow for bonding of the fluidic cover.

Figure 62:
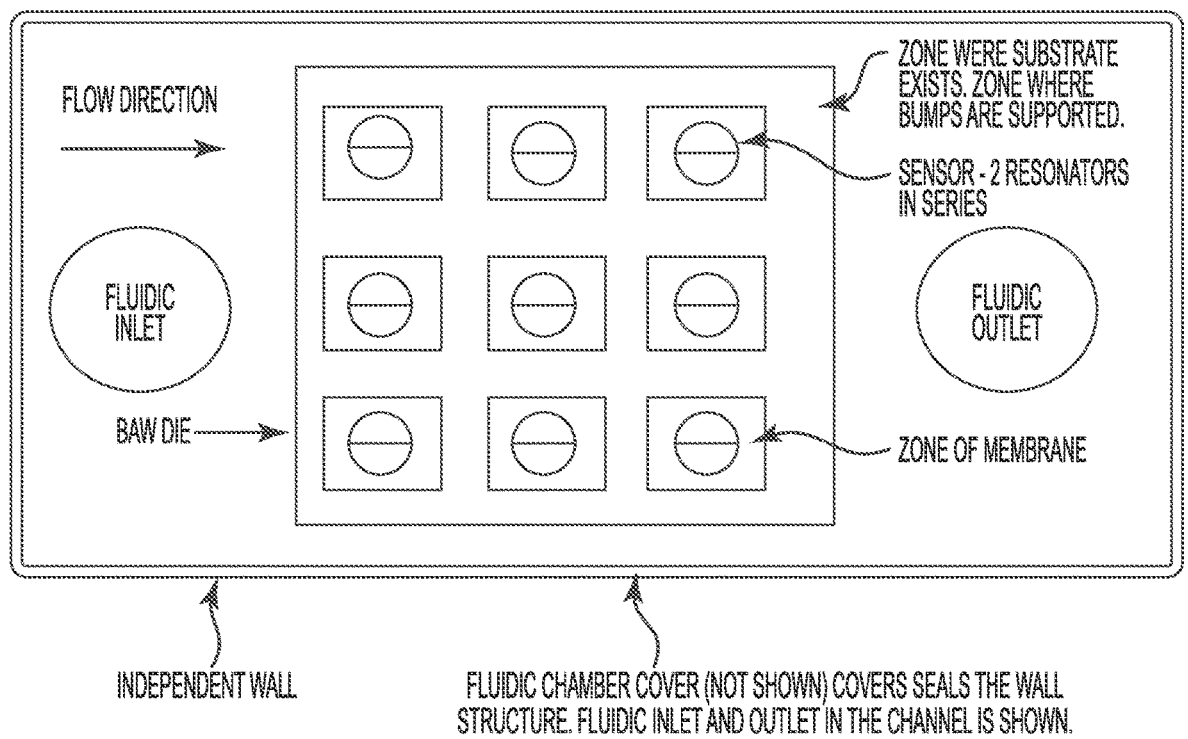
FIG. 62 is a schematic plan view of both the exposed resonator side of the BAW sensor die and the independent wall once a method of forming an example bulk acoustic wave structure in accordance with aspects of the present disclosure is completed.

FIG. 62 illustrates a plan view of both the die side that is opposite of the interconnect bumps and the intendent wall structure. In this figure, the resonators are observed in the etched portions of the substrate. The cover tape is not shown, but a representation of the inlet and outlet openings in the cover are shown. To complete a sensor test, fluidic is flown into the fluidic inlet across the die with resonators and out of the fluidic outlet. The etched silicon portions of the substrate provide channels for flowing fluidic adjacent to the resonators.

It should be understood that various aspects disclosed herein may be combined in different combinations than the combinations specifically presented in the description and accompanying drawings. It should also be understood that, depending on the example, certain acts or events of any of the processes or methods described herein may be performed in a different sequence, may be added, merged, or left out altogether (e.g., all described acts or events may not be necessary to carry out the techniques). The invention is defined in the claims. However, below there is provided a non-exhaustive list of non-limiting examples. Any one or more of the features of these examples may be combined with any one or more features of another example, embodiment, or aspect described herein.

Example Ex 1 is a method of fabricating a bulk acoustic wave resonator structure for a fluidic device comprising: disposing a first conductive material over a portion of a first surface of a substrate to form at least a portion of a first electrode, the substrate having a second surface opposite the first surface; disposing a piezoelectric material over the first electrode; disposing a second conductive material over the piezoelectric material to form at least a portion of a second electrode, wherein the second conductive material extends substantially parallel to the first surface of the substrate, the second conductive material at least partially extending over the first conductive material, wherein an overlapping region of the first conductive material, the piezoelectric material, and the second conductive material forms a bulk acoustic wave resonator, the bulk acoustic wave resonator having a first side and an opposing second side; disposing an acoustic energy management structure over a first side of the bulk acoustic wave resonator; disposing a third conductive material over a portion of the second conductive material that extends beyond the bulk acoustic wave resonator, wherein the third conductive material forms an interconnect extending above the acoustic energy management structure in a direction substantially perpendicular to the first surface of the substrate; and removing a portion of the second surface of the substrate to expose a chemical mechanical connection at the first electrode at a second side of the bulk wave acoustic resonator.

Example Ex2 is a method of Ex 1, wherein disposing the reflector structure over a first side of the bulk acoustic wave resonator comprises forming walls and a top from photoresist material to define a protective cavity over the bulk acoustic wave resonator.

Example Ex3 is a method of Ex 1, wherein forming the reflector structure over a first side of the bulk acoustic wave resonator comprises disposing layers of material to form an acoustic mirror over the bulk acoustic wave resonator.

Example Ex4 is a method of Ex 1 further comprising: disposing and patterning a sacrificial layer on the substrate; and disposing a passivation layer over the sacrificial layer, wherein the passivation layer is disposed prior to disposing the first conductive material, wherein disposing the first conductive material over the first portion of the substrate comprises patterning the disposal of the first conductive material such that the first conductive material aligns over the sacrificial layer, and wherein the passivation layer forms at least a portion of the first electrode in a region overlapping the first conductive material.

Example Ex5 is a method of Ex 4 further comprising: removing the sacrificial layer adjacent the passivation layer.

Example Ex6 is a method of Ex 1, wherein removing a portion of the substrate comprises reducing a thickness of the substrate.

Example Ex7 is a method of fabricating a fluidic device, the method comprising: forming bulk acoustic wave resonator structure, wherein forming the bulk acoustic resonator structure comprises: disposing a first conductive material over a portion of a first surface of a substrate to form at least a portion of a first electrode, disposing a piezoelectric material over the first conductive material; disposing a second conductive material over the piezoelectric material to form at least a portion of a second electrode, wherein the second conductive material extends substantially parallel to the first surface of the substrate, the second conductive material at least partially extending over the first conductive material, wherein an overlapping region of the first conductive material, the piezoelectric material, and the second conductive material forms a bulk acoustic wave resonator, disposing a reflector structure over a first side of the bulk acoustic wave resonator, disposing a third conductive material over a portion of the second conductive material that extends beyond the bulk acoustic wave resonator, wherein the third conductive material forms an interconnect extending above the reflector structure in a direction substantially perpendicular to the first surface of the substrate, and removing a portion of the substrate to expose the first electrode at a second side of the bulk wave acoustic resonator; and mounting the bulk wave acoustic resonator structure to a base, wherein mounting the bulk wave acoustic resonator comprises coupling the interconnect to the base.

Example Ex8 is a method of Ex 7 further comprising: disposing an adhesion layer between the bulk wave acoustic reflector structure and the base.

Example Ex9 is a method of Ex 7 further comprising: disposing a functionalization material over the second electrode.

Example Ex10 is a method of Ex 7 further comprising: attaching chamber walls to the base, wherein the chamber walls enclose a perimeter of the bulk wave acoustic resonator structure.

Example Ex11 is a method of Ex 10 further comprising disposing a cover onto the chamber wall, wherein the cover includes a fluidic inlet and a fluidic outlet.

Example Ex12 is a method of Ex 7 further comprising: defining a fluidic path within the substrate adjacent the second electrode.

Example Ex13 is a method of Ex 7, wherein removing a portion of the substrate includes reducing a thickness of the substrate.

Example Ex14 is a method of Ex 7 further comprising: disposing a functionalization material over the second electrode after mounting the bulk wave acoustic resonator to the base.

Example Ex15 is a fluidic device comprising: a bulk acoustic wave resonator structure comprising: a bulk acoustic wave resonator arranged under a substrate, wherein the bulk acoustic wave resonator comprises a first electrode disposed over a portion of a first surface of a substrate, a piezoelectric material disposed over the first electrode, and a second electrode disposed over the piezoelectric material, wherein an overlapping region of the first electrode, the piezoelectric material, and the second electrode forms a bulk acoustic wave resonator; a reflector structure disposed over a first side of the bulk acoustic wave resonator; an interconnect disposed over a portion of the second electrode extending beyond the bulk acoustic wave resonator, wherein the interconnect extends above a height of the reflector structure in a direction substantially perpendicular to the first surface of the substrate, and wherein the substrate includes an opening extending from a second surface of the substrate to the first electrode; a functionalization material disposed over the first electrode at the opening; a base electrically coupled to the interconnect; a chamber wall extending from the base and encompassing the bulk acoustic wave resonator structure; and a fluidic chamber bounded at least in part by the substrate and the chamber wall.

Example Ex16 is a method of Ex 15, wherein the bulk wave acoustic resonator structure comprises a cavity resonator.

Example Ex17 is a method of Ex 15, wherein the bulk wave acoustic resonator comprises a film bulk acoustic wave resonator.

Example Ex18 is a method of Ex 15, wherein the substrate comprises fluidic channels.

Example Ex19 is a method of Ex 15, wherein the bulk acoustic wave resonator structure comprises a plurality of bulk acoustic wave resonators, each of the plurality of bulk acoustic wave resonators including an associated reflector structure and an interconnect for independently electrically coupling each of the plurality of bulk acoustic wave resonators to the base.

Example Ex20 is a method of Ex 19, wherein the plurality of bulk acoustic wave resonators are arranged in a pattern of rows and columns along the substrate.

Although the present disclosure has been described with reference to preferred embodiments, workers skilled in the art will recognize that changes can be made in form and detail without departing from the spirit and scope of the present disclosure.

What is claimed is:

1. A method of fabricating a bulk acoustic wave resonator structure for a fluidic device comprising:
disposing a first conductive material over a portion of a first surface of a substrate to form at least a portion of a first electrode, the substrate having a second surface opposite the first surface;
disposing a piezoelectric material over the first electrode;
disposing a second conductive material over the piezoelectric material to form at least a portion of a second electrode, wherein the second conductive material extends substantially parallel to the first surface of the substrate, the second conductive material at least partially extending over the first conductive material, wherein an overlapping region of the first conductive material, the piezoelectric material, and the second conductive material forms a bulk acoustic wave resonator, the bulk acoustic wave resonator having a first side and an opposing second side;
disposing an acoustic energy management structure over a first side of the bulk acoustic wave resonator; and
removing a portion of the second surface of the substrate to expose a chemical mechanical connection at the first electrode at a second side of the bulk acoustic wave resonator.

2. The method of claim 1, wherein disposing the acoustic energy management structure over a first side of the bulk acoustic wave resonator comprises forming at least one wall structure and a roof from a photo imageable material to define an air cavity over the bulk acoustic wave resonator.

3. The method of claim 2, wherein the roof has an area from 100 micrometers$^2$ to 500,000 micrometers$^2$.

4. The method of claim 1, wherein disposing the acoustic energy management structure over a first side of the bulk acoustic wave resonator comprises disposing layers of material to form an acoustic mirror over the bulk acoustic wave resonator.

5. The method of claim 1, further comprising:
disposing and patterning a sacrificial layer on the substrate; and
disposing a passivation layer over the sacrificial layer, wherein the passivation layer is disposed prior to disposing the first conductive material,
wherein disposing the first conductive material over the portion of the first surface of the substrate comprises patterning the first conductive material such that the first conductive material aligns over the sacrificial layer, and
wherein the passivation layer forms at least a portion of the first electrode in a region overlapping the first conductive material.

6. The method of claim 5, further comprising:
removing the sacrificial layer adjacent the passivation layer.

7. The method of claim 1, wherein removing a portion of the second surface of the substrate comprises reducing a thickness of the substrate.

8. The method of claim 7, wherein the thickness of the substrate is reduced to 200 micrometers to 400 micrometers thick.

9. The method of claim 1, further comprising mounting the bulk acoustic wave resonator structure to a base, wherein mounting the bulk acoustic wave resonator structure comprises electrically coupling the bulk acoustic wave resonator structure to the base.

10. The method of claim 1 wherein disposing the second conductive material comprises depositing the second conductive material over the piezoelectric material and patterning the second conductive material after deposition.

11. A method of fabricating a bulk acoustic wave resonator structure for a fluidic device comprising:
disposing a first conductive material over a portion of a first surface of a substrate to form at least a portion of a first electrode, the substrate having a second surface opposite the first surface;
disposing a piezoelectric material over the first electrode;
disposing a second conductive material over the piezoelectric material to form at least a portion of a second electrode, wherein the second conductive material extends substantially parallel to the first surface of the substrate, the second conductive material at least partially extending over the first conductive material, wherein an overlapping region of the first conductive material, the piezoelectric material, and the second conductive material forms a bulk acoustic wave resonator, the bulk acoustic wave resonator having a first side and an opposing second side;
disposing an acoustic energy management structure over a first side of the bulk acoustic wave resonator; and
disposing a third conductive material over a portion of the second conductive material that extends beyond the bulk acoustic wave resonator, wherein the third conductive material forms an interconnect extending above the acoustic energy management structure in a direction substantially perpendicular to the first surface of the substrate.

12. The method of claim 11, wherein disposing the acoustic energy management structure over a first side of the bulk acoustic wave resonator comprises forming at least one wall structure and a roof from a photo imageable material to define an air cavity over the bulk acoustic wave resonator.

13. The method of claim 12, wherein the roof has an area from 100 micrometers$^2$ to 500,000 micrometers$^2$.

14. The method of claim 12 wherein disposing the second conductive material comprises depositing the second conductive material over the piezoelectric material and patterning the second conductive material after deposition.

15. The method of claim 11, wherein disposing the acoustic energy management structure over a first side of the bulk acoustic wave resonator comprises disposing layers of material to form an acoustic mirror over the bulk acoustic wave resonator.

16. The method of claim 11, further comprising:
   disposing and patterning a sacrificial layer on the substrate; and
   disposing a passivation layer over the sacrificial layer,
   wherein the passivation layer is disposed prior to disposing the first conductive material,
   wherein disposing the first conductive material over the portion of the first surface of the substrate comprises patterning the first conductive material such that the first conductive material aligns over the sacrificial layer, and
   wherein the passivation layer forms at least a portion of the first electrode in a region overlapping the first conductive material.

17. The method of claim 16, further comprising:
   removing the sacrificial layer adjacent the passivation layer.

18. The method of claim 11, further comprising mounting the bulk acoustic wave resonator structure to a base, wherein mounting the bulk acoustic wave resonator structure comprises at least electrically coupling the interconnect to the base.

19. The method of claim 11 wherein the interconnect comprises a copper pillar.

20. The method of claim 19 wherein the copper pillar is plated with tin.

\* \* \* \* \*